United States Patent
Henley et al.

(10) Patent No.: US 8,012,851 B2
(45) Date of Patent: Sep. 6, 2011

(54) METHOD AND STRUCTURE FOR FABRICATING SOLAR CELLS

(75) Inventors: Francois J. Henley, Aptos, CA (US);
Philip James Ong, Milpitas, CA (US)

(73) Assignee: Silicon Genesis Corporation, San Jose, CA (US)

( * ) Notice: Subject to any disclaimer, the term of this patent is extended or adjusted under 35 U.S.C. 154(b) by 0 days.

(21) Appl. No.: 12/731,069

(22) Filed: Mar. 24, 2010

(65) Prior Publication Data

US 2010/0180945 A1 Jul. 22, 2010

Related U.S. Application Data

(63) Continuation of application No. 11/685,686, filed on Mar. 13, 2007, now Pat. No. 7,863,157.

(60) Provisional application No. 60/783,586, filed on Mar. 17, 2006, provisional application No. 60/822,473, filed on Aug. 15, 2006, provisional application No. 60/823,354, filed on Aug. 23, 2006, provisional application No. 60/823,356, filed on Aug. 23, 2006.

(51) Int. Cl.
*H01L 21/30* (2006.01)
*H01L 21/46* (2006.01)

(52) U.S. Cl. .............. 438/458; 438/459; 257/E21.122

(58) Field of Classification Search .............. 438/459, 438/458; 257/E21.122
See application file for complete search history.

(56) References Cited

U.S. PATENT DOCUMENTS

| | | | | |
|---|---|---|---|---|
| 5,985,742 | A | * | 11/1999 | Henley et al. ............... 438/515 |
| 5,993,677 | A | * | 11/1999 | Biasse et al. .................. 216/36 |
| 6,100,166 | A | * | 8/2000 | Sakaguchi et al. ........... 438/455 |
| 2006/0112986 | A1 | * | 6/2006 | Atwater et al. ............... 136/255 |
| 2006/0185582 | A1 | * | 8/2006 | Atwater et al. ................. 117/89 |
| 2008/0211061 | A1 | * | 9/2008 | Atwater, Jr. et al. .......... 257/615 |

* cited by examiner

*Primary Examiner* — Jarrett J Stark
(74) *Attorney, Agent, or Firm* — Kilpatrick Townsend and Stockton LLP

(57) ABSTRACT

A photovoltaic cell device, e.g., solar cell, solar panel, and method of manufacture. The device has an optically transparent substrate comprises a first surface and a second surface. A first thickness of material (e.g., semiconductor material, single crystal material) having a first surface region and a second surface region is included. In a preferred embodiment, the surface region is overlying the first surface of the optically transparent substrate. The device has an optical coupling material provided between the first surface region of the thickness of material and the first surface of the optically transparent material. A second thickness of semiconductor material is overlying the second surface region to form a resulting thickness of semiconductor material.

7 Claims, 35 Drawing Sheets

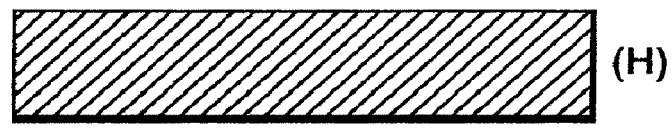
FIGURE 1
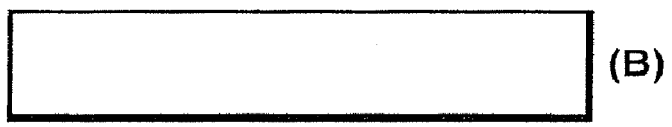
FIGURE 2
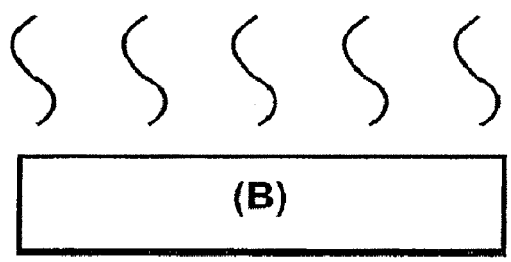
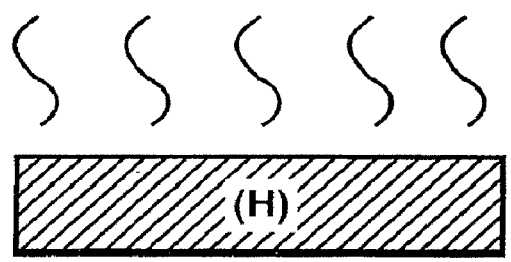
FIGURE 3       FIGURE 4

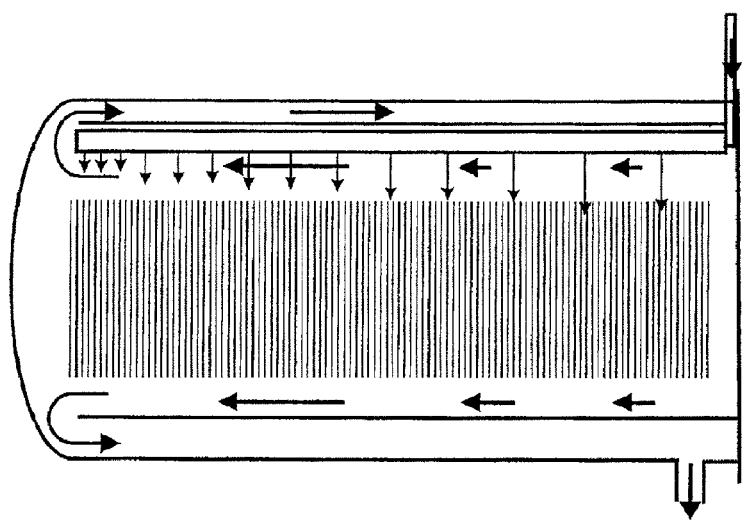
FIGURE 14B: THERMAL CVD FURNACE REACTION SYSTEM
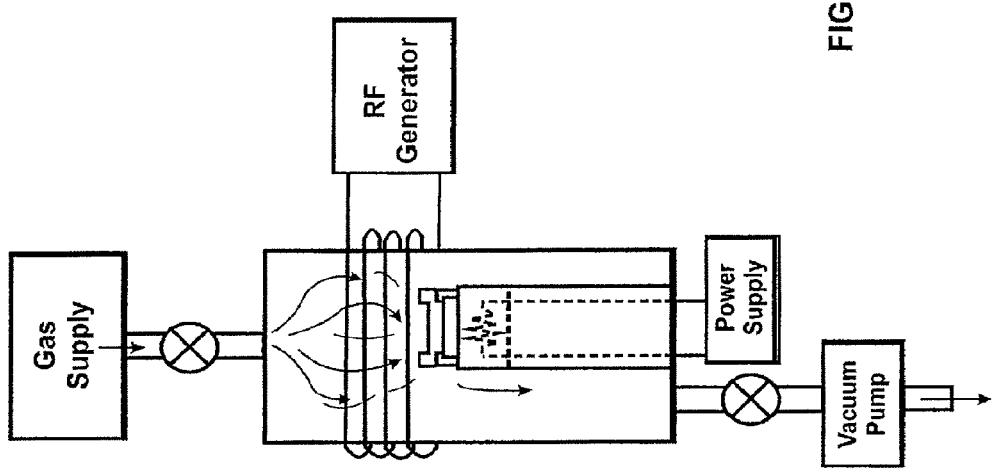
FIGURE 14A: GLOW DISCHARGE CVD SYSTEM

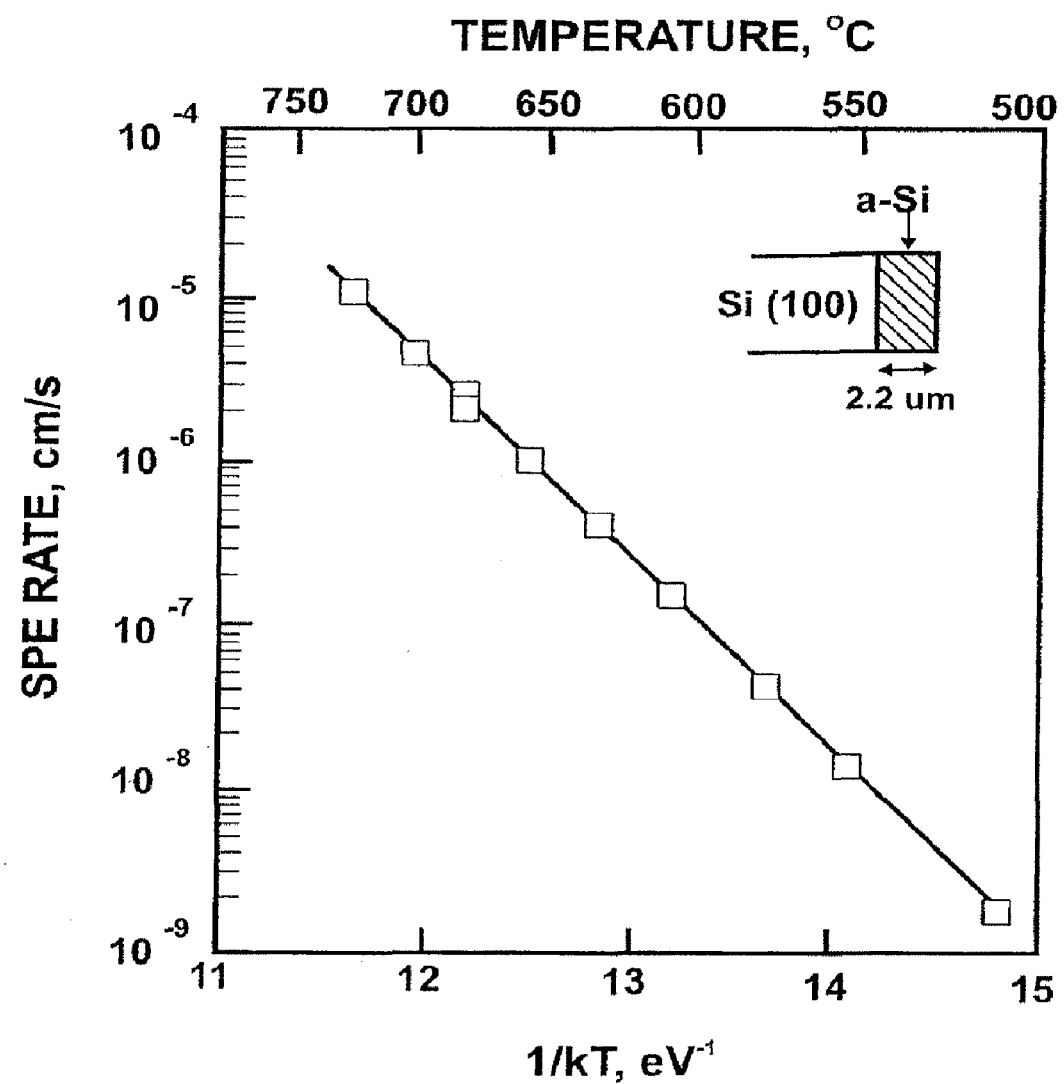
FIGURE 14C: Plot of hydrogen-free solid phase epitaxial recrystallization rate of silicon as a function of temperature

**1. Single-Crystal Silicon
(Transverse contacts)**

**1. Single-Crystal Silicon &
Additional Junctions
(Transverse contacts)**

2. Single-Crystal Silicon
(Longitudinal Backside contacts)

2. Single-Crystal Silicon
(Longitudinal Backside contacts)

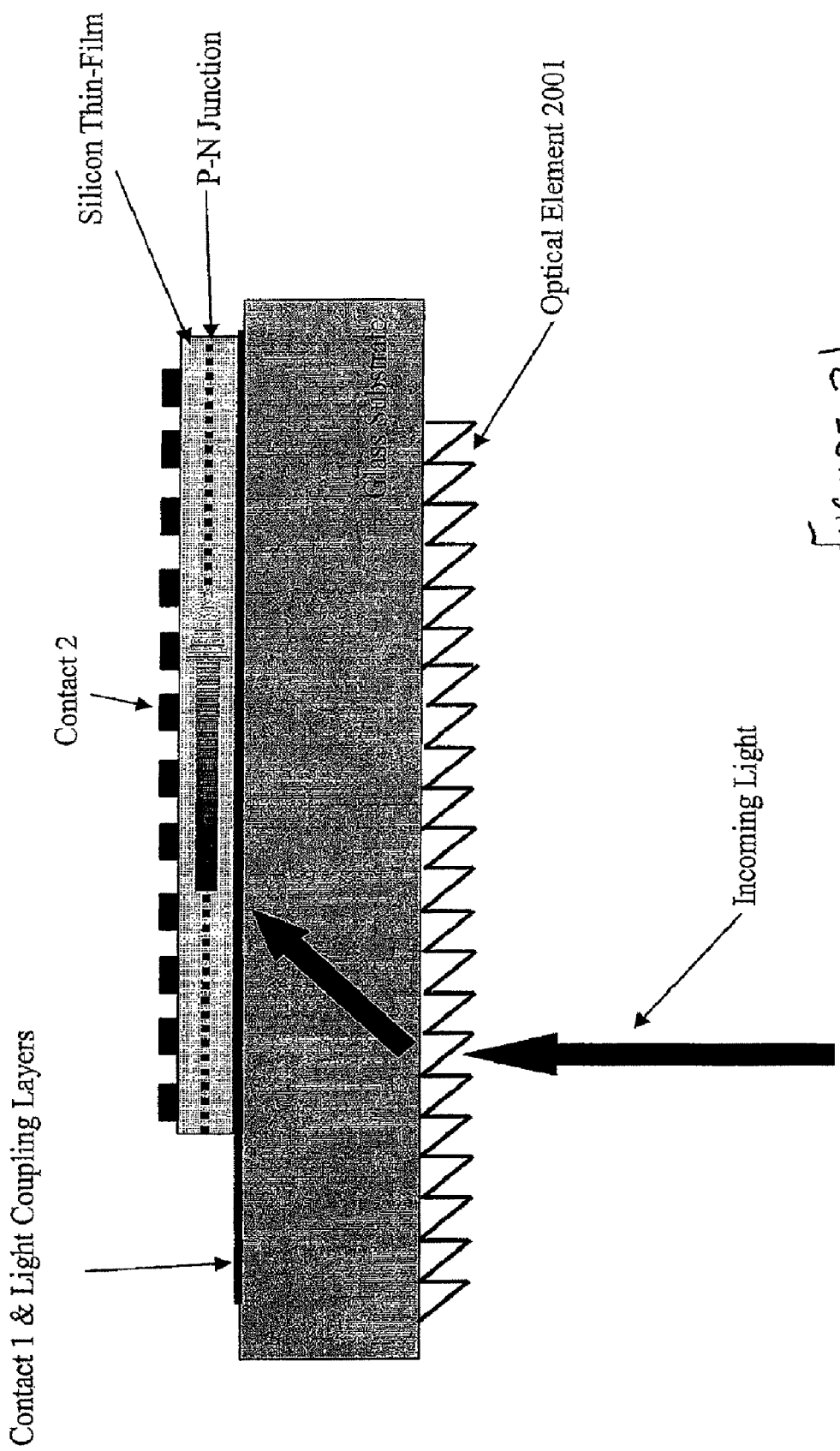
FIGURE 2)

METHOD AND STRUCTURE FOR FABRICATING SOLAR CELLS

CROSS-REFERENCES TO RELATED APPLICATIONS

The instant nonprovisional patent application is a continuation of U.S. patent application Ser. No. 11/685,686, filed Mar. 13, 2007, which is incorporated by reference in its entirety herein and which claims priority to the following U.S. Provisional Patent Applications, all of which are incorporated by reference in their entirety herein for all purposes: Appl. No. 60/783,586 filed Mar. 17, 2006; Appl. No. 60/822,473 filed Aug. 15, 2006; Appl. No. 60/823,354 filed Aug. 23, 2006; and Appl. No. 60/823,356 filed Aug. 23, 2006.

BACKGROUND OF THE INVENTION

From the beginning of time, human beings have relied upon the "sun" to derive almost all useful forms of energy. Such energy comes from petroleum, radiant, wood, and various forms of thermal energy. As merely an example, human beings have relied heavily upon petroleum sources such as coal and gas for much of their needs. Unfortunately, such petroleum sources have become depleted and have lead to other problems. As a replacement, in part, solar energy has been proposed to reduce our reliance on petroleum sources. As merely an example, solar energy can be derived from "solar cells" commonly made of silicon.

The silicon solar cell generates electrical power when exposed to solar radiation from the sun. The radiation interacts with atoms of the silicon and forms electrons and holes that migrate to p-doped and n-doped regions in the silicon body and create voltage differentials and an electric current between the doped regions. Depending upon the application, solar cells have been integrated with concentrating elements to improve efficiency. As an example, solar radiation accumulates and focuses using concentrating elements that direct such radiation to one or more portions of active photovoltaic materials. Although effective, these solar cells still have many limitations.

As merely an example, solar cells rely upon starting materials such as silicon. Such silicon is often made using either polysilicon and/or single crystal silicon materials. These materials are often difficult to manufacture. Polysilicon cells are often formed by manufacturing polysilicon plates. Although these plates may be formed effectively, they do not possess optimum properties for highly effective solar cells. Single crystal silicon has suitable properties for high grade solar cells. Such single crystal silicon is, however, expensive and is also difficult to use for solar applications in an efficient and cost effective manner. Generally, thin-film solar cells are less expensive by using less silicon material but their amorphous or polycrystalline structure are less efficient than the more expensive bulk silicon cells made from single-crystal silicon substrates. These and other limitations can be found throughout the present specification and more particularly below.

From the above, it is seen that a technique for manufacturing large substrates which is cost effective and efficient is desirable.

BRIEF SUMMARY OF THE INVENTION

According to embodiments of the present invention, techniques directed to the manufacture of photovoltaic materials are provided. More particularly, one embodiment of the invention provides a technique including a method and a structure for forming a solar cell structure using layer transfer techniques for photovoltaic applications. Certain embodiments in accordance with the present invention provide a thickening process using a silane type species having a desired deposition rate and thermal budget for the manufacture of photovoltaic devices. But it will be recognized that the invention has a wider range of applicability; and can also be applied to other types of applications such as for three-dimensional packaging of integrated semiconductor devices, photonic devices, piezoelectronic devices, flat panel displays, microelectromechanical systems ("MEMS"), nano-technology structures, sensors, actuators, integrated circuits, biological and biomedical devices, and the like.

In a specific embodiment, the present invention provides a method for fabricating a photovoltaic cell, e.g., solar cell, solar panel. The method includes providing a semiconductor substrate, which has a surface region, a cleave region and a first thickness of material to be removed between the surface region and the cleave region. The method includes coupling the surface region of the semiconductor substrate to a first surface region of an optically transparent substrate, e.g., glass, quartz, plastic. In a preferred embodiment, the optically transparent substrate comprises the first surface region and a second surface region. The method also includes cleaving the semiconductor substrate to remove the first thickness of material from the semiconductor substrate, while the surface region remains coupled to the first surface region, to cause formation of a cleaved surface region. The method includes forming a second thickness of semiconductor material overlying the cleaved surface region to form a resulting thickness of semiconductor material.

In an alternative specific embodiment, the present invention provides a photovoltaic cell device, e.g., solar cell, solar panel. The device has an optically transparent substrate comprises a first surface and a second surface. A first thickness of material (e.g., semiconductor material, single crystal material) having a first surface region and a second surface region is included. In a preferred embodiment, the surface region is overlying the first surface of the optically transparent substrate. The device has an optical coupling material (e.g., Tin Oxide, Indium Tin Oxide (ITO), Titanium Dioxide, Zinc Oxide (ZnO) or other dielectric stack formation material, spin on glass (SOG), or other suitable materials) provided between the first surface region of the thickness of material and the first surface of the optically transparent material. Depending upon the embodiment, the optical coupling material has suitable optical characteristic, which are generally transparent to light (similar to glass), and also have suitable physical characteristics, e.g., adhesion, thermal compatibility, reliability. A second thickness of semiconductor material is overlying the second surface region to form a resulting thickness of semiconductor material.

In yet an alternative specific embodiment, the present invention provides a multi-pass method and structure. That is, the present structure has a reflective surface that redirects light back into active regions of one or more photovoltaic regions. In a specific embodiment, light traverses through a glass substrate and a photovoltaic region, which converts light into electrical power. Any light traversing through the photovoltaic region is then reflected back via a reflecting surface to one or more portions of the photovoltaic region. Of course, there can be other variations, modifications, and alternatives.

In yet other alternatives according to embodiments of the present invention, the present method and structure provides one or more light trapping structures such as a plastic fresnel sheet on the backside of the glass or some other material that would scatter/redirect the light to more oblique angles and thus increase collection efficiency in a thin cell. Of course, there can be other variations, modifications, and alternatives.

In a specific embodiment, the main effect of such light trapping structures is to modify the specular light impinging on the surface of the thin cell glass into a more Lambertian light source where light is redirected at numerous angles to allow the thin-film cell to intersect more of the light and thus increase it's effective light conversion efficiency. Of course, there can be other variations, modifications, and alternatives.

In yet another alternative embodiment, the light trapping layer can redirect the light mostly at oblique angles such that the light can the captured within the silicon thin layer which can be designed to function as a waveguide. The light capture angle, thickness of the silicon thin-film and the intervening coupling material thickness and composition can be designed to improved and even optimize this capture and use the longitudinal (X-Y) axes of the cell as the effective thickness of the cell. Since the photovoltaic junction in many embodiments is within the silicon thickness and longitudinal as well, this can offer a further method to effectively optimize the light conversion efficiency in thin-film solar cells. Of course, there can be other variations, modifications, and alternatives.

In a specific embodiment, the present invention provides a solar cell device being configured as an optical waveguide to improve efficiency of one or more photovoltaic regions. The device has an optically transparent substrate comprises a first surface and a second surface. A first refractive index is characterizing the optically transparent material. An aperture region is provided on a portion of the second surface of the optically transparent substrate. The device has a first thickness of semiconductor material having a first surface region and a second surface region, the first surface region overlying the first surface of the optically transparent substrate. An optical coupling material is provided between the first surface region of the thickness of material and the first surface of the optically transparent material. A second refractive index is characterizing the first thickness of semiconductor material. In a specific embodiment, the second refractive index is about two to three times greater than the first refractive index. The device has one or more photovoltaic regions formed on one or more portions of the first thickness of semiconductor material and an optical waveguide structure formed on one or more portions of the first thickness of semiconductor material.

In a specific embodiment, the present invention provides a method of fabricating substrates for photovoltaic materials, e.g., solar cells. The method includes providing a donor substrate, e.g., single crystal silicon substrate, single crystal germanium substrate, silicon germanium substrate, and others. In a preferred embodiment, the donor substrate includes a cleave region, a surface region, and a first thickness of silicon material defined between the cleave region and the surface region. The method includes transferring the first thickness of silicon material to a handle substrate surface region of a handle substrate to detach a portion of the donor substrate within a vicinity of the cleave region. The method couples (e.g., joins or bonds) the surface region to the handle substrate surface region of the handle substrate to cause formation of a cleaved surface region overlying the first thickness of silicon material. The method includes supplying a gas including a silane species (such as a tri-silane species) into a reaction chamber, such as an electron cyclotron resonance ("ECR") plasma deposition system or other suitable plasma based systems. In a preferred embodiment, the method uses the silane species within the reaction chamber. As an example, the method reacts a gas including a silane species to cause deposition using one or more of gas reaction techniques including glow discharge, thermal photo-enhanced, and plasma enhanced chemical vapor deposition, commonly called PECVD, low energy plasma enhanced chemical vapor deposition, commonly called LE-PECVD, and others. As used in the present specification, the term "PECVD" should be construed by ordinary meaning and will include, without limitation, inductively coupled plasma deposition, capacitively coupled plasma deposition, and others. The method includes forming a second thickness of material, using the silane species, overlying the first thickness of silicon material. Depending upon the embodiment, the method includes treating the second thickness of material with a thermal treatment process to crystallize the second thickness of silicon material. Depending upon the embodiment, silane species other than tri-silane species could also be used, such as silane, di-silane, and chlorinated silanes such as dichlorosilane and trichlorosilane, and the like. In a specific embodiment, selection of the particular silane species depends on a desired or allowable temperature, pressure, and dilution of the silane species during deposition, achievable deposition rate at these conditions, and the resultant deposited film quality. In a lower temperature regime compatible with photovoltaic process-compatible glass, poly-silanes such as di-silane and tri-silane can allow cost-effective deposition rates according to a specific embodiment.

In a specific embodiment, the method uses monosilane SiH4 gas mixed with H2 (hydrogen) gas at a suitable dilution rate. In yet another specific embodiment, the method uses monosilane SiH4 gas mixed with H2 and Helium gas at a suitable dilution rate. Of course, there can be other variations, modifications, and alternatives.

In an alternative specific embodiment, the present invention provides an alternative method of fabricating substrates for photovoltaic materials. The method includes providing a donor substrate, which has a cleave region, a surface region, and a first thickness of silicon material (e.g., single crystal silicon, single crystal germanium, silicon germanium) defined between the cleave region and the surface region. The method includes transferring the first thickness of silicon material to a handle substrate surface region of a handle substrate, e.g., glass, quartz, glass ceramic, optical transparent material. The method detaches a portion of the donor substrate within a vicinity of the cleave region and to couple the surface region to the handle substrate surface region of the handle substrate to cause formation of a cleaved surface region overlying the first thickness of silicon material. The method supplies a gas including a silane species into a reaction chamber to form a discharge using the silane species in the reaction chamber. As an example, the method reacts a gas including a silane species to cause deposition using one or more of gas reaction techniques including glow discharge, plasma, photo-enhanced, or thermal chemical vapor deposition (e.g., CVD, LPCVD, APCVD), and others. In a preferred embodiment, the method includes depositing material, using the glow discharge, plasma, photo-enhanced or thermal CVD or the like, including the silane species, overlying the cleaved surface to thicken the first thickness of silicon material at a deposition rate equal to or greater than or less than a solid phase epitaxial re-growth rate of the material to crystallize the material overlying the first thickness of silicon material.

In an alternative specific embodiment, the present invention provides a method of fabricating substrates for photovoltaic materials. The method includes providing a donor substrate, the donor substrate including a cleave region, a surface region, and a first thickness of silicon or germanium material defined between the cleave region and the surface region. The method also includes transferring the first thickness of silicon or germanium material to a handle substrate surface region of a handle substrate to detach a portion of the donor substrate within a vicinity of the cleave region and to couple the surface region to the handle substrate surface region of the handle substrate to cause formation of a cleaved surface region overlying the first thickness of silicon or germanium material. In a preferred embodiment, the method includes supplying a gas including a silane and/or germane species into a reaction chamber. The method preferably deposits a first material, using a process selected from at least glow discharge, plasma, photo-enhanced or thermal CVD and the silane and/or germane species, overlying the cleaved surface to thicken the first thickness of silicon or germanium material at a deposition rate equal to or greater than or even less than a solid phase epitaxial re-growth rate of the material to crystallize the material overlying the first thickness of silicon or germanium material. In a particular CVD systems such as batch furnace systems where both surfaces of the handle substrate is exposed to the reactant gas, the method also deposits a second material, at least during a portion of time as the depositing of the first material, overlying a backside region of the handle substrate to form a polycrystalline or amorphous material overlying the backside region of the handle substrate. Depending upon the embodiment, the second material can be single crystal or preferably amorphous or polycrystalline.

In yet an alternative embodiment, the present invention provides a photovoltaic device. The device has a handle substrate comprising a handle substrate surface region. In a specific embodiment, the device has an interface material overlying the handle substrate surface region. A layer transferred film overlying the interface material. In a specific embodiment, the device has a deposited thickness of single crystal silicon, single crystal germanium material or single crystal silicon-germanium alloy material having one or more defects therein.

Still further, the present invention provides a photovoltaic device. The device includes a handle substrate comprising a handle substrate surface region. The device has a first thickness of silicon or germanium material layer transferred to the handle substrate surface region of the handle substrate. The device also has a cleaved surface region provided from the first thickness of silicon or germanium material. A deposited first single crystal silicon or germanium material, provided using a process selected from at least glow discharge, plasma, photo-enhanced or thermal CVD and a silane and/or germane species, is overlying the cleaved surface to thicken the first thickness of silicon or germanium material. The device also has a deposited second material overlying a backside region of the handle substrate to form a poly or amorphous material overlying the backside region of the handle substrate.

As noted, in certain embodiments, the method includes depositing material, using the glow discharge, plasma, photo-enhanced or thermal CVD or the like, including the silane species, overlying the cleaved surface to thicken the first thickness of silicon material at a deposition rate equal to or greater than or less than a solid phase epitaxial re-growth rate of the material to crystallize the material overlying the first thickness of silicon material. In preferred embodiments, the deposition rate of the material is equal to or less than a solid phase epitaxial re-growth rate of the material to crystallize the material in an in-situ manner while deposition occurs. In other embodiments, the deposition rate is slightly greater than the solid phase epitaxial re-growth rate to allow the crystalline material to form in an efficient and high quality manner. In other embodiments, when the deposition rate is larger or much larger than the epitaxial re-growth rate, deposition is temporarily stopped or slowed down to allow the crystalline material to re-grow. Depending upon the final thickness, the method can deposit material to a first thickness, allow the material of the first thickness to re-grow into a crystal, deposit additional material to a second thickness, allow the second thickness to re-grow into a crystal, deposit additional material to an Nth thickness, where N is an integer greater than 2, and allow the material at the Nth thickness to re-grow into the crystal. As described, the steps of depositing and epitaxial re-growth is repeated to achieve a desired final thickness and film quality according to a specific embodiment. Of course, there can be other variations modifications, and alternatives.

In a specific embodiment, the present invention provides a method for fabricating a solar cell for use in one or more solar modules. The method includes providing a support member (which preferably has a coefficient of thermal expansion (CTE) matched to a transferred donor material described in more detail below) having a surface region, a bottom portion, and a determined thickness. The method includes forming a releasable material (e.g., roughed region, silicon dioxide roughened region) overlying a surface region of the support member. In a preferred embodiment, the support member can be made of a suitable material such as a silicon substrate that serves as a reusable medium to allow high-temperature processing such as silicon epitaxial growth and the like. Being of the same material, the CTE between the support member, the transferred silicon film, and the epitaxial growth layer is assured to be compatible for processing. In the succeeding descriptions, a silicon support member is used as the example matching the silicon layer transfer and the silicon epitaxial growth, but it is to be understood that the support member can also be fabricated from a different material or combination of materials and layers that are able to withstand the processing temperature range, the chemical treatments, have low contamination, have a suitable CTE match to the transferred and deposited films and finally, can allow reuse to economy unless it is of such a low cost that single use is able to support a target cost of the resulting device. The method also includes transferring a first thickness of silicon material from a donor substrate overlying the releasable material. The method includes forming a second thickness of semiconductor material overlying the first thickness of silicon material to form a total thickness of material. The method then removes the total thickness of material from the releasable material and forms one or more photovoltaic devices onto one or more portions of the total thickness of material.

In an alternative specific embodiment, the present invention provides a method for fabricating a solar cell for use in one or more solar modules. The method includes providing a silicon support member. The silicon support member may have a surface region, a bottom portion, and a determined thickness between the surface region and the bottom portion. The method also includes forming a releasable material overlying the surface region of the silicon support member. The method transfers a first thickness of silicon material from a first donor substrate overlying the releasable material to form the first thickness of silicon material overlying the releasable material, while the releasable material facilitates transferring of the first thickness of silicon material. In a preferred embodiment, the releasable material overlies the silicon support member and is characterized by a surface roughness that facilitates joining of the first thickness of silicon material to the releasable material. The method also includes forming a second thickness of semiconductor material overlying the first thickness of silicon material to form a total thickness of material overlying the releasable material. The method then forms one or more photovoltaic cells in one or more portions of the total thickness of material and removes the releasable material from the thickness of material.

In an alternative specific embodiment, the present invention provides a method for fabricating a solar cell for use with one or more solar modules. The method includes providing a support member. The support member may have a surface region, a bottom portion, and a determined thickness between the surface region and the bottom portion. The support member can be a carrier element in a specific embodiment. The method transfers a first thickness of silicon material from a first donor substrate overlying the support member to form the first thickness of silicon material overlying the support member. The method then forms a second thickness of semiconductor material overlying the first thickness of silicon material to form a total thickness of material overlying the support member. The method then forms one or more photovoltaic devices onto one or more portions of the total thickness of material.

In yet an alternative embodiment, the present invention provides a system for fabricating a solar cell or other like substrates, including integrated circuits. The system has a support member having a surface region, a bottom portion, and a determined thickness between the surface region and the bottom portion. One or more openings (e.g., single, array, circular configuration) are provided in a spatial configuration on the surface region of the support member. A fluidic source is coupled to the one or more openings. In a specific embodiment, the fluidic source is adapted to provide a fluid through the one or more openings on the surface region of the support member. A releasable material is overlying a surface region of the support member. The system has a first thickness of semiconductor material overlying the releasable material to form the first thickness of transferred material overlying the releasable material, which is overlying the support member. Depending upon the embodiment, there can be other variations, modifications, and alternatives.

Numerous benefits are achieved over pre-existing techniques using the present invention. In particular, the present invention uses controlled energy and selected conditions to preferentially cleave a thin photovoltaic film onto a glass substrate according to a specific embodiment. In a specific embodiment, the present method and device provides a very high quality photovoltaic material on glass, which can be used as a portion of the packaging material. In a preferred embodiment, the present method and structure provide for single crystal silicon for providing efficient power using photovoltaic cells.

Additionally, the present method provides for a high growth rate thickening process, which has desirable thermal features according to a specific embodiment. That is, the method can provide for deposition of material, which can be crystal or crystallized, without damaging a glass handle substrate material according to a specific embodiment. In other embodiments, the method allows for formation of photovoltaic materials on a front-side and back-side of a substrate member. Depending upon the embodiment, one or more of these benefits may be achieved. These and other benefits may be described throughout the present specification and more particularly below.

In addition, embodiments in accordance with the present invention use controlled energy and selected conditions to preferentially cleave and treat a thin photovoltaic film of material without a possibility of damage to such film from excessive energy release and/or thermal energy. This cleaving process selectively removes the thin photovoltaic film of material from the substrate while preventing a possibility of damage to the film or a remaining portion of the substrate.

Additionally, the present method and structures allow for more efficient processing using a cleave layer provided in a substrate through the course of semiconductor processing, which may occur at higher temperatures, according to a specific embodiment. In a specific embodiment, the cleaved film, which is attached to a handle substrate, is subjected to a rapid thermal treatment process to firmly engage the cleaved film to the handle substrate without formation of imperfections within a vicinity of an interface region provided between the cleaved film and the handle substrate. In a preferred embodiment, the present method and structure provide for single crystal silicon for providing efficient power using photovoltaic cells. In a preferred embodiment, the present method and structure uses a releasable material that facilitates attachment between two materials and removal of the two materials from each other. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIGS. 1 through 14 illustrate a method for fabricating a photovoltaic device according to an embodiment of the present invention;

FIG. 14A is a simplified diagram of a glow discharge reaction chamber according to an embodiment of the present invention;

FIG. 14B is a simplified diagram of a thermal CVD reaction furnace system according to an embodiment of the present invention;

FIG. 14C is a simplified plot of a hydrogen-free solid phase epitaxial recrystallization rate of silicon as a function of temperature;

FIG. 21 shows a simplified diagram of a solar cell having a light redirection region coupled to a waveguide light trapping mode within the thin-film cell thickness according to an embodiment of the present invention.

FIG. 51 is simplified process flow of an alternative method for fabricating solar cells for a solar module using a layer transfer process according to yet an alternative embodiment of the present invention.

DETAILED DESCRIPTION OF THE INVENTION

Figure 5:
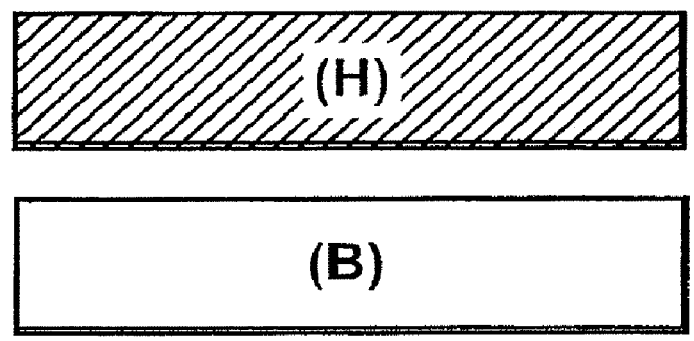

According to embodiments of the present invention, techniques directed to the manufacture of photovoltaic materials are provided. More particularly, one embodiment in accordance with the present invention provides a technique including a method and a structure for forming a solar cell structure using layer transfer techniques for photovoltaic applications. Other embodiments in accordance with the present invention provide a thickening process using a silane type species having a desired deposition rate and thermal budget for the manufacture of photovoltaic devices. While certain embodiments in accordance with the present invention may utilize di-silane or tri-silane type species, depending upon the particular embodiment other silane species can also be used. Depending upon the embodiment, deposition can occur using a variety of techniques including Atmospheric Pressure CVD (APCVD), Atomic Layer CVD (ALCVD) (e.g., Atomic Layer Epitaxy and Atomic layer deposition (ALD)), Aerosol Assisted CVD (AACVD), Direct Liquid Injection CVD (DLICVD), Hot Wire CVD (HWCVD) (e.g., Catalytic CVD (Cat-CVD) or Hot Filament CVD (HFCVD), Low-pressure CVD (LPCVD), Microwave Plasma-Assisted CVD (MPCVD), Plasma-Enhanced CVD (PECVD), Rapid Thermal CVD (RTCVD), Remote Plasma-Enhanced CVD (RPECVD), Ultrahigh Vacuum CVD (UHVCVD), and others. But it will be recognized that the invention has a wider range of applicability; it can also be applied to other types of applications such as for three-dimensional packaging of integrated semiconductor devices, photonic devices, piezoelectronic devices, flat panel displays, microelectromechanical systems ("MEMS"), nano-technology structures, sensors, actuators, integrated circuits, biological and biomedical devices, and the like.

A method of manufacturing a photovoltaic layer on a semiconductor substrate is briefly outlined below.

1 Provide a semiconductor substrate, which has a surface region, a cleave region and a first thickness of material to be removed between the surface region and the cleave region;

2. Align the semiconductor substrate to an optically transparent substrate;

3. Couple the surface region of the semiconductor substrate to a first surface region of the optically transparent substrate;

4. Initiate a controlled cleaving action on a portion of the cleave region;

5. Cleave the semiconductor substrate to remove the first thickness of material from the semiconductor substrate, while the surface region remains coupled to the first surface region, to cause formation of a cleaved surface region; and 6. Optionally, form a second thickness of semiconductor material (for example using a silane species) overlying the cleaved surface region to form a resulting thickness of semiconductor material, which has one or more photovoltaic regions;

7. Provide a cover glass material overlying the second thickness of semiconductor material; and 8. Perform other steps, as desired.

The above sequence of steps provides a method according to an embodiment of the present invention. As shown, the technique includes a method and a structure for forming a solar cell structure using layer transfer techniques for photovoltaic applications. In a preferred embodiment, the method uses a silane species reactant gas to form a second thickness of material, which thickens a first thickness of material. Other alternatives can also be provided where steps are added, one or more steps are removed, or one or more steps are provided in a different sequence without departing from the scope of the claims herein. For example, in one embodiment, a seed layer may be formed by graphoepitaxy over the cleaved surface region, prior to formation of the second thickness of semiconductor material thereon.

Alternatively, there can be other ways of forming the structure. That is, the sequence can initially be formed on a cover sheet such as cover glass and other suitable materials and then forming the other layers according to a specific embodiment. The layer transfer occurs on the cover glass, which is used to form the rest of the solar cell device. Other techniques can use transfer substrates that will transfer a layer transferred material onto a handle substrate. Further details of the present method can be found throughout the present specification and more particularly below.

As shown in FIG. 1, the method provides a transparent handle substrate, which has a first deflection characteristic, a backside, and a face. The transparent handle substrate can be glass, quartz, glass ceramic, polymeric, or other composites, and the like. As merely an example, the transparent substrate has a thickness, a backside surface, and a face. The transparent substrate is glass, such as those used for covering solar cells or the like. Depending upon the embodiment, the glass is somewhat flexible and should be subjected to a backing plate for rigidity. Of course, there can be other variations, modifications, and alternatives.

In alternative embodiments, the handle substrate can be any homogeneous, graded, or multilayered material, or any combination of these. That is, the handle substrate can be made of almost any monocrystalline, polycrystalline, or even amorphous type substrate. Additionally, the substrate can be made of III/N materials such as gallium arsenide, gallium nitride (GaN), and others. Additionally, the substrate can be silicon carbide, germanium, silicon, glass, glass ceramic, or quartz combinations, plastics, and polymers, which have flexible characteristics. Preferably, the handle substrate has a somewhat flexible characteristic that is unsuitable for a layer transfer process according to a specific embodiment. The unsuitable nature of the substrate causes excessive roughness, breakage, partial film separation, and the like depending upon the specific embodiment. Any other combinations of materials can also be used, depending upon the specific embodiment.

In a preferred embodiment, the present invention provides a backing substrate to add rigidity to handle substrate structure, as shown in FIG. 2. Preferably, the backing substrate has a thickness and material that is adequate to provide an effective deflection characteristic of a multilayered structure composed of at least the backing substrate and handle substrates to be suitable for a thickness of silicon bearing material from the donor substrate to be transferred onto the face of the handle substrate.

As merely an example, the backing substrate is a silicon wafer for the quartz handle substrate. Such backing substrate has a thickness of 725 microns+/−15 microns and is made of single crystal silicon using, for example, a 200 millimeter donor/handle/backing substrate structures. Such substrate has a Young's modulus of about 130 Giga Pascal. Other types of materials and certain thicknesses such as plastic, metal, glass, glass ceramic, quartz, composites, and the like can be used to provide the rigidity to the combined backing and handle substrate structures. Of course, one of ordinary skill in the art would recognize other variations, modifications, and alternatives.

In an optional specific embodiment, the method performs a cleaning and/or activating process (e.g., plasma activated process) on surfaces of the backing and/or transparent handle substrates, as illustrated by FIGS. 3 and 4. Such plasma activating processes clean and/or activate the surfaces of the substrates. The plasma activated processes are provided using an oxygen or nitrogen bearing plasma at 20° C.-40° C. temperature. The plasma activated processes are preferably carried out in dual frequency plasma activation system manufactured by Silicon Genesis Corporation of San Jose, Calif. In still other embodiments, there may not be any backing material. Alternatively in still further embodiments, the present method can use a backing material by way of an electrostatic chuck and/or a porous chuck, and the like. Depending upon the specific embodiment, the present backing material can be provided on either the handle or donor substrate or both the handle and donor substrates. Of course, there can be other variations, modifications, and alternatives.

Figure 6:
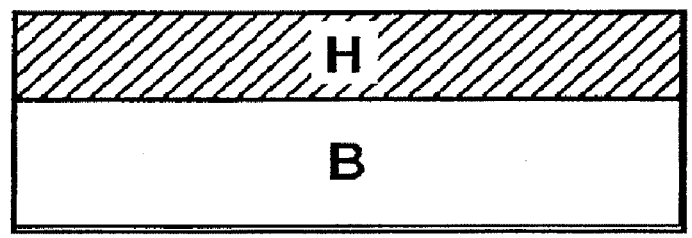

Referring to FIG. 5, the method initiates engagement of the backing substrate to the backside of the transparent handle substrate that is often physically separated from other structures. The method preferably temporarily attaches the backing substrate to the backside of the transparent handle substrate to firmly engage the backing substrate to the transparent handle substrate to form a multilayered structure. As merely an example, the silicon wafer backing substrate firmly attaches to the quartz plate without any other modifications and/or alterations according to a preferred embodiment. Here, the silicon wafer has a very thin coating of native oxide, which bonds to surfaces of the quartz plate, although there may be embodiments without such native oxide, as shown in FIG. 6. In other embodiments, bonding can occur using an electrostatic process or web bonding, including covalent bonding, any combination of these and the like. In yet alternative embodiments, the bonding can also occur using a spin on glass, glue layer, any combination of these, and the like. Of course, there can be other variations, modifications, and alternatives.

Figure 7:
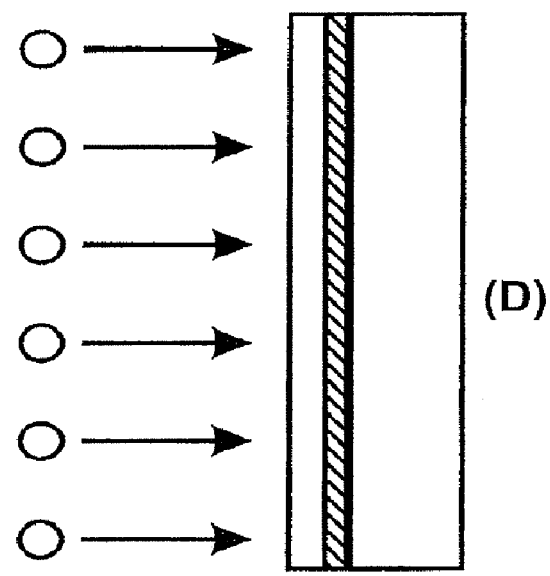

As shown, the method includes providing a donor substrate comprising a cleave region, a face, a backside, and a thickness of silicon bearing material between the face and the cleave region, as shown in FIG. 7. As merely an example, the donor substrate can be a silicon wafer, a germanium wafer, silicon germanium materials, silicon carbide bearing materials, Group III/N compounds, any combination of these, and others. In a preferred embodiment, the donor substrate is made using a photosensitive material. Of course there can be other variations, modifications, and alternatives.

Depending upon the embodiment, the cleave region can be formed using a variety of techniques. That is, the cleave region can be formed using any suitable combination of implanted particles, deposited layers, diffused materials, patterned regions, and other techniques. Referring to FIG. 6, the method introduces certain energetic particles using an implant process through a top surface of a donor substrate to a selected depth, which defines a thickness of the material region, termed the "thin film" of material. A variety of techniques can be used to implant the energetic particles into the silicon wafer. These techniques include ion implantation using, for example, beam line ion implantation equipment manufactured from companies such as Applied Materials, Inc. and others. Alternatively, implantation occurs using a plasma immersion ion implantation ("PIII") technique, ion shower, and other non-mass specific techniques. Combination of such techniques may also be used. Of course, techniques used depend upon the application.

Depending upon the application, smaller mass particles are generally selected to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $1 \times 10e15$ to about $1 \times 10e18$ atoms/cm2, and preferably the dose is greater than about $1 \times 10e16$ atoms/cm2. Implantation energy ranges from about 1 KeV to about 1 MeV, and is generally about 50 KeV. Implantation temperature ranges from about 20 to about 600 Degrees Celsius, and is preferably less than about 400 Degrees Celsius to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about +/−0.03 to +/−0.05 microns. Of course, the type of ion used and process conditions depend upon the application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically at least partially be repaired by subsequent heat treatment, e.g., thermal annealing or rapid thermal annealing. A resulting substrate, which has been subject to implant, is illustrated by the simplified diagram of FIG. 7.

Depending upon the embodiment, there may be other techniques for forming a cleave region and/or cleave layer. As merely an example, such cleave region is formed using other processes, such as those called a Nanocleave™ process of Silicon Genesis Corporation of Santa Clara, Calif., a Smart-Cut™ process of Soitec SA of France, and an Eltran™ process of Canon Inc. of Tokyo, Japan, any like processes, and others. Of course, there may be other variations, modifications, and alternatives.

Figure 8:
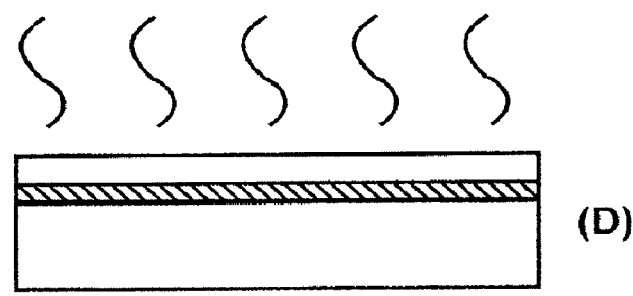

In a specific embodiment, the transparent handle substrate, which has been coupled to the backing, and donor substrate are both subjected to plasma activated processes, as shown in part in FIG. 8. Such plasma activated processes clean and/or activate the surfaces of the substrates. The plasma activated processes are provided using an oxygen or a nitrogen bearing plasma at 20° C. to 40° C. temperature. The plasma activated processes are preferably carried out in dual frequency plasma activation system manufactured by Silicon Genesis Corporation of San Jose, Calif. Of course, there can be other variations, modifications, and alternatives, which have been described herein, as well as outside of the present specification.

Figure 9:
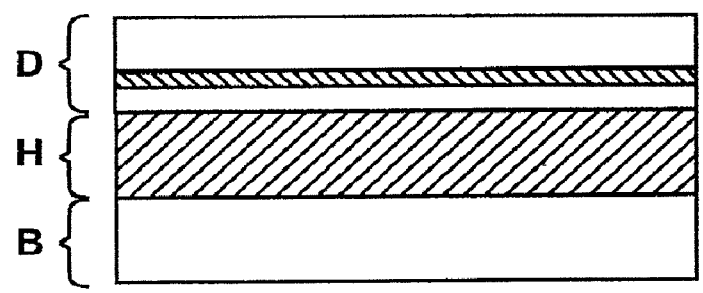

Thereafter, each of these substrates is bonded together, as also illustrated by FIG. 9. As shown, the handle substrate has been bonded to donor wafer. The substrates are preferably bonded using an EVG 850 bonding tool manufactured by Electronic Vision Group or other like processes. Other types of tools such as those manufactured by Karl Suss may also be used. Of course, there can be other variations, modifications, and alternatives. Preferably, bonding between the transparent handle substrate and the donor is substantially permanent and has good reliability.

Accordingly after bonding, the bonded structure is subjected to a bake treatment. The bake treatment maintains the bonded substrate at a predetermined temperature and predetermined time. Preferably, the temperature ranges from about 200 or 250 Degrees Celsius to about 400 Degrees Celsius and is preferably about 350 Degrees Celsius for about 1 hour or so for silicon donor substrates and transparent handle substrates. In a specific embodiment, the present bake treatment can occur using a conductive heating process with a hot plate and/or surfaces, which directly couple thermal energy directly from the hot plate to the bonded substrate. In other embodiments, the thermal energy can be provided using radiation, conduction, convection, or any combination of these techniques, and the like. Depending upon the specific application, there can be other variations, modifications, and alternatives.

In a specific embodiment, the substrates are joined or fused together using a low temperature thermal step. The low temperature thermal process generally ensures that the implanted particles do not place excessive stress on the material region, which can produce an uncontrolled cleave action. Another consideration of this step in combination with the plasma-activation surface treatment is to allow the bond strength to be increased to eliminate delaminating the assembly during the same bake treatment step, usually caused by stresses induced by the coefficient of thermal expansion mismatch of the dissimilar materials used. In a specific embodiment, the low temperature bonding process occurs by a self-bonding process. In particular, one wafer is stripped to remove oxidation there from (or one substrate is not oxidized). A cleaning solution treats the surface of the wafer to form O—H bonds on the wafer surface. An example of a solution used to clean the wafer is a mixture of hydrogen peroxide and sulfuric acid, and other like solutions. A dryer dries the wafer surfaces to remove any residual liquids or particles from the substrate surfaces. Self-bonding occurs by placing surfaces of cleaned substrates together.

Alternatively, an adhesive disposed on either or both surfaces of the substrates, which bond one substrate to another substrate. In a specific embodiment, the adhesive includes an epoxy, polyimide-type materials, and the like. Spin-on-glass layers can be used to bond one substrate surface onto the face of another. These spin-on-glass ("SOG") materials include, among others, siloxanes or silicates, which are often mixed with alcohol-based solvents or the like. SOG can be a desirable material because of the low temperatures (e.g., 150 to 250 degree C.) often needed to cure the SOG after it is applied to surfaces of the wafers.

Alternatively, a variety of other low temperature techniques can be used to join the donor wafer to the handle substrates. For instance, an electro-static bonding technique can be used to join the two substrates together. In particular, one or both substrate surface(s) is charged to attract to the other substrate surface. Additionally, the donor substrate can be fused to the handle wafer using a variety of other commonly known techniques. In a specific embodiment, the present bonding process to join the donor and handle substrates together can use an in-situ plasma activated bonding process, an in-situ electro-static bonding process, any combination of these, and the like. Of course, the technique used depends upon the application.

In a preferred embodiment, the method uses an optical coupling material between the two substrates. The optical coupling material is any suitable material that has a refractive index of about 1.8 to about 2.2, but can be others. The material can be selected from Tin Oxide, Indium Tin Oxide (ITO), Zinc Oxide (ZnO), Titanium Dioxide or other dielectric stack formation materials, and the like, including combination of these. Depending upon the embodiment, the material can include one or more layers, and other configurations. Of course, there can be other variations, modifications, and alternatives.

Figure 10:
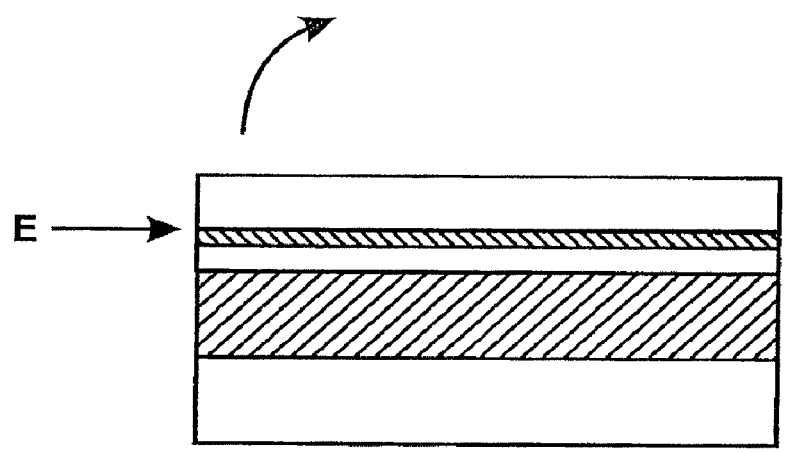
Figure 11:
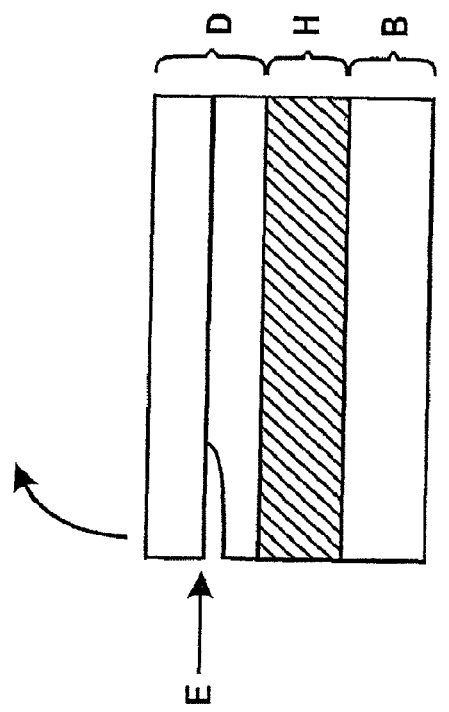
Figure 12:
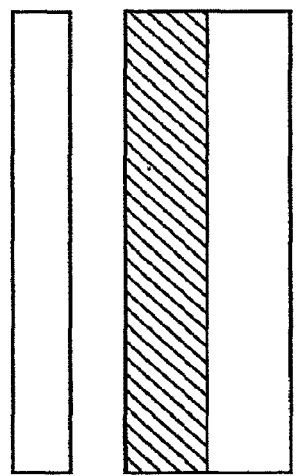

The method performs a controlled cleaving process on the bonded substrate structure, as illustrated by FIGS. 10 and 11. The controlled cleaving process provided a selected energy within a portion of the cleave region of the donor substrate. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes. Next, the method frees the thickness of material from the donor substrate to completely remove the thickness of material from the donor substrate, as shown by FIG. 12.

Figure 13:
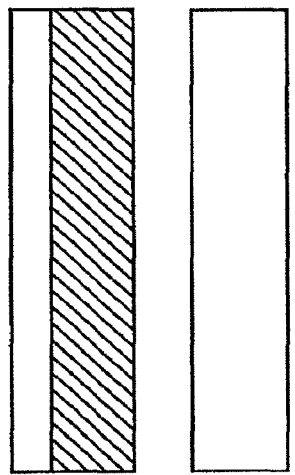

In a preferred embodiment, the method removes the backing substrate from the transparent handle substrate, as illustrated in FIG. 13. In a preferred embodiment, the attachment between the backing substrate and handle substrate is temporary and can be removed with mechanical force without damaging either substrates. In a specific embodiment, a separation process may be used to detaching the backing substrate from the handle substrate. In a specific embodiment, the backing substrate can also be released when the backing substrate member has been provided using an electrostatic, vacuum, or mechanical chuck and/or attachment device. Of course, there can be other variations, modifications, and alternatives.

Figure 14:
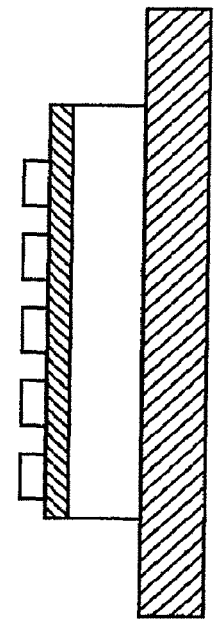

Referring to FIG. 14, the method forms photovoltaic devices onto surfaces of the thickness of material. Such devices can also include integrated semiconductor devices and photovoltaic devices. Such devices can be made using deposition, etching, implantation, photo masking processes, ink jet printing, screen printing, any combination of these, and the like. Of course, there can be other variations, modifications, and alternatives.

In a specific embodiment, the method can also thicken the thickness of transferred material using a deposition process. In a specific embodiment, the method uses a solid phase epitaxial process and/or other forms of deposition processes. The process can form a suitable single crystal silicon or like material according to a specific embodiment. As merely an example, the material can be amorphous silicon, polycrystalline silicon, germanium and silicon germanium alloy. For example, amorphous silicon could advantageously allow for solid-phase epitaxial growth of single-crystal silicon using the underlying transferred silicon film as a template. Another method that can increase the effective rate of silicon material deposition is to spray or coat the surface with silicon nanoparticles (advantageously amorphous silicon) which can be thermally treated to produce single-crystal silicon using the underlying transferred silicon film as a template. This can be applied dry of using a liquid that would be eliminated during subsequent processing. Polycrystalline silicon and other materials may also allow single-crystal regrowth using appropriate treatments such as laser anneals, flash thermal treatments and the like. Of course, there can be other variations, modifications, and alternatives.

In a preferred embodiment, the present method uses a silane species, which can be deposited using a desired thermal budget and growth rate. In a specific embodiment, the method includes supplying a gas including a tri-silane species into a reaction chamber. Depending upon the embodiment, the silane can also be di-silane or combinations of tri-silane and others. An example of tri-silane can be provided from a company called Voltaix, Inc. PO Box 5357 N. Branch, N.J. 08876. Of course, there can be other variations, modifications, and alternatives. Further details of the present method and in particular equipment and/or tools for the present invention can be found throughout the present specification and more particularly below.

As merely an example, the reaction chamber is illustrated by a simplified diagram of a glow discharge reactor in FIG. 14A or a furnace reactor in FIG. 14B. These diagrams are merely examples, which should not unduly limit the scope of the claims herein. One of ordinary skill in the art would recognize other variations, modifications, and alternatives. As shown in FIG. 14A, the glow discharge includes a reactant gas supply which feed into the reaction chamber after being excited by an inductively coupled RF glow discharge. In a specific embodiment, the reactor can process multiple batches of substrates for high throughput manufacturing. An example of the reaction chamber can be an epitaxial silicon deposition tool called the ASM A 400 manufactured by ASM International N.V., headquartered in Bilthoven, Netherlands, but can be others.

In a specific embodiment, common gases include, among others tri-silane, di-silane, dopant gases such as phosphine and diborane, and dilution gases such as hydrogen. In a preferred embodiment, the method uses the tri-silane species to form a deposited film using a glow discharge within the reaction chamber. In yet another preferred embodiment, the method uses the tri-silane species to form a deposited film using a thermal CVD process within the reaction chamber. Other CVD methods include plasma and photo-enhanced CVD reactant gas excitation methods. The method deposits material using one or more of these CVD deposition processes, including the silane species, overlying the cleaved surface to thicken the first thickness of silicon material at a deposition rate equal to or greater than a solid phase epitaixal re-growth rate of the material to crystallize the material overlying the first thickness of silicon material. In a specific embodiment, the solid phase epitaxial re-growth rate can be described in more detail with reference to the Figures below.

FIG. 14C is a simplified plot of a solid phase epitaxial growth rate of silicon as a function of temperature. This diagram represents the hydrogen-free solid phase epitaxial growth rate and is merely an example, which should not unduly limit the scope of the claims herein. For example, hydrogen-rich amorphous silicon films would recrystallize at different rates and may suffer from breakdown in the crystalline re-growth due to improper selection of re-growth conditions. See for example P. Strandis & al., (Materials Research Society Spring Meeting, San Francisco 2006) discusses crystalline re-growth breakdown of high-H amorphous film deposited at low temperatures (320 C-370 C). Such films could be recrystallized without single-crystal breakdown if the thickness is limited or the deposition conditions can be modified to grow low-hydrogen amorphous films. Low impurity films would in principle allow very thick films to be successfully recrystallized if random phase nucleation processes do not occur within the amorphous layer during the solid phase epitaxial crystallization temperature treatment. Understanding the kinetics of random nucleation is important to avoid this competing process. For example, Chapter 7 of the Handbook of Crystal Growth Vol. 3 (Elsevier Science 1994) ("Crystal Growth") teaches that hydrogen concentration can retard the solid phase epitaxial growth rate between 0 and roughly 50% depending on the hydrogen concentration within the vicinity of the crystalline/amorphous interface. At 650 C recrystallization temperature, FIG. 15 of Crystal Growth shows that about 2.5 orders of magnitude exists between the complete crystallization of a 2000 Angstrom amorphous silicon film and the nucleation of random crystalline phases. The plot shows that at this crystallization growth temperature, even with a 2 times growth retardation rate due to high hydrogen content, the process condition would still allow roughly 20-30 um silicon films to be crystallized without random nucleation processes occurring. This is well within the target silicon film thicknesses described as being preferred for high-efficiency thin-silicon photovoltaic solar cells (see for example A. W. Blakers & al., Appl. Phys. Lett. (60) 22, 1 Jun. 1992 pp. 2752-2754). Higher temperature of crystallization growth are possible but the threshold thickness before random phase nucleation occurs will decrease with increasing temperature. One of ordinary skill in the art would recognize other variations, modifications, and alternatives.

As also shown in FIG. 14C, the solid phase epitaxial growth rate or re-growth rate is plotted along the vertical axis, which intersects with temperature on the horizontal axis. The growth rate is provided as a measure of thickness growth of a higher crystalline phase per second and the temperature is provided as 1/kT. The growth rate is logarithmic on the scales illustrated. As an example, the term solid phase epitaxial growth rate is defined as the rate in which an amorphous/crystalline phase advances by the re-ordering process of the disordered atoms within the amorphous metastable phase in proximity to a single-crystal template. As the ordering progresses, the crystalline/amorphous interface moves at a certain rate defined as the solid phase epitaxial growth rate. This crystalline phase thickening is a kinetic (i.e., temperature activated) process as shown but can also be affected by impurities such as hydrogen. It is particularly advantageous to select process conditions and template crystalline quality to allow solid phase epitaxial growth yielding single-crystal quality films. The definition of the solid phase epitaxial growth rate can also have other meanings consistent with one of ordinary skill in the art. Of course, there can be various alternatives, modifications, and variations. The solid phase epitaxial growth rate is then plotted against growth rates of films using silane gases in FIG. 14D, which are provided in more detail below.

Figure 14D:
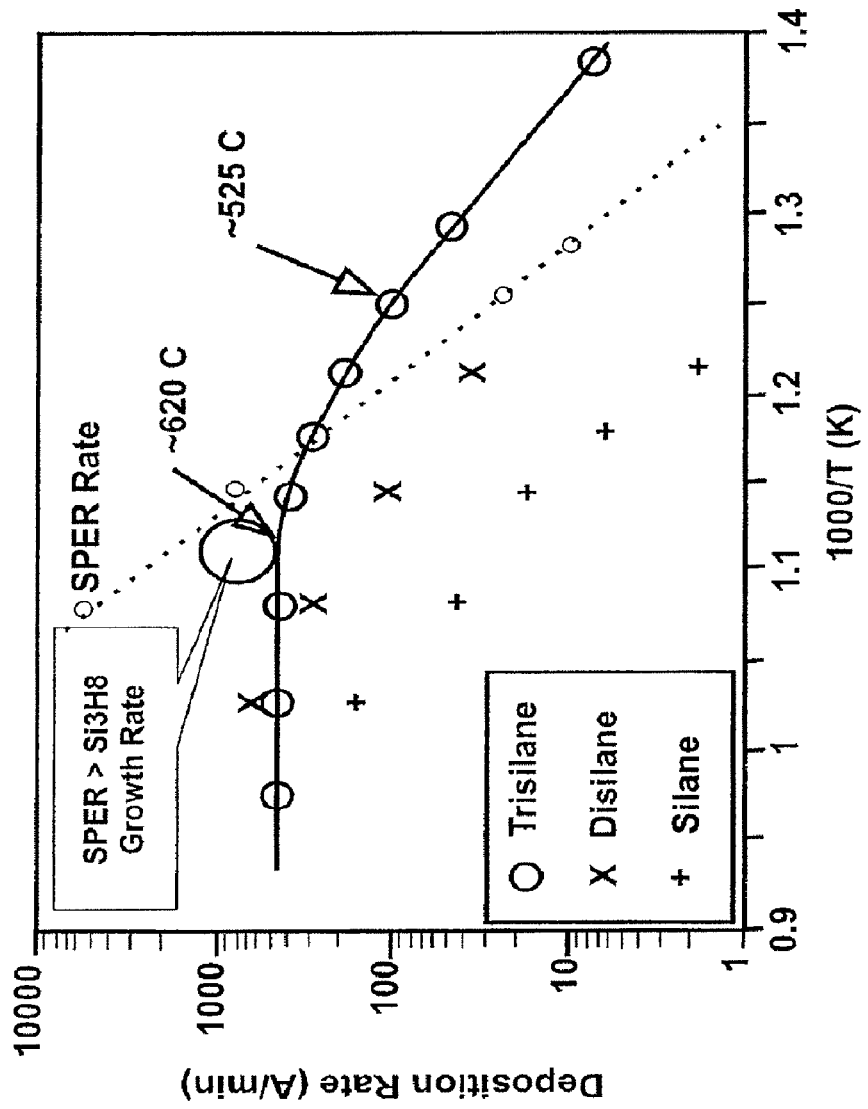
FIG. 14D is a simplified plot of deposition rates of silane gases and solid phase epitaxial growth rate of silicon as a function of temperature.

FIG. 14D is a simplified plot of deposition rates of silane gases and solid phase epitaxial growth rate of silicon as a function of temperature. This diagram is provide from FIG. 10 of U.S. Pat. No. 6,821,825 assigned to ASM America Inc. of silane species gas deposition rates at 40 Torr pressure and is merely an example, which should not unduly limit the scope of the claims herein. As shown, the solid phase epitaxial growth rate or re-growth rate is plotted along the vertical axis, which intersects with temperature on the horizontal axis. The growth rate is provided as a measure of thickness per second and the temperature is provided as 1/kT. The diagram also illustrates deposition rates for silane, di-silane, and tri-silane. As shown, there is a region of the plot where the solid phase epitaxial growth rate is greater to or equal the growth rate of films using tri-silane or di-silane. In a preferred embodiment, the present method of thickening the first thickness of material to cause formation of the second thickness of material is practiced in the region in a manner that is recrystallized in-situ during the growth phase. If the solid phase epitaxial growth rate or impurity release rates are not fast enough, occasional and temporary purging of the silane species can help the film anneal (at the same or at a different temperature) to maintain a fully crystalline state before restarting the deposition process. Of course, one of ordinary skill in the art would recognize other variations, modifications, and alternatives.

In a specific embodiment, the deposition rate of the material overlying the first thickness of material is provided at a desired rate. In a specific embodiment, the deposition rate ranges from about 450 to about 550 Angstroms per minute in the specific deposition process conditions of FIG. 14D. Depending on the process conditions, kinetic or mass-transport limited deposition processes can be selected. In this example, tri-silane deposition crosses kinetic to mass-transport limited deposition at about 620 C. Selection of the specific conditions include growth rate, film quality and film uniformity. The rate is selected to facilitate production of solar cells or other devices as an example. In a specific embodiment, the handle substrates including overlying first thickness of films are batch processed such as using a furnace deposition system as described in U.S. Patent Application No. U.S. 2006/0088985 A1, but can be others. Of course, there can be other variations, modifications, and alternatives.

In a specific embodiment, the method includes depositing of the material at a desired temperature to prevent any damage to the handle substrate, which can be glass or other temperature sensitive material. In a specific embodiment, the temperature is maintained at about 650 Degrees Celsius and less. In a preferred embodiment, the temperature is maintained at about 550 Degrees Celsius and less. Depending upon the specific embodiment, the deposition rate can be limited by mass transfer, kinetic, or other transport limitations. As merely an example, the deposition rate is characterized substantially by a mass transfer rate. In an alternative example, the deposition rate is characterized substantially by a reaction rate. Of course, there can be other variations, modifications, and alternatives.

In a specific embodiment, the present method includes an etching and/or deposition process (e.g., plasma assisted deposition) for smoothing the cleaved surface region before any step of forming photovoltaic regions and/or forming the thickened layer. The method can use a smoothing process that includes thermal treatment of the cleaved film using a hydrogen and hydrogen chloride containing environment according to a specific embodiment. Alternatively, the etchant can be a chemical bath (e.g., KOH, TMAH) to etch the cleaved film to a predetermined amount. The etching process can be used to remove about 300 to about 800 Angstroms of hydrogen damaged silicon, as an example. In a specific embodiment, the etching process can also be preceded by an oxidation process to convert the hydrogen damaged region into oxide, which is later stripped using a buffered oxide etch and/or other suitable etching species. Of course, there can be other variations, modifications, and alternatives.

In a preferred embodiment, the transferred material is thickened using an amorphous silicon layer. In a preferred embodiment, the amorphous silicon layer is re-crystallized or the like. In a specific embodiment, the amorphous silicon layer is deposited using application of nanoparticles (e.g., amorphous silicon, crystalline silicon, polysilicon, or combinations of these), which are later subjected to a thermal treatment to cause formation of a sheet of thickened material. Alternatively, the amorphous silicon layer can be formed using physical vapor deposition or chemical vapor deposition (e.g., plasma enhanced) at low temperature according to a specific embodiment. In a preferred embodiment, the amorphous silicon layer, which has been deposited overlying a glass material, is maintained at a temperature of less than 500 Degrees Celsius during formation of such silicon layer. In a specific embodiment, the resulting film can be a single crystal and/or polycrystalline structure according to a specific embodiment. In preferred embodiments, the resulting film is single crystalline and has suitable electrical characteristics. Of course, there can be other variations, modifications, and alternatives.

Depending upon the embodiment, the thickened material can be subjected to impurities to form the solar cell structures. In a specific embodiment, the impurities can be in-situ doped, diffused, and/or implanted using ion beams, plasma immersion implantation, ion shower, non-mass separated implantation, substantially or partially non-mass separated, or conventional implantation techniques. These solar cell structures can include impurity regions for P-type and N-type impurities according to a specific embodiment. Of course, there can be other variations, modifications, and alternatives.

In a specific embodiment, the method can also form another layer overlying the thickened layer to form the photovoltaic devices. The other layer can be a semiconductor layer, which can be used to enhance the photovoltaic devices provided for the completed solar cell structure, according to a specific embodiment. In an alternative embodiment, the other layer can be germanium, silicon germanium, II/IV, III/V, any combination of these, and others. The other layer can be used to form another set of photovoltaic regions, which can be coupled to other photovoltaic devices, to enhance the total photovoltaic intensity. Of course, there can be other variations, modifications, and alternatives.

In a preferred embodiment using monosilane species, the method uses a plasma enhanced CVD process to deposit the silane species. As an example, the silane species can be deposited using a plasma deposition system using such excitation sources such as electron cyclotron resonance (ECR), capacitively-coupled parallel plate, inductively-coupled plasma (ICP) or the like. Alternatively, other plasma deposition systems can also be used. In a specific embodiment, the deposition system can maintain a deposition temperature of about 650 Degrees Celsius and less or more preferably 550 Degrees Celsius and less for depositing single crystal silicon on a silicon substrate using an SiH4 gas mixed with a dilution gas such as helium or hydrogen gas. In a specific embodiment, the ratio of H2:SiH4 is about 3 and less, which would result in higher growth rates but rougher films. In a specific embodiment using a ratio of about 3 and greater yields higher quality epitaxial films but at a lower growth rate. A detailed explanation of such deposition process can be found in Scott DeBoer and Vikram Dalal, Department of Electrical and Computer Engineering, Iowa State University, Ames, Iowa 5011, in a paper titled "Preparation and Properties of High Quality Crystalline Silicon Films Grown by ECR Plasma Deposition, First WCPEC; Dec. 5-9, 1994, Hawaii, which is incorporated by reference herein. Depending upon the embodiment, other gas mixtures can also be used.

In a specific embodiment, the cleaved surface is also cleaned before forming the thickened layer of silicon. In a preferred embodiment, the method uses at least a wet clean, e.g., RCA, and HF dip, which will remove a thin oxide layer on the cleaved surface. Additionally, the wet cleaned surface, which is silicon, can be subjected to an ex-situ or more preferably an in-situ plasma clean, including a hydrogen plasma according to a specific embodiment. The hydrogen plasma is often provided in a vacuum and removes unwanted carbon and oxygen species from the cleaved surface. Of course, there can be other variations, modifications, and alternatives.

Depending upon the embodiment, the present method and structure can be formed with a specific thickness of the thickened layer and/or combination of the layer transferred layer and thickened layer. In a specific embodiment, the thickened layer can be about 1 micron and 20 microns using a silicon material. In other embodiments, the thickened layer can be less than 1 micron or greater than 20 microns. In other embodiments, the thickened layer can be less than about 50 microns. Of course, there can be other variations, modifications, and alternatives.

Figure 15:
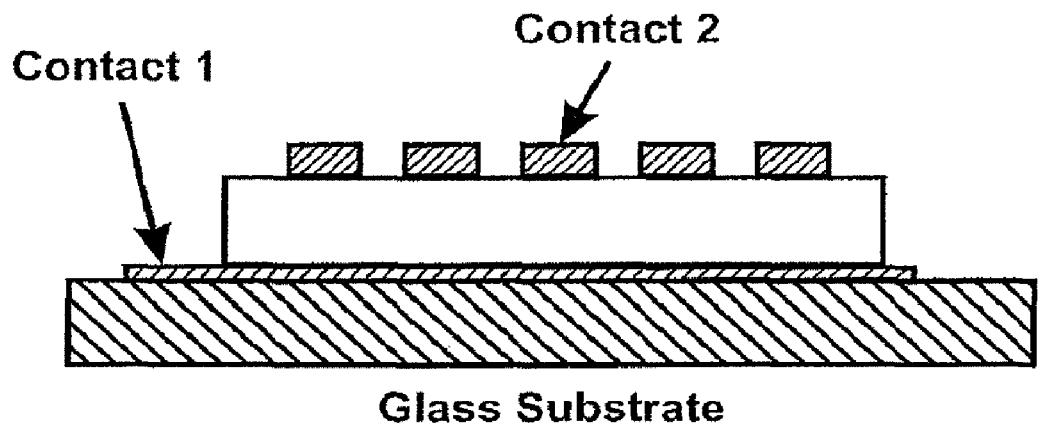
FIGS. 15 to 18 illustrate simplified diagrams of solar cell configurations according to embodiments of present invention.

FIGS. 15 to 18 illustrate simplified diagrams of solar cell configurations according to embodiments of present invention. These diagrams are merely illustrations and should not unduly limit the scope of the claims herein. One of ordinary skill in the art would recognize many variations, modifications, and alternatives. As shown in FIG. 15, a first contact layer is formed sandwiched between a glass substrate and a first surface of a semiconductor layer. In a specific embodiment, the contact layer can be made of a suitable material such as a transparent conductive material, such as ITO and the like. Other materials can also be used. The first contact layer couples to a first electrode structure for a photovoltaic cell, which often comprises a p-n junction or multiple p-n junctions. As merely an example, the semiconductor layer may comprise material such as suitable single crystal silicon and others. A second contact layer is formed overlying a second surface of the semiconductor layer. The second contact layer is arranged in a direction parallel to the first contact layer. In a specific embodiment, the second contact layer is patterned to form a plurality of electrodes, which couple to each of the photovoltaic regions. Each of the electrodes can be configured in parallel and/or series depending upon the specific embodiment. Of course, there can be other variations, modifications, and alternatives.

Figure 16:
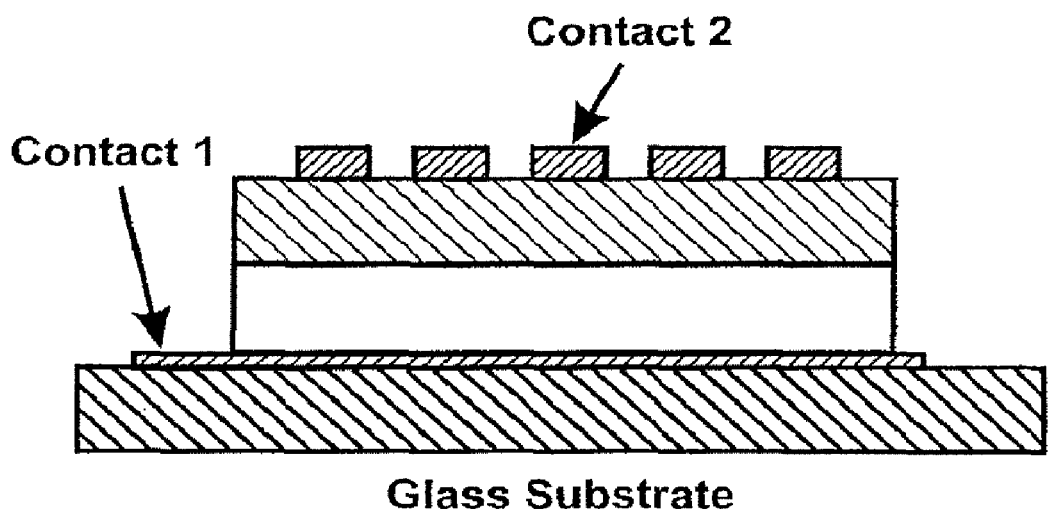

In a specific embodiment, additional junctions can be formed between the second contact layer and the semiconductor substrate to increase efficiency of a solar cell as shown by the simplified diagram of FIG. 16. As shown, the additional junctions are provided on a thickened layer overlying the thickness of single crystal silicon material according to a specific embodiment. The additional junctions can be separate from the photovoltaic devices in the thickness of single crystal silicon. Each of these additional junctions can be configured in parallel and/or series to each other and coupled to the photovoltaic devices in the thickness of silicon material. Of course, there can be other variations, modifications, and alternatives.

Figure 17:
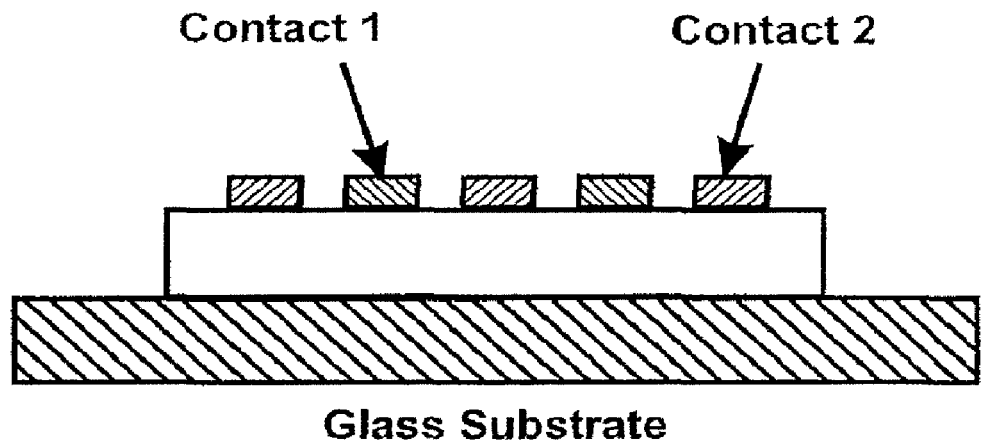
Figure 18:
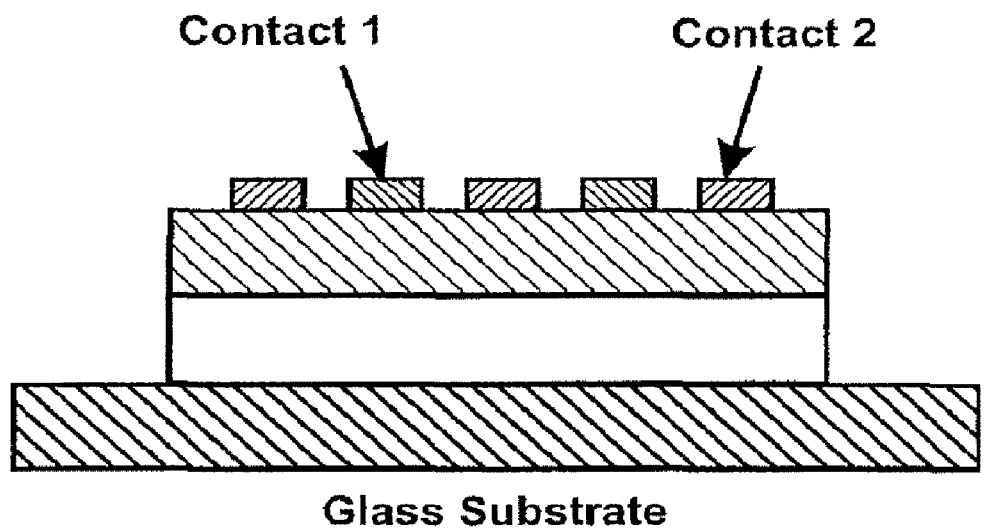

FIG. 17 illustrates yet another example of solar cell configuration according to an embodiment of the present invention. As shown, a glass substrate is attached to a first surface of a semiconductor layer. A first contact structure and a second contact structure are formed overlying a second surface of the semiconductor layer. The first contact structure is configured substantially parallel to the second contact structure. As shown, each of the photovoltaic devices is coupled to at least the first and second contact structures, which are overlying the thickness of single crystal silicon material. Alternatively, additional junctions can be formed between the contact structures and the semiconductor substrate to increase efficiency of the solar cell as shown FIG. 18. Of course there can be other variations, modifications, and alternatives.

Figure 19:
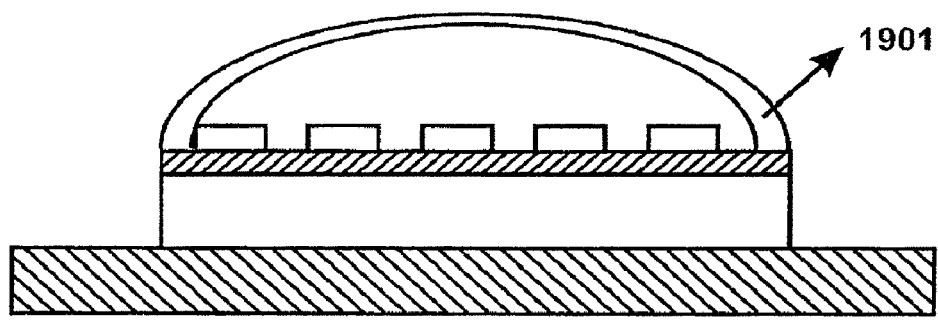
FIG. 19 is a simplified diagram of a solar cell having a reflective surface region according to an embodiment of the present invention.

FIG. 19 is a simplified diagram of a solar cell having a reflective surface region according to an embodiment of the present invention. As shown, a solar cell is provided. The solar cell includes a glass substrate attached to a first surface of a semiconductor layer. A plurality of contact structures are formed overlying a second surface of the semiconductor layer. As shown, each of the photovoltaic devices is coupled to at least the contact structure, which are overlying the thickness of single crystal silicon material. Light traverses through the glass substrate and the photovoltaic devices in the semiconductor layer and converts into electrical energy. As shown, a reflective surface 1901 is provided to reflect any residual light that passes through the photovoltaic regions to further activate one or more of the photovoltaic devices and convert into electrical energy. The reflective surface can be provided using material such as aluminum, silver, gold, or other suitable reflective material. Alternatively, if a non-conductive reflector is desirable, a dielectric stack reflector can be designed alone or in combination with a conductive reflector. The reflective surface provides means for multiple passes of light in the photovoltaic device and increases efficiency of the solar cell. Of course there can be other variations, modifications, and alternatives.

Figure 20:
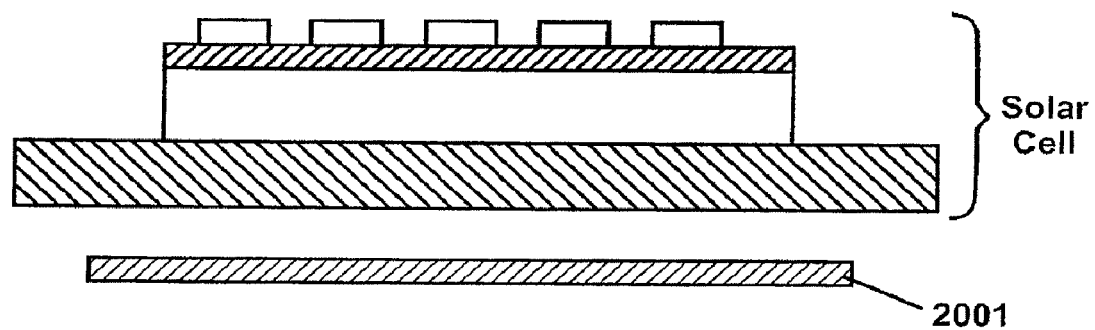
FIG. 20 is a simplified diagram of a solar cell having a lens or light redirection region according to an embodiment of the present invention.

FIG. 20 is a simplified diagram of a solar cell having a lens region according to an embodiment of the present invention. As shown, a solar cell is provided. The solar cell includes a glass substrate attached to a first surface of a semiconductor layer. A plurality of contact structures are formed overlying a second surface of the semiconductor layer. As shown, each of the photovoltaic devices is coupled to at least the contact structure, which are overlying the thickness of single crystal silicon material. Light traverses through the glass substrate and the photovoltaic devices in the semiconductor layer and converts into electrical energy. In a specific embodiment, light is redirected and/or scattered using an optical element 2001 coupled to the glass substrate to direct light in more oblique angles and increase collection efficiency of the solar cell. An example of such an optical element can be a Fresnel lens. The Fresnel lens can be made of a plastic material or glass material. Alternatively, the glass substrate can be modified to scatter or redirect light and function like a Fresnel lens. By modifying the shape of optical element 2001, the light trapping action can occur by total internal reflection as allowed by a waveguide effect within the silicon thin-film or by approximating a Lambertian source and thus increasing the effective thickness of the thin-film cell. These effects can be combined to improved and even optimize the total light conversion efficiency of the cell. Of course, there can be other variations, modifications, and alternatives.

FIG. 21 shows a specific embodiment where an optical element is chosen such that the mostly specular light rays are directed at an oblique angle towards the thin-film photovoltaic cell. This diagram is merely an example, which should not unduly limit the scope of the claims herein. One of ordinary skill in the art would recognize other variations, modifications, and alternatives. In a specific embodiment, the thickness of the thin-film is chosen such that the waveguide can not only trap the light impinging at the angle within the glass substrate but supports the propagation within the thin-film for the range of light wavelengths of interest. The design considerations are thus, for all wavelengths of interest (e.g., IR to near-UV which constitutes the largest solar power spectrum wavelength distribution), to allow propagation of transverse electric (TE), transverse Magnetic™, and combination modes and higher order modes within the thickness of the thin-film cell to be allowed to propagate. A suitable dispersion curve for the waveguide to accomplish this design goal would generate the range of allowable silicon thicknesses and select the optical coupling layers that would act as the waveguide cladding. The entrance angle of the light within the transparent substrate would also be a design consideration for correct operation of the system throughout the range of cell entrance angles. Once coupled within the thin-film, the propagation will be highly attenuating due to the absorption of the radiation and its conversion to electricity by generating carriers within the thin-film. The longitudinal propagation of the light coincident with the longitudinal PN junction would help maximize light con version efficiency. The resulting electric power would be collected by contacts 1 and 2. The structure also allows for light coupling layers that can help lower reflections that can lower the coupled light energy within the active area of the thin-film solar cell. In a specific embodiment, the wave guide can be operable in a multi-mode or single mode. Additionally, the wave can be made using an internal material to cause a difference in refractive index for internal reflection of incoming light according to a specific embodiment. In a preferred embodiment a thin layer of silicon germanium can be sandwiched within a silicon structure to improve and even optimize light confinement to a region (e.g., central region) of one or more photovoltaic regions. Of course there can be other variations, modifications, and alternatives.

Figures 22, 23:
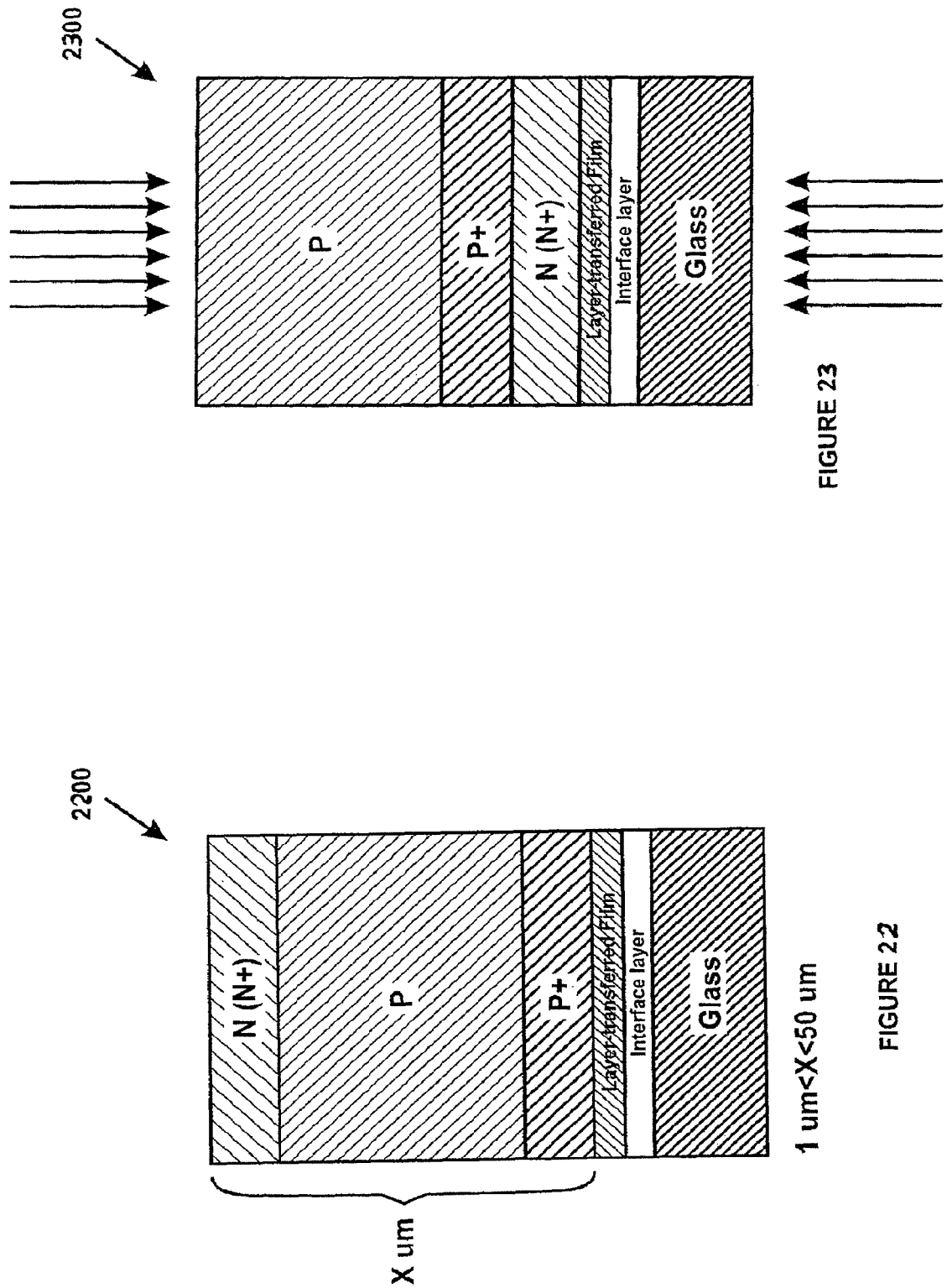
FIGS. 22 through 24 illustrate alternative single junction silicon solar cells according to embodiments of the present invention.
Figure 24:
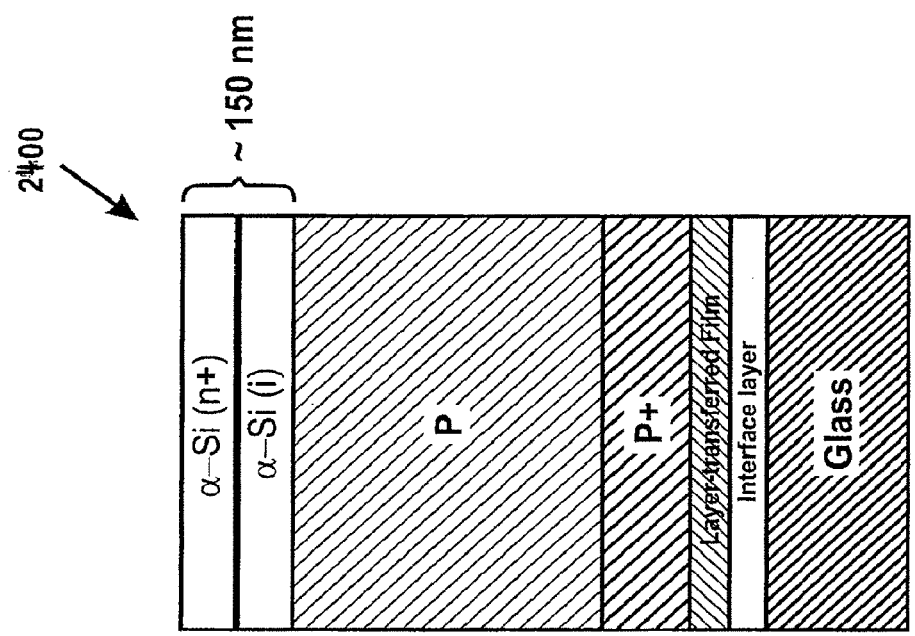

FIGS. 22-24 illustrate alternative single junction silicon cell configurations according to embodiments of the present invention. This diagram is merely an example, which should not unduly limit the scope of the claims herein. One of ordinary skill in the art would recognize other variations, modifications, and alternatives. As shown, the device 2200 has a handle substrate comprising a handle substrate surface region. In a specific embodiment, the handle substrate can be glass, glass ceramic, quartz, or any of the materials described herein as well as outside of the specification as known to one of ordinary skill in the art. In a specific embodiment, the device has an interface material overlying the handle substrate surface region to improve and/or even optimize one or more of the bond, optical, and reflective properties. In a specific embodiment, the interface material can be a thin layer of dielectric material, such as silicon dioxide, or metal layer, such as tungsten, aluminum, platinum, titanium, or other types of glue layers. In a specific embodiment, the interface layer is transparent or optically transparent such as indium tin oxide, commonly called ITO. Of course, there can be other variations, modifications, and alternatives.

In a specific embodiment, the device includes a layer transferred film overlying the interface material. In a specific embodiment, the layer transferred layer can be a single crystal silicon material, single crystal germanium material, or others. Depending upon the embodiment, the layer can be provided using a layer transfer technique. As merely an example, such layer transfer technique can be those called the Nanocleave™ process of Silicon Genesis Corporation of Santa Clara, Calif., the SmartCut™ process of Soitec SA of France, and the Eltran™ process of Canon Inc. of Tokyo, Japan, any like processes, and others. Of course, there may be other variations, modifications, and alternatives.

Referring again to FIG. 22, the device includes a deposited thickness of single crystal silicon or single crystal germanium material having one or more defects therein. In a specific embodiment, the deposited thickness of single crystal silicon or single crystal germanium has a P-type material overlying the layer transferred film and an N-type material overlying the P-type material. As shown, the P-type material includes has a P+ type material for contacting purpose and an overlying P-type material as the light absorbing region. In a specific embodiment, the deposited layer has a thickness ranging from about 1 μm to about 50 μm but can be others. As shown, electromagnetic radiation from the sun or other energy sources can be provided overlying the N-type material. Of course, there can be other variations, modifications, and alternatives.

Referring now to FIG. 23, the device 2300 has a handle substrate comprising a handle substrate surface region. In a specific embodiment, the handle substrate can be glass, glass ceramic, quartz, or any of the materials described herein as well as outside of the specification as known to one of ordinary skill in the art. In a specific embodiment, the device has an interface material overlying the handle substrate surface region. In a specific embodiment, the interface material can be any suitable type of material and/or materials that facilitate bonding or joining of the layer transferred layer overlying the handle substrate. In a specific embodiment, the interface material can be a thin layer of dielectric material, such as silicon dioxide, or metal layer, such as tungsten, aluminum, platinum, titanium, or other types of glue layers. In a specific embodiment, the interface layer is transparent or optically transparent such as indium tin oxide, commonly called ITO. Of course, there can be other variations, modifications, and alternatives.

In a specific embodiment, the device includes a layer transferred film overlying the interface material. In a specific embodiment, the layer transferred layer can be a single crystal silicon material, single crystal germanium material, or others. Depending upon the embodiment, the layer can be provided using a layer transfer technique. As merely an example, such layer transfer technique can be those called the Nanocleave™ process of Silicon Genesis Corporation of Santa Clara, Calif., the SmartCut™ process of Soitec SA of France, and the Eltran™ process of Canon Inc. of Tokyo, Japan, any like processes, and others. Of course, there may be other variations, modifications, and alternatives.

Referring again to FIG. 23, the device includes a deposited thickness of single crystal silicon or single crystal germanium material having one or more defects therein. In a specific embodiment, the deposited thickness of single crystal silicon or single crystal germanium has an N-type material for the junction and related external contact overlying the layer transferred film and a P-type material overlying the N-type material. As shown, the P-type material includes has a P+ type material overlying the P-type material, which is overlying the N-type material. In a specific embodiment, the deposited layer has a thickness ranging from about 1 µm to about 50 µm but can be others. As shown, electromagnetic radiation from the sun or other energy sources can be provided overlying the P+-type material. Alternatively, electromagnetic radiation can also be provided on a backside surface of the handle substrate, which passes the electromagnetic radiation to overlying photovoltaic regions. Of course, there can be other variations, modifications, and alternatives.

Referring now to FIG. 24, the device 2400 has a handle substrate comprising a handle substrate surface region. In a specific embodiment, the handle substrate can be glass, quartz, glass ceramic, or any of the materials described herein as well as outside of the specification as known to one of ordinary skill in the art. In a specific embodiment, the device has an interface material overlying the handle substrate surface region. In a specific embodiment, the interface material can be a thin layer of dielectric material, such as silicon dioxide, or metal layer, such as tungsten, aluminum, platinum, titanium, or other types of glue layers. In a specific embodiment, the interface layer is transparent or optically transparent such as indium tin oxide, commonly called ITO. Of course, there can be other variations, modifications, and alternatives.

In a specific embodiment, the device includes a layer transferred film overlying the interface material. In a specific embodiment, the layer transferred layer can be a single crystal silicon material, single crystal germanium material, or others. Depending upon the embodiment, the layer can be provided using a layer transfer technique. As merely an example, such layer transfer technique can be those called the Nanocleave™ process of Silicon Genesis Corporation of Santa Clara, Calif., the SmartCut™ process of Soitec SA of France, and the Eltran™ process of Canon Inc. of Tokyo, Japan, any like processes, and others. Of course, there may be other variations, modifications, and alternatives.

Referring again to FIG. 24, the device includes a deposited thickness of single crystal silicon or single crystal germanium material having one or more defects therein. In a specific embodiment, the deposited thickness of single crystal silicon or single crystal germanium has a P+ type material as an electrical contact overlying the layer transferred film and a P-type material as the light absorber region overlying the P+ type material. In a specific embodiment, the P-type material has an overlying amorphous silicon layer, which is an interface layer, and an N+ type material overlying the amorphous silicon material serving as an emitter to form the electrical photovoltaic PN junction of the cell. In a specific embodiment, the N+ type material is also amorphous in characteristic. In a specific embodiment, the deposited layer has a thickness ranging from about 1 µm to about 50 µm but can be others. As shown, electromagnetic radiation from the sun or other energy sources can be provided overlying the P+-type material. Alternatively, electromagnetic radiation can also be provided on a backside surface of the handle substrate, which passes the electromagnetic radiation to overlying photovoltaic regions. Of course, there can be other variations, modifications, and alternatives.

Figure 25:
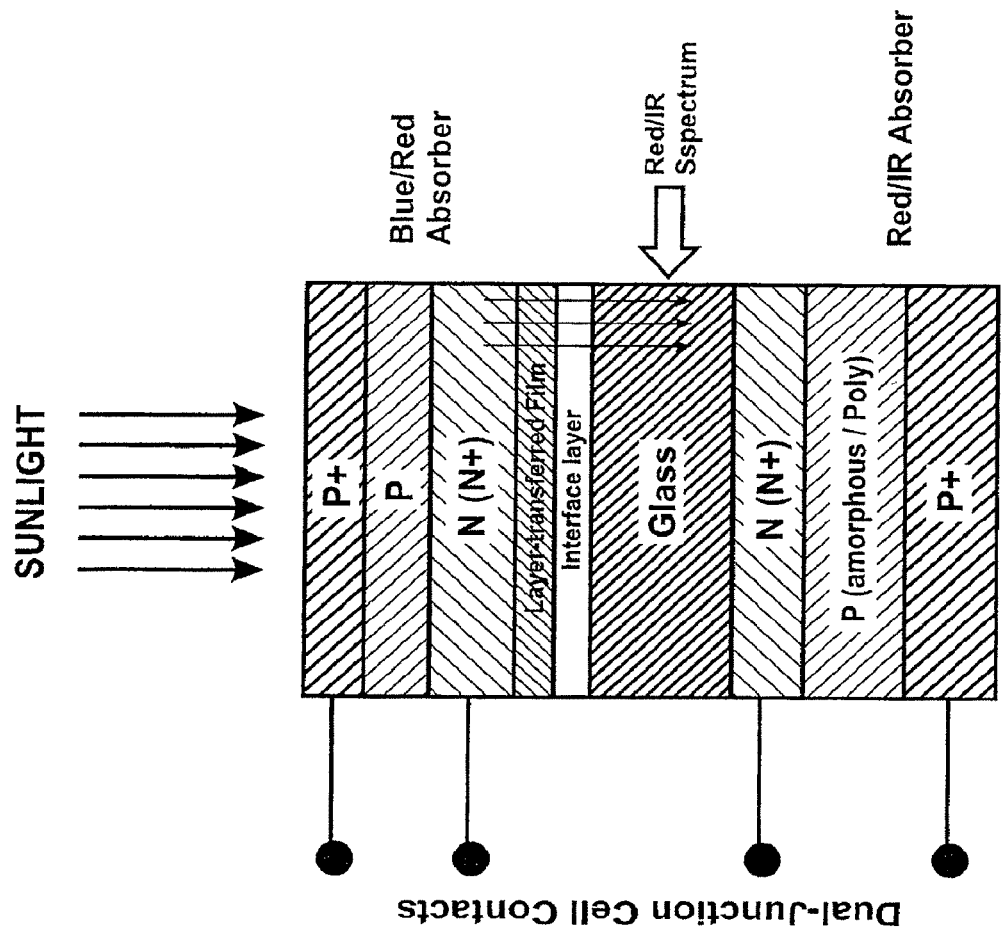
FIG. 25 illustrates a double junction silicon solar cell according to an alternative embodiment of the present invention.

FIG. 25 illustrates a dual junction solar cell device according to an alternative embodiment of the present invention. This diagram is merely an example, which should not unduly limit the scope of the claims herein. One of ordinary skill in the art would recognize other variations, modifications, and alternatives. As shown, the device includes a handle substrate comprising a handle substrate surface region. In a specific embodiment, the handle substrate can be glass, quartz, glass ceramic, or any of the materials described herein as well as outside of the specification as known to one of ordinary skill in the art. In a specific embodiment, the device can have an interface material overlying the handle substrate surface region. In a specific embodiment, the interface material can be a thin layer of dielectric material, such as silicon dioxide, or metal layer, such as tungsten, aluminum, platinum, titanium, or other types of glue layers. In a specific embodiment, the interface layer is transparent or optically transparent such as indium tin oxide, commonly called ITO. Of course, there can be other variations, modifications, and alternatives.

In a specific embodiment, the device has a first thickness of silicon or germanium material layer transferred to the handle substrate surface region of the handle substrate. The device also has a cleaved surface region provided from the first thickness of silicon or germanium material. Depending upon the embodiment, the layer can be provided using a layer transfer technique. As merely an example, such layer transfer technique can be those called the Nanocleave™ process of Silicon Genesis Corporation of Santa Clara, Calif., the SmartCut™ process of Soitec SA of France, and the Eltran™ process of Canon Inc. of Tokyo, Japan, any like processes, and others. Of course, there may be other variations, modifications, and alternatives.

In a specific embodiment, the device also has a deposited first single crystal silicon or germanium material, provided using a process selected from at least glow discharge, plasma, photo-enhanced or thermal CVD and a silane and/or germane species, overlying the cleaved surface to thicken the first thickness of silicon or germanium material. In a specific embodiment, the thickened layer can be composed of a P-type and N-type material or an N-type and P-type material or any other combinations, which form a photovoltaic material. Additionally, the device can also include other combinations of P-type and N-type material to form additional photovoltaic devices overlying a first photovoltaic device according to a specific embodiment.

In a preferred embodiment, the device also has a deposited second material overlying a backside region of the handle substrate to form a poly or amorphous material overlying the backside region of the handle substrate. In a preferred embodiment, the handle substrate is loaded into a batch reactor, which allows for each of the sides of the handle substrate to be exposed. As single crystal material forms on the layer transferred single crystal material, an amorphous or polycrystalline material forms on a backside of the handle substrate according to a specific embodiment. Alternatively, a second layer transferred single crystal material can be provided on the backside of the handle substrate according to a specific embodiment. Such second layer can serve as a seed material for a second single crystal material formed overlying the second layer transferred onto the backside of the handle substrate. Of course, there can be other variations, modifications, and alternatives.

Figure 26:
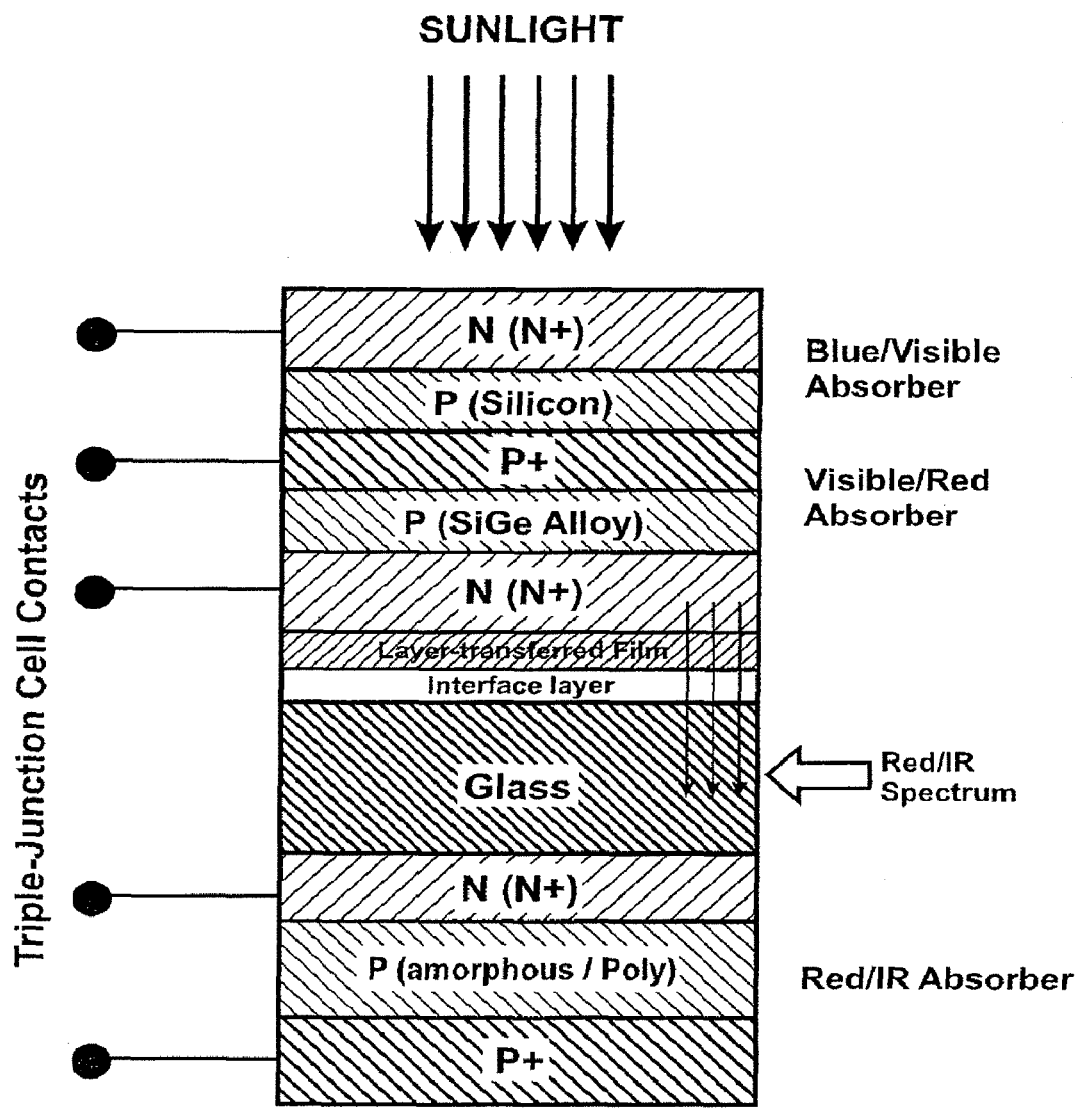
FIG. 26 illustrates a triple junction silicon solar cell according to an alternative embodiment of the present invention.

FIG. 26 illustrates a triple junction solar cell according to an alternative embodiment of the present invention. This diagram is merely an example, which should not unduly limit the scope of the claims herein. One of ordinary skill in the art would recognize other variations, modifications, and alternatives. As shown, the device includes a handle substrate comprising a handle substrate surface region. In a specific embodiment, the handle substrate can be glass, quartz, glass ceramic, or any of the materials described herein as well as outside of the specification as known to one of ordinary skill in the art. In a specific embodiment, the device can have an interface material overlying the handle substrate surface region. In a specific embodiment, the interface material can be a thin layer of dielectric material, such as silicon dioxide, or metal layer, such as tungsten, aluminum, platinum, titanium, or other types of glue layers. In a specific embodiment, the interface layer is transparent or optically transparent such as indium tin oxide, commonly called ITO. Of course, there can be other variations, modifications, and alternatives.

In a specific embodiment, the device has a first thickness of silicon or germanium material layer transferred to the handle substrate surface region of the handle substrate. The device also has a cleaved surface region provided from the first thickness of silicon or germanium material. Depending upon the embodiment, the layer can be provided using a layer transfer technique. As merely an example, such layer transfer technique can be those called the Nanocleave™ process of Silicon Genesis Corporation of Santa Clara, Calif., the Smart-Cut™ process of Soitec SA of France, and the Eltran™ process of Canon Inc. of Tokyo, Japan, any like processes, and others. Of course, there may be other variations, modifications, and alternatives.

In a specific embodiment, the device also has a deposited first single crystal silicon or germanium material, provided using a process selected from at least glow discharge, plasma, photo-enhanced or thermal CVD and a silane and/or germane species, overlying the cleaved surface to thicken the first thickness of silicon or germanium material. In a specific embodiment, the thickened layer can be composed of a P-type and N-type material or an N-type and P-type material or any other combinations, which form a photovoltaic material. Additionally, the device can also include other combinations of P-type and N-type material to form additional photovoltaic devices overlying a first photovoltaic device according to a specific embodiment. In a preferred embodiment, as shown, the device includes a second photovoltaic device overlying the first photovoltaic device.

In a specific embodiment, the device also has a deposited second material overlying a backside region of the handle substrate to form a poly or amorphous material overlying the backside region of the handle substrate. In a preferred embodiment, the handle substrate is loaded into a batch reactor, which allows for each of the sides of the handle substrate to be exposed. As single crystal material forms on the layer transferred single crystal material, an amorphous or polycrystalline material forms on a backside of the handle substrate according to a specific embodiment. Alternatively, a second layer transferred single crystal material can be provided on the backside of the handle substrate according to a specific embodiment. Such second layer can serve as a seed material for a second single crystal material formed overlying the second layer transferred onto the backside of the handle substrate. In further embodiments, the device can include other combinations of photovoltaic devices overlying the backside of the handle substrate. Of course, there can be other variations, modifications, and alternatives.

As noted and further described herein, the devices illustrate a benefit of using a batch furnace deposition process that can deposit both side of the handle substrate simultaneously. In FIGS. 25 and 26, the top of the handle substrate grows single-crystal SiGe alloy and a top silicon thickness to develop a dual junction solar cell where the top silicon cell is the highest band-gap cell for maximizing efficiency in converting the blue and visible spectrum while the smaller band-gap SiGe junction then efficiently absorbs the longer wavelengths towards the infrared (IR) portion of the spectrum.

In a specific embodiment, the device has a concurrent backside layer simultaneously deposited on the backside of the glass. Since there was no single-crystal layer-transferred film template and therefore no ability to re-grow in a single-crystal manner, the material is amorphous or polycrystalline in structure. This feature can be advantageously utilized since it is well known that amorphous phases of silicon and silicon-germanium alloys is more absorbing in the infrared. This backside junction can therefore serve as an efficient additional collection junction to absorb the residual IR spectrum not absorbed by the first two junctions. The light passes through the glass and is absorbed by this bottom junction. Electrical connection of the cells can be externally connected in either independently, in series or in parallel connection to yield an overall triple junction photovoltaic cell. The combined effect of this configuration can be to improve the available net conversion efficiency from 18-24% achievable with a silicon single junction cell to 25-35% or more. The deposition of III-V or II-VI alloys are also possible to create a multi junction high efficiency solar cell. Of course, there can be other variations, modifications, and alternatives.

In alternative embodiments, the device can also include interconnect regions and/or other features. As an example, via structures can be formed in the handle substrate to interconnect a first photovoltaic device formed on a first side to a second photovoltaic device formed on a second side of the handle substrate. In a specific embodiment, the via structures can be grooves or openings within the handle substrate. Such grooves and/or openings are filled with a conductive material to electrically connect a first electrode member of the first photovoltaic device with a first electrode member of the second photovoltaic device according to a specific embodiment. In other embodiments, each of the photovoltaic devices can be coupled to each other electrically by a connection device coupled to a peripheral region of each of the photovoltaic devices. For example, the peripheral connection can be made with a wraparound deposition to contact the two inner junction contacts together. In yet other embodiments, the device can include a combination of via structures and peripheral connections. Of course, there can be other variations, modifications, and alternatives.

In a specific embodiment, the present invention provides a method of fabricating substrates for photovoltaic materials, e.g., solar cells. The method includes providing a donor substrate, e.g., single crystal silicon substrate, single crystal germanium substrate, silicon germanium substrate, and others. In a preferred embodiment, the donor substrate includes a cleave region, a surface region, and a first thickness of silicon material defined between the cleave region and the surface region. The method includes transferring the first thickness of silicon material to a handle substrate surface region of a handle substrate to detach a portion of the donor substrate within a vicinity of the cleave region. The method couples (e.g., joins or bonds) the surface region to the handle substrate surface region of the handle substrate to cause formation of a cleaved surface region overlying the first thickness of silicon material. The method includes supplying a gas including a silane species into a reaction chamber, such as an electron cyclotron resonance ("ECR") plasma deposition system or other suitable plasma based systems. In a preferred embodiment, the method uses the silane species within the reaction chamber. As an example, the method reacts a gas including a silane species to cause deposition using one or more of gas reaction techniques including plasma enhanced chemical vapor deposition, commonly called PECVD, low energy plasma enhanced chemical vapor deposition, commonly called LE-PECVD, and others. As used in the present specification, the term "PECVD" should be construed by ordinary meaning and will include, without limitation, inductively coupled plasma deposition, capacitively coupled plasma deposition, and others. The method includes forming a second thickness of material, using the silane species, overlying the first thickness of silicon material. Depending upon the embodiment, the method includes treating the second thickness of material with a thermal treatment process to crystallize the second thickness of silicon material. Depending upon the embodiment, other silane species could also be used. In a specific embodiment, selection of the particular silane species depends on a desired or allowable temperature, pressure, and dilution of the silane species during deposition, achievable deposition rate at these conditions, and the resultant deposited film quality. In a specific embodiment, the method uses monosilane SiH4 gas mixed with H2 (hydrogen) gas at a suitable dilution rate. In yet another specific embodiment, the method uses monosilane SiH4 gas mixed with H2 and Helium gas at a suitable dilution rate. Of course, there can be other variations, modifications, and alternatives.

Numerous benefits are achieved over pre-existing techniques using the present invention. In particular, the present invention uses controlled energy and selected conditions to preferentially cleave a thin photovoltaic film onto a glass substrate according to a specific embodiment. In a specific embodiment, the present method and device provides a very high quality photovoltaic material on glass, which can be used as a portion of the packaging material. In a preferred embodiment, the present method and structure provide for single crystal silicon for providing efficient power using photovoltaic cells. Additionally, the present method provides for a high growth rate thickening process, which has desirable thermal features according to a specific embodiment. That is, the method can provide for deposition of material, which can be crystal or crystallized, without damaging a glass handle substrate material according to a specific embodiment. In other embodiments, the method allows for formation of photovoltaic materials on a front-side and back-side of a substrate member. Depending upon the embodiment, one or more of these benefits may be achieved. These and other benefits may be described throughout the present specification and more particularly below.

In conclusion, an embodiment of a method in accordance with the present invention for fabricating substrates for photovoltaic materials, includes providing a donor substrate, which has a cleave region, a surface region, and a first thickness of crystalline material (e.g., single crystal silicon, single crystal germanium, silicon germanium) defined between the cleave region and the surface region. As an example, the method includes transferring the first thickness of silicon material to a handle substrate surface region of a handle substrate, e.g., glass, quartz, glass ceramic, optical transparent material. The method detaches a portion of the donor substrate within a vicinity of the cleave region and to couple the surface region to the handle substrate surface region of the handle substrate to cause formation of a cleaved surface region overlying the first thickness of silicon material. The method includes reacting a gas including a silane species to form a deposition using one or more of gas reaction methods including glow discharge, plasma, photo-enhanced or thermal CVD. The method supplies a gas including a silane species into a reaction chamber to form a glow discharge using the silane species in the reaction chamber. In a preferred embodiment, the method includes depositing material using a plasma, glow discharge or thermal CVD including the silane species overlying the cleaved surface to thicken the first thickness of silicon material at a deposition rate equal to or greater than a solid phase epitaxial re-growth rate of the material to crystallize the material overlying the first thickness of silicon material.

An alternative embodiment of a method of fabricating substrates for photovoltaic materials, e.g., solar cells, includes providing a donor substrate, e.g., single crystal silicon substrate, single crystal germanium substrate, silicon germanium substrate, and others. In a preferred embodiment, the donor substrate includes a cleave region, a surface region, and a first thickness of silicon material defined between the cleave region and the surface region. The method includes transferring the first thickness of silicon material to a handle substrate surface region of a handle substrate to detach a portion of the donor substrate within a vicinity of the cleave region. The method couples (e.g., joins or bonds) the surface region to the handle substrate surface region of the handle substrate to cause formation of a cleaved surface region overlying the first thickness of silicon material. The method includes supplying a gas including a silane species into a reaction chamber, such as an electron cyclotron resonance ("ECR") plasma deposition system or other suitable plasma based systems. As an example, the method reacts a gas including a silane species to cause deposition using one or more of gas reaction techniques including plasma enhanced chemical vapor deposition, commonly called PECVD and others. The method includes forming a second thickness of material, using the silane species, overlying the first thickness of silicon material.

According to embodiments of the present invention, techniques related to the manufacture of photovoltaic material are provided. More particularly, the invention provides a technique including a method and a structure for multi-layered substrate structures for the fabrication of solar cells devices using layer transfer techniques. But it will be recognized that the invention has a wider range of applicability; it can also be applied to other types of substrates for three-dimensional packaging (e.g., wafer scale) of integrated semiconductor devices, photonic devices, piezoelectronic devices, flat panel displays, microelectromechanical systems ("MEMS"), nanotechnology structures, sensors, actuators, solar cells, biological and biomedical devices, and the like.

Figure 27:
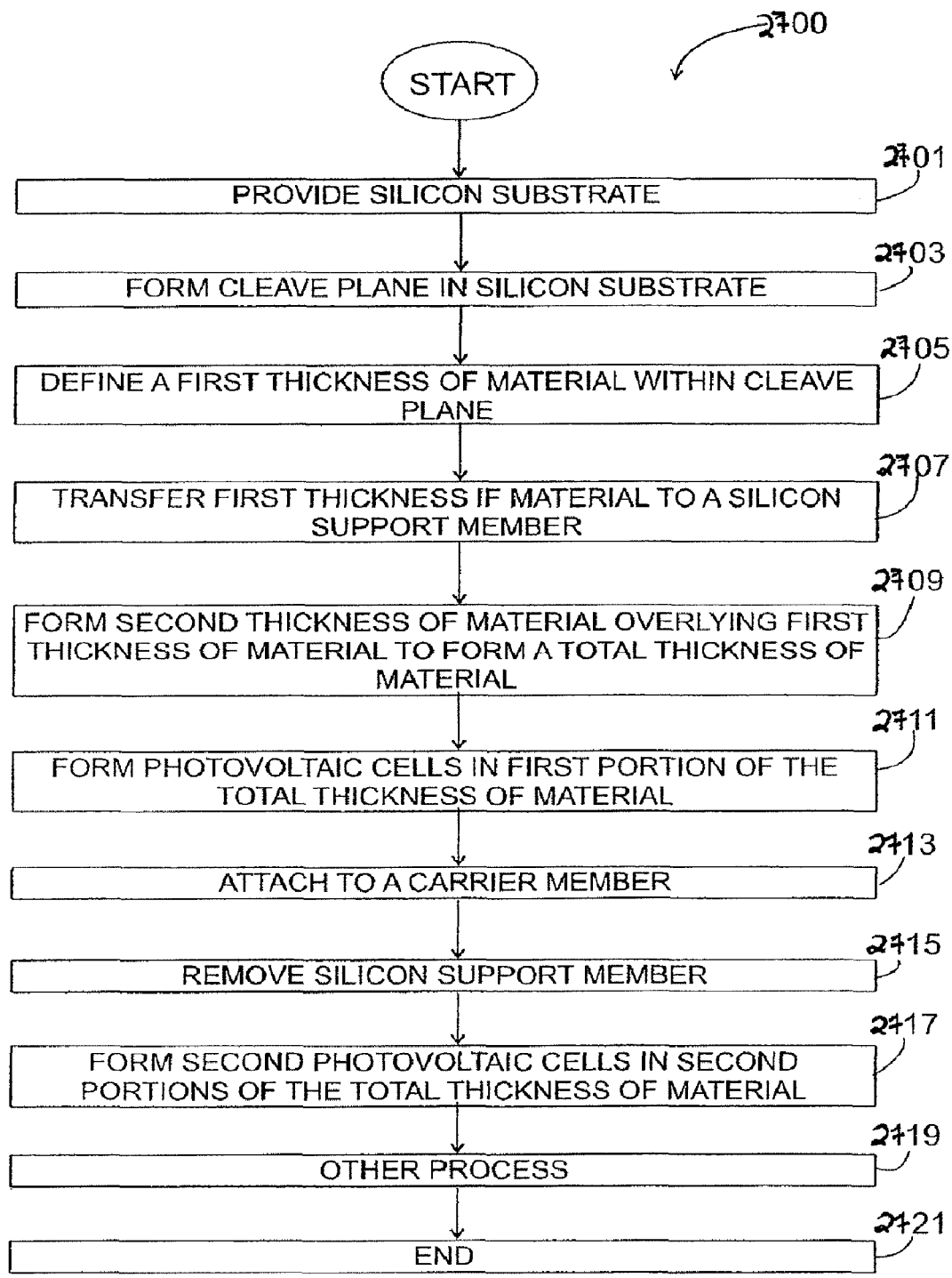
FIG. 27 is a simplified process flow of a method for fabricating solar cells for a solar module using a layer transfer process according to an embodiment of the present invention.
Figure 28:
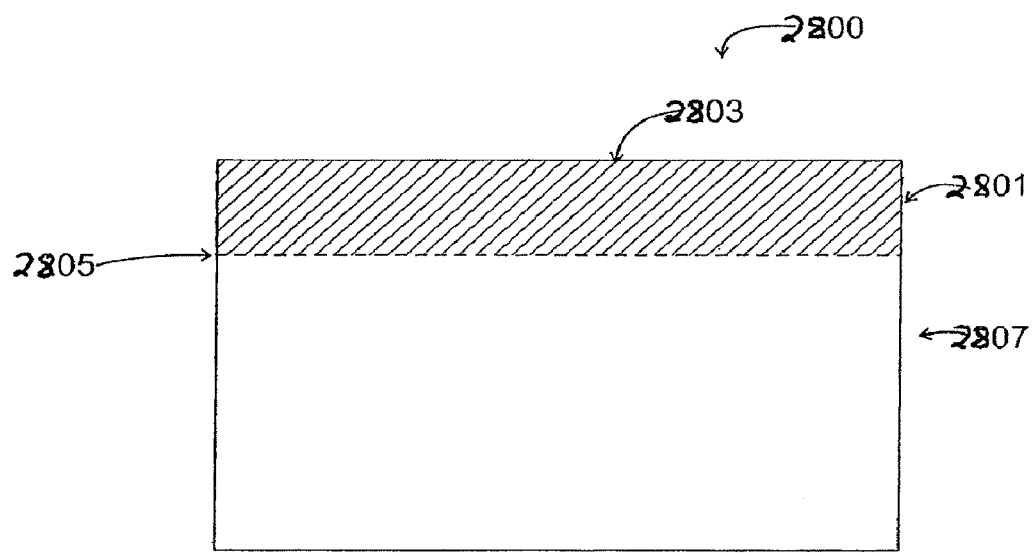
FIGS. 28-38 are simplified diagrams illustrating a method for fabricating solar cells for a solar module using a layer transfer process according to an embodiment of the present invention.

FIG. 27 illustrates a method 2700 for fabricating solar cells for a solar module according to an embodiment of the present invention. The method may be summarized as follow:

1 Provide (step 2701) a semiconductor substrate, e.g., silicon, germanium, a silicon-germanium alloy, gallium arsenide, any Group III/V materials, and others;

2. Form a cleave plane (step 2703) (including a plurality of particles, deposited material, or any combination of these, and the like) to define a first thickness of silicon material (step 2705);

3. Transfer the first thickness of material to a releasable material overlying a silicon support member (step 2707);

4. Form a second thickness of material overlying the first thickness of material to form a total thickness of material overlying the releasable of material (step 2709);

5. Form a first photovoltaic cell surface in first portions (e.g., first side) of the total thickness of material (step 2711);

6. Form a surface region overlying the first photovoltaic cell surface;

7. Attach to a carrier member (step 2713) to the surface region of the first photovoltaic cell surface;

7. Remove the silicon support member including the releasable material (step 2715) to expose second portions of the total thickness of material;

8. Form a second photovoltaic cell surface in second portions (e.g., second side) of the total thickness of material (step 2717);

9. Perform other processes (step 2719);

10. Form solar modules (step 2721), and

11. Stop.

The above sequence of steps provides a method to fabricate photovoltaic cells in a semiconductor substrate according to an embodiment of the present invention. As shown, the method uses a combination of steps including a way of forming photovoltaic cells for further processing into solar modules. In a specific embodiment, a support member substrate provides a releasable substrate for a thickness of semiconductor material. Preferably, the support member is a thin substrate that remains on the total thickness of semiconductor material throughout the processing. The support member is re-usable in a specific embodiment. A donor substrate may be selectively removed and/or cleaved while the thickness of semiconductor material is transferred to another substrate structure, e.g., the support member, according to a specific embodiment. Other alternatives can also be provided where steps are added, one or more steps are removed, or one or more steps are provided in a different sequence without departing from the scope of the claims herein. Further details of the present method can be found throughout the present specification and more particularly below.

FIGS. 28 through 39 illustrate a simplified method for fabricating photovoltaic cells in a layer transferred substrate according to embodiments of the present invention. These diagram are merely examples that should not unduly limit the scope of the claims herein. One of ordinary skill in the art would recognize other variations, modifications, and alternatives. As shown the method includes providing a semiconductor substrate 200 or donor substrate member. Examples of the semiconductor substrate may include silicon, germanium, alloys such as silicon germanium, III-V materials such as gallium arsenide and the like. Depending on the embodiment, the semiconductor substrate may be made of single material, or a combination of various layers. Of course there can be other variations, modifications, and alternatives.

In a specific embodiment, the semiconductor substrate includes a first thickness of material 281 and a surface region 2803. In a preferred embodiment, the semiconductor substrate also includes a cleave region 2805, which defines the thickness of semiconductor material within a thickness 2807 of the semiconductor substrate. The first thickness of material may include a plurality of particles, deposited material, or any combination of these, and the like. In a specific embodiment, the thickness of semiconductor material is crystalline silicon (e.g., single crystal silicon), which can include an overlying epitaxial silicon layer. In a specific embodiment, the silicon surface region 2803 may have a thin layer of oxide such as silicon dioxide. Of course, there can be other variations, modifications, and alternatives.

Depending upon the embodiment, the cleave region can be formed using a variety of techniques. That is, the cleave region can be formed using any suitable combination of implanted particles, deposited layers, diffused materials, patterned regions, and other techniques. In a specific embodiment, the method introduces certain energetic particles using an implant process through a top surface of the semiconductor substrate, which can be termed a donor substrate, to a selected depth, which defines the thickness of the semiconductor material region, termed the "thin film" of material. A variety of techniques can be used to implant the energetic particles into a single crystal silicon wafer according to a specific embodiment. These techniques include ion implantation using, for example, beam line ion implantation equipment manufactured from companies such as Applied Materials, Inc. and others. Alternatively, implantation occurs using a plasma immersion ion implantation ("PIII") technique, ion shower, and other mass and non-mass specific techniques can be particularly effective for larger surface regions according to a specific embodiment. Combination of such techniques may also be used. Of course, techniques used depend upon the application.

Depending upon the application, smaller mass particles are generally selected to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $10^{15}$ to about $10^{18}$ atoms/cm$^2$, and preferably the dose is greater than about $10^{16}$ atoms/cm$^2$. Implantation energy ranges from about 1 KeV to about 1 MeV, and is generally about 50 KeV. Implantation temperature ranges from about −20 to about 600 Degrees Celsius, and is preferably less than about 400 Degrees Celsius to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about ±0.03 to ±0.05 microns. Of course, the type of ion used and process conditions depend upon the application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically at least partially be repaired by subsequent heat treatment, e.g., thermal annealing or rapid thermal annealing. Of course, there can be other variations, modifications, and alternatives.

Figure 29:
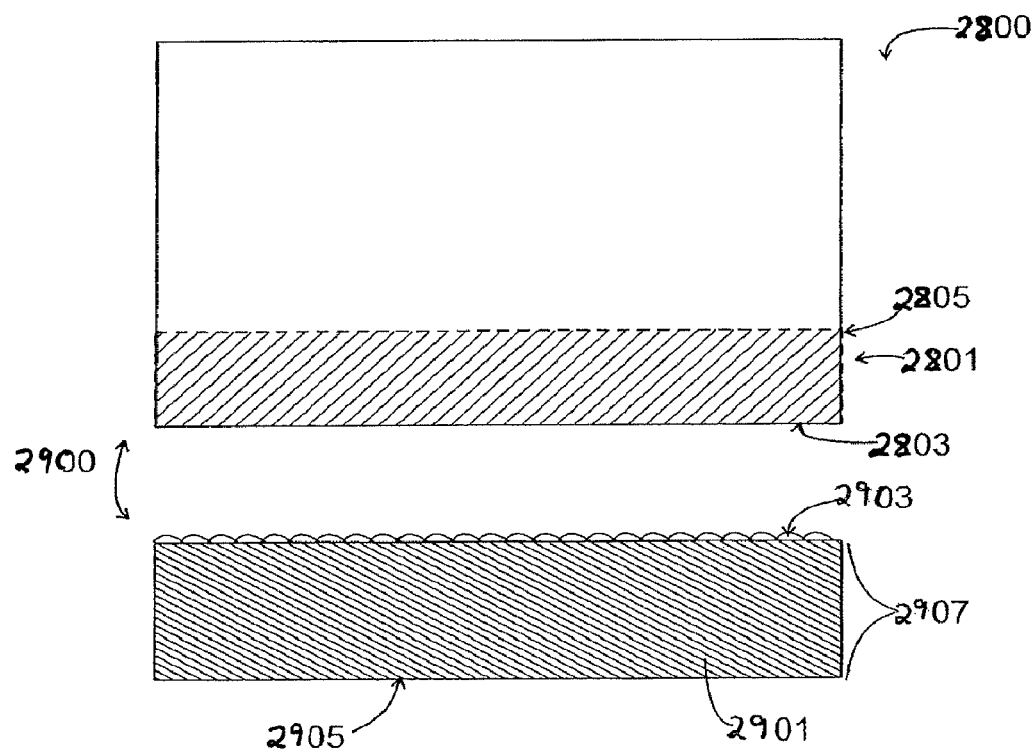

Referring to FIG. 29, the method joins (2900) the surface region of the semiconductor substrate to a support member substrate 2901. In a specific embodiment, the support member substrate can be made from a suitable material. In a preferred embodiment, the support member can be made of a similar material as the thickness of material, which is substantially crystalline to match thermal and structural characteristics. That is, the support member substrate can be made of a silicon wafer such as a single silicon wafer, an epitaxial wafer or a layer transferred silicon (e.g., a layer transferred silicon on insulator substrates) according to a specific embodiment. In alternative embodiments, the support member can also be formed of multi-layers, composites, or other materials. Additionally, the support member can also be formed of a dielectric material (e.g., glass, quartz) or metal materials, including any combination of these, and others according to a specific embodiment. Of course there can be other modifications, variations, and alternatives.

As shown, the support member has a surface region 2903, a bottom portion 2905, and a determined thickness 2907. In a preferred embodiment, the surface region of the support member is characterized by a bondable but releasable material. In a preferred embodiment, the surface region is characterized by a low surface roughness but a higher underlying surface material to surface material roughness, which facilities bonding but is also releasable under other conditions. In a specific embodiment, the term "low" should be interpreted by a meaning consistent with one or ordinary skill in the art to achieve the desired function described herein. In yet another preferred embodiment, the surface region is characterized by a surface roughness, which facilities bonding but is also releasable under other conditions. In this specific embodiment, the surface roughness is provided on an oxide material overlying a silicon support member. The oxide material has a surface roughness ranging from about 3 Angstroms RMS to about 100 Angstroms RMS. These and other roughness points are to be understood as being measured using an Atomic Force Microscope (AFM) with a measurement area of about 10 microns by 10 microns. In yet another embodiment, the silicon surface roughness can be of the range mentioned above while the oxide surface has a smoother surface to allow for a more complete bond surface. Of course, there can be other variations, modifications, and alternatives.

In alternative embodiments, the surface roughness may be provided by a porous material. As an example, the porous material can be silicon that is porous and has an average pore size of about 10-1000 nm and less. Other types of porous materials can also be used. In still other embodiments, the releasable material can be a glue layer, which is releasable, or other types of materials having intrinsic and/or spatial characteristics that facilitate bonding but is releasable. Another releasable material can be a material in which a high temperature process such as during the epitaxial growth process step can reduce the bonding energy by a phase change or material change within the release layer, thereby allowing the low-temperature layer-transfer to occur, yet making a post-epitaxial release of the support member. In a specific embodiment, the surface region of the support member will be joined or bonded with the surface region 203 provided on the donor substrate 200. Like reference numerals are used in this figure and others, but not intended to be limiting the scope of the claims herein. Further details of the joining or bonding process can be found throughout the present specific specification and more particularly below.

In a specific embodiment, the bonding process occurs by joining the surfaces of donor substrate and the support member substrate after an optional plasma activation process. The optional plasma activation process depends on the substrates used. Such plasma activation process may clean or activate the surface regions of the substrates. In silicon substrate as an example, the plasma activation process may be provided, for example, using a nitrogen bearing plasma at temperatures ranging from 20° C. to 40° C. Preferably the plasma activation process is carried in a dual frequency plasma activation system manufactured by Silicon Genesis Corporation of San Jose, Calif. Of course there can be other variations, modification and alternatives, which have been described herein, as well as outside of the present specification.

Figure 30:
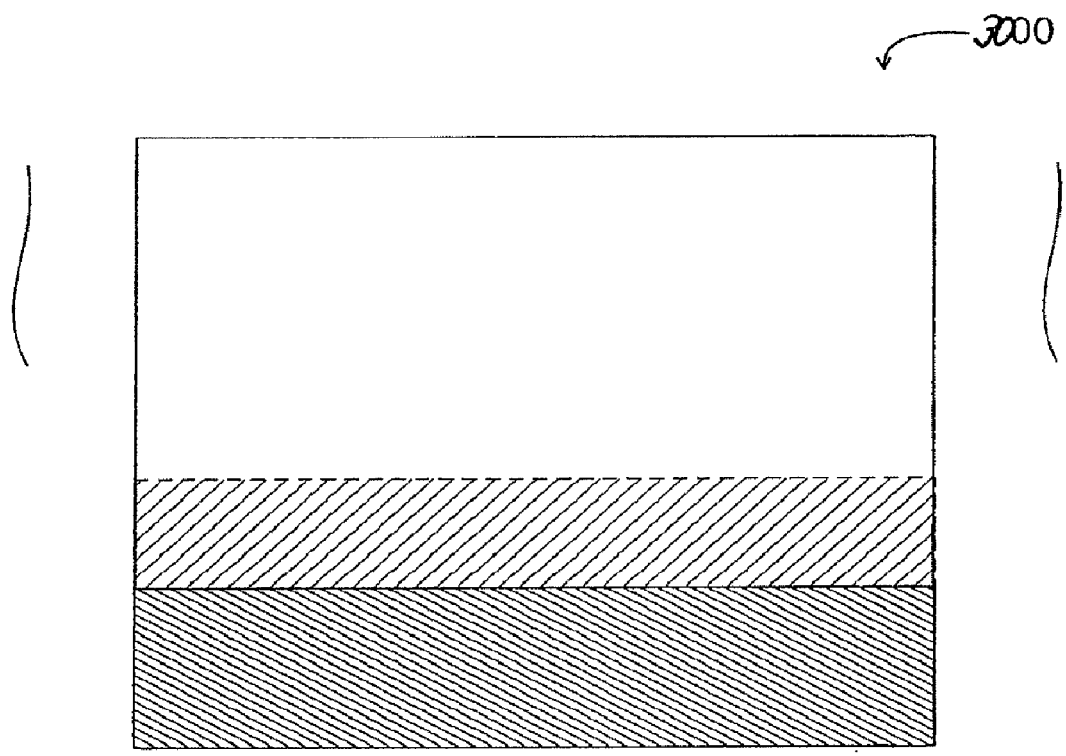

Each of these substrates are bonded together to form a bonded substrate structure 400 as shown in FIG. 30 according to a preferred embodiment. As shown, the donor substrate has been bonded to the support member substrate. Preferably, the substrates are bonded using an EVG 850 bonding tool manufactured by Electronic Vision Group or other like processes for substrate sizes such as 200 mm or 300 mm diameter wafers. Other types of tools such as those manufactured by Karl Suss may also be used. Of course, there can be other variations, modifications, and alternatives. Preferably, bonding between the support member substrate and the donor substrate is temporary but reliable enough for performing one or more high temperature processing steps, but can be released during a subsequent step, which will be described further below. That is, the bonding is temporary and can be released. Of course, there can be other variations, modifications, and alternatives.

Accordingly, after bonding, the bonded substrate structure is subjected to a first thermal treatment according to a specific embodiment. The first thermal treatment may be a bake treatment using heating elements such as a thermal plate coupled to the handle substrate in a specific embodiment. In an alternative embodiment, the first thermal treatment may be a bake treatment using heating elements such as a thermal plate coupled to the donor substrate. The first thermal treatment provides a temperature gradient through a portion of a thickness of the donor substrate and a portion of the handle substrate. Additionally, the first thermal treatment maintains the bonded substrate structures at a predetermined temperature and for a predetermined time. Preferably, the temperature ranges from about 200 or 250 Degrees Celsius to about 400 Degrees Celsius and is preferably about 350 Degrees Celsius for about 1 hour or so for a silicon donor substrate and the support member substrate to attach to each other according to the preferred embodiment. Depending upon the specific application, there can be other variations, modifications, and alternatives.

In a specific embodiment, the substrates are joined or fused together using a low temperature thermal step. The low temperature thermal process generally ensures that the implanted particles do not place excessive stress on the material region, which can produce an uncontrolled cleave action. In a specific embodiment, the low temperature bonding process occurs by a self-bonding process. Alternatively, a variety of other low temperature techniques can be used to join the donor substrate surface regions to the support member substrate. For instance, an electro-static bonding technique can be used to join the two substrates together. In particular, one or both substrate surface(s) is charged to attract to the other substrate surface. Additionally, the donor substrate surface can be fused to the support member substrate using a variety of other commonly known techniques. Of course, the technique used depends upon the application.

Figure 31:
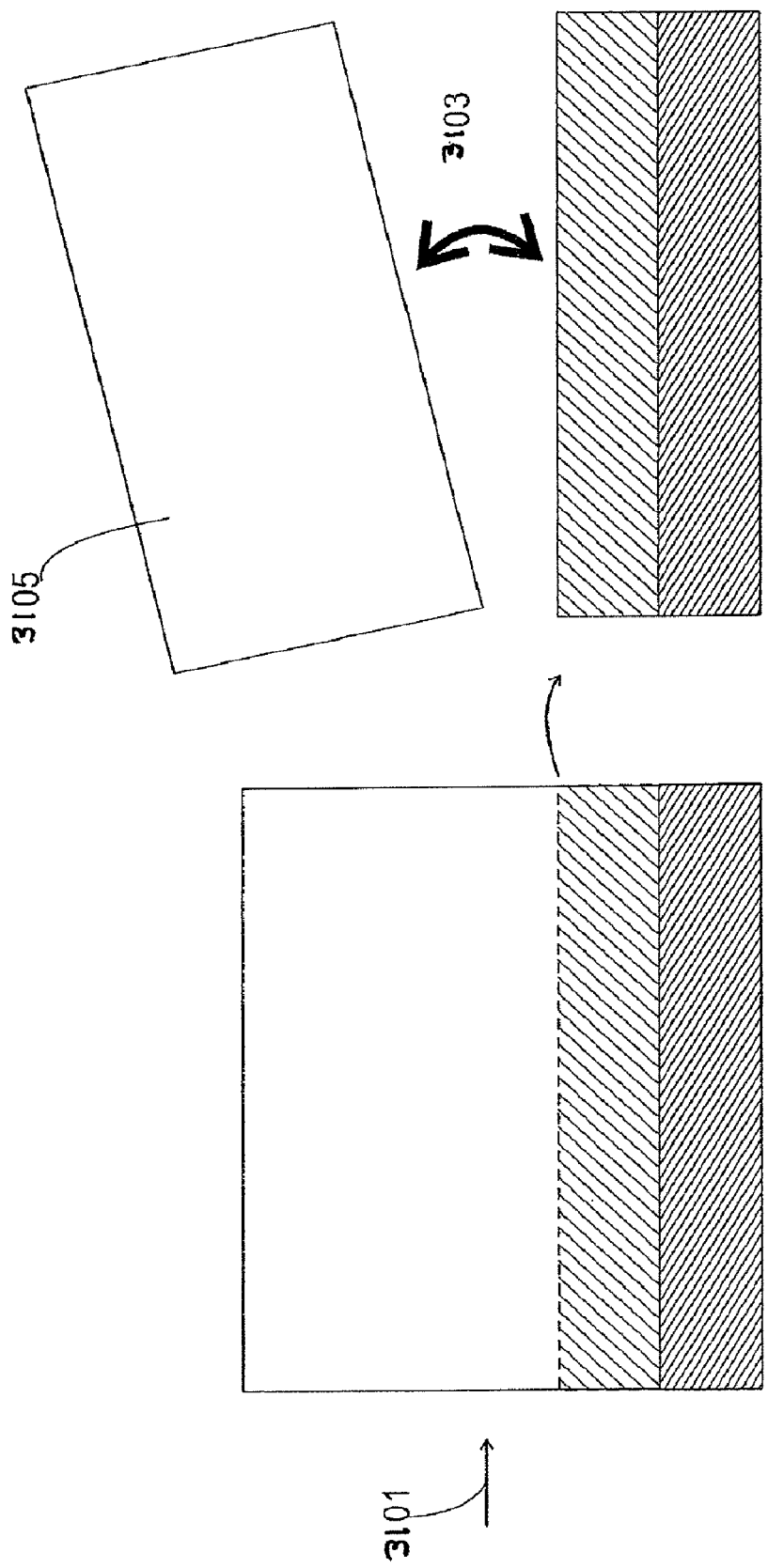

Referring to FIG. 31, the method includes initiating a cleaving process using energy 3101 provided in a selected portion of the cleave plane to detach 3103 the first thickness of semiconductor material from the donor substrate, while the first thickness of semiconductor material remains joined to the support member substrate. Depending on the specific embodiment, there can be certain other variations. For example, the cleaving process can be a controlled cleaving process using a propagating cleave front to selectively free the thickness of material from the donor while the thickness of material remained joined to the support member substrate. Alternative cleaving techniques can also be used. Such techniques include but not limited to those called a Nanocleave™ process of Silicon Genesis Corporation of San Jose, Calif., a thermal release such as used by the SmartCut™ process of Soitec SA of France, and a porous silicon cleaving layer such as used by the Eltran™ process of Canon Inc. of Tokyo, Japan, any like processes, and others. The method then removes remaining portion of the donor substrate, which has provided the first thickness of material to the support member substrate according to a specific embodiment. The remaining portion of the donor substrate 3105 may be used as another donor substrate according to a preferred embodiment.

Figure 32:
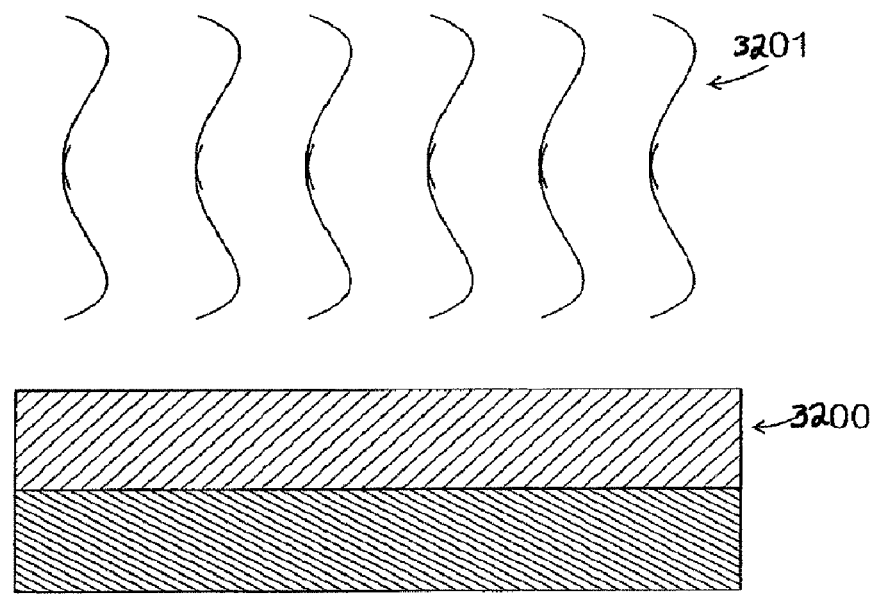

As shown in FIG. 32, the method provides a resulting bonding structure 3200. The resulting bonding structure includes an overlying thickness of semiconductor material. In a specific embodiment, the method subjects the resulting bonding structure to a bonding process to form a substantially permanent bond between the thickness of semiconductor material and the semiconductor support member for subsequent processing, but is also releasable. In a preferred embodiment, the bonding process includes a thermal treatment. The thermal treatment can be a suitable rapid thermal process, rapid thermal process using laser irradiation, or the like. In a specific embodiment, the thermal treatment includes irradiating the resulting bonding structure using a light source (e.g., monochromatic, flash lamp, or other suitable source). Of course, there can be other variations, modifications, and alternatives.

As shown in FIG. 32, the method also subjects the resulting bonding structure to a surface preparation process 3201. Such surface preparation process may include plasma activation or a plasma cleaning, an etch step, a polishing step or a combination in certain embodiments. In a specific embodiment, the surface preparation provides for a desired surface characteristic to thickening the layer transferred material using a deposition and/or forming process. For example, the post-cleave surface may have a layer of limited roughness with some defective material that should be removed to optimize and/or improve the epitaxial film quality. Of course, there can be other variations, modifications, and alternatives.

Figure 33:
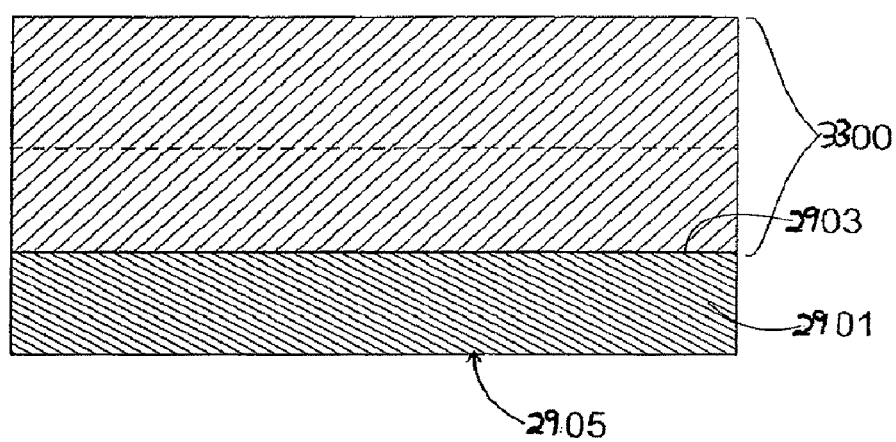

Referring to FIG. 33, the method includes forming a thickened surface layer overlying the first thickness of semiconductor material to form a total thickness of material 3300. In a specific embodiment, the thickened surface layer may be formed using an epitaxial process and/or other deposition processes. These processes can include plasma-enhanced CVD (PECVD), thermal CVD, photocatalyzed CVD, glow discharge CVD, Hot-wire/catalytic CVD, and others. These processes can form a suitable single crystal silicon or like material either directly or in combination with other steps such as anneals according to specific embodiments. As merely an example, the material can be single-crystal silicon, amorphous silicon, polycrystalline silicon, germanium and silicon germanium alloy. For example, amorphous silicon could advantageously allow for solid-phase epitaxial growth of single-crystal silicon using the underlying transferred thickness of silicon material as a template. Another method that can increase the effective rate of silicon material deposition is to spray or coat the surface with silicon nanoparticles (advantageously amorphous silicon) which can be thermally treated to produce single-crystal silicon using the underlying transferred thickness of silicon material as a template. This can be applied dry or using a liquid that would be eliminated during subsequent processing. Polycrystalline silicon and other materials may also allow single-crystal regrowth through a rapid-thermal anneal liquid phase step using appropriate treatments such as laser anneals, flash thermal treatments and the like. Other epitaxial processes such as PECVD or thermal CVD could be used to grow single-crystal silicon directly onto the layer-transferred silicon film. In a specific embodiment, the thickened surface layer, including the transferred thickness of silicon material may range from about 50 µm to about 200 µm. In other embodiments, the thickened material can be provided using a tri-silane species, such as those described in U.S. Provisional No. 60/822,473, commonly assigned, and hereby incorporated by reference for all purposes. Of course, there can be other variations, modifications, and alternatives.

In a specific embodiment, the transferred material is thickened using an amorphous silicon layer to form a thickened material layer. In a specific embodiment, the amorphous silicon layer is deposited using application of nanoparticles (e.g., amorphous silicon, crystalline silicon, polysilicon, or combinations of these), which are later subjected to a thermal treatment to cause formation of a sheet of thickened material. Alternatively, the amorphous silicon layer can be formed using physical vapor deposition or chemical vapor deposition (e.g., plasma enhanced) at low temperature according to a specific embodiment. In a specific embodiment, the amorphous silicon layer, which has been deposited is maintained at a temperature greater than 800 Degrees Celsius to form crystalline silicon. Preferably the thickened material has a desired coefficient of thermal expansion match with the releasable substrate material. In another specific embodiment, the transferred material is thickened by a high-temperature CVD using silane or a chlorosilane species such as SiCl4, dichlorosilane, or trichlorosilane or other suitable combinations and the like. Of course, there can be other variations, modifications, and alternatives.

Figure 34:
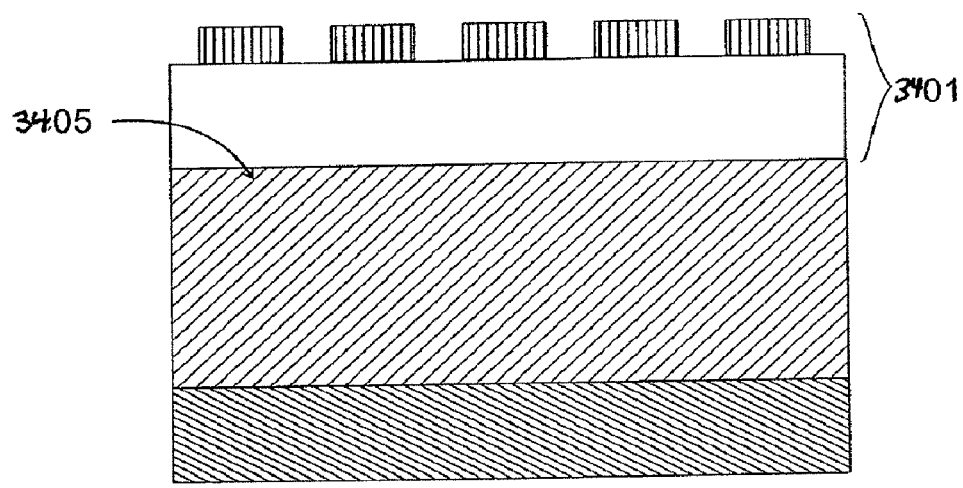

As shown in FIG. 34, depending upon the embodiment, a first portion of total thickness of material layer 3405 can be subjected to impurities to form at least one first photovoltaic cell processed surface. In a specific embodiment, the impurities can be in-situ doped during the thickening step, diffused, and/or implanted using ion beams, plasma immersion implantation, or conventional implantation techniques. The at least one first photovoltaic cell surface comprise impurity regions such as P-type and N-type impurities to provide for a p-n junction or multiple p-n junctions according to a specific embodiment. Of course, there can be other variations, modifications, and alternatives.

As shown in FIG. 34, the method forms a first contact layer 3401 overlying the first portion of the thickened material layer which has at least one first photovoltaic cell surface formed therein. The first contact layer can be made of a suitable transparent conductive material such as ITO and the like. Other materials may also be used. In a preferred embodiment, the contact layer is patterned to form a plurality of electrodes which couples to each of the first photovoltaic cells. If the photovoltaic cell is to be illuminated from the opposite side, the contact can be opaque to transmission and preferably highly reflective to help maximize and/or improve light collection efficiency by allowing a return path through the cell. Texturing the surface to further optimize efficiency is also well known by converting the light from specular to Lambertian within the cell to cause multiple internal reflections with better overall light absorption and conversion. Of course, there can be other variations, modifications, and alternatives.

Figure 35:
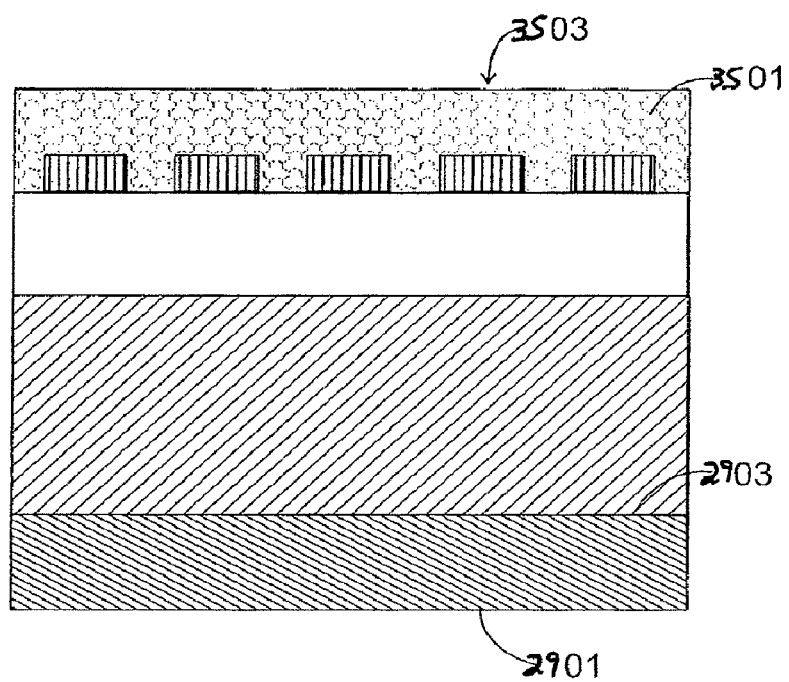

In a specific embodiment, the method also forms a first planarized dielectric layer 3501 having a surface region 3503 overlying the patterned contact layer including the first photovoltaic cells as shown in FIG. 35. The dielectric layer may include material such as silicon dioxide deposited using a CVD process and the like. In a specific embodiment, the dielectric layer is substantially optically transparent to allow for electromagnetic radiation to traverse through the dielectric layer or layers. Of course there can be other variations, modifications, and alternatives.

Figure 36:
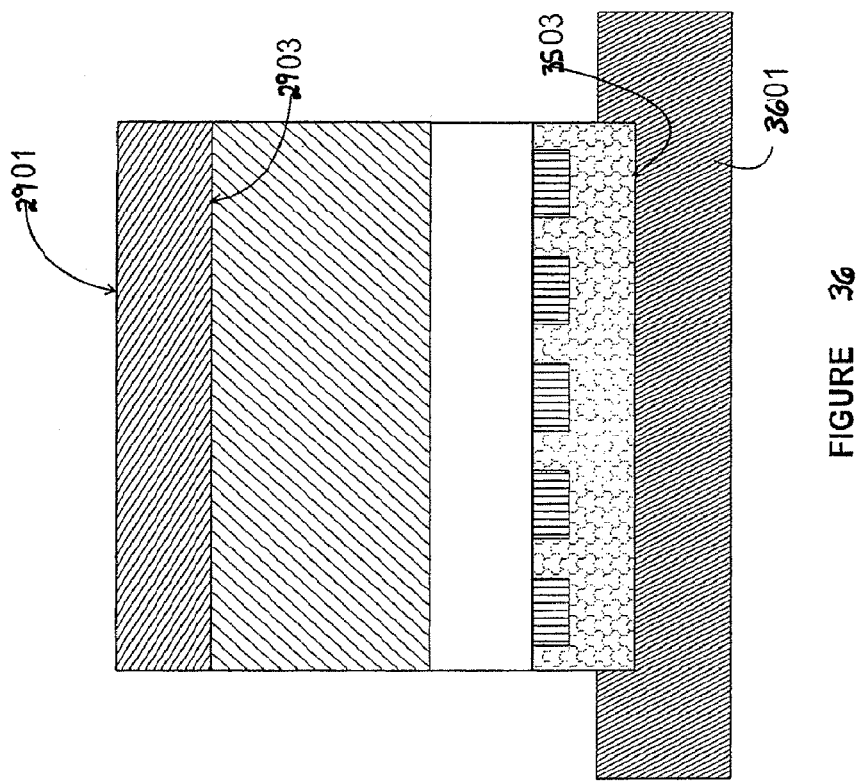

As shown in FIG. 36, the method includes attaching a carrier member 3601 to the surface region of the first dielectric layer. The carrier member may be made of material such as glass, quartz, polymer, or a plastic material in a specific embodiment. In a specific embodiment, the carrier member can be permanently attached and serves as a portion of a package for the photovoltaic material. Alternatively, the carrier member may be temporary and can be detached according to an alternative specific embodiment. Of course there can be other variations, modifications, and alternatives.

Figure 37:
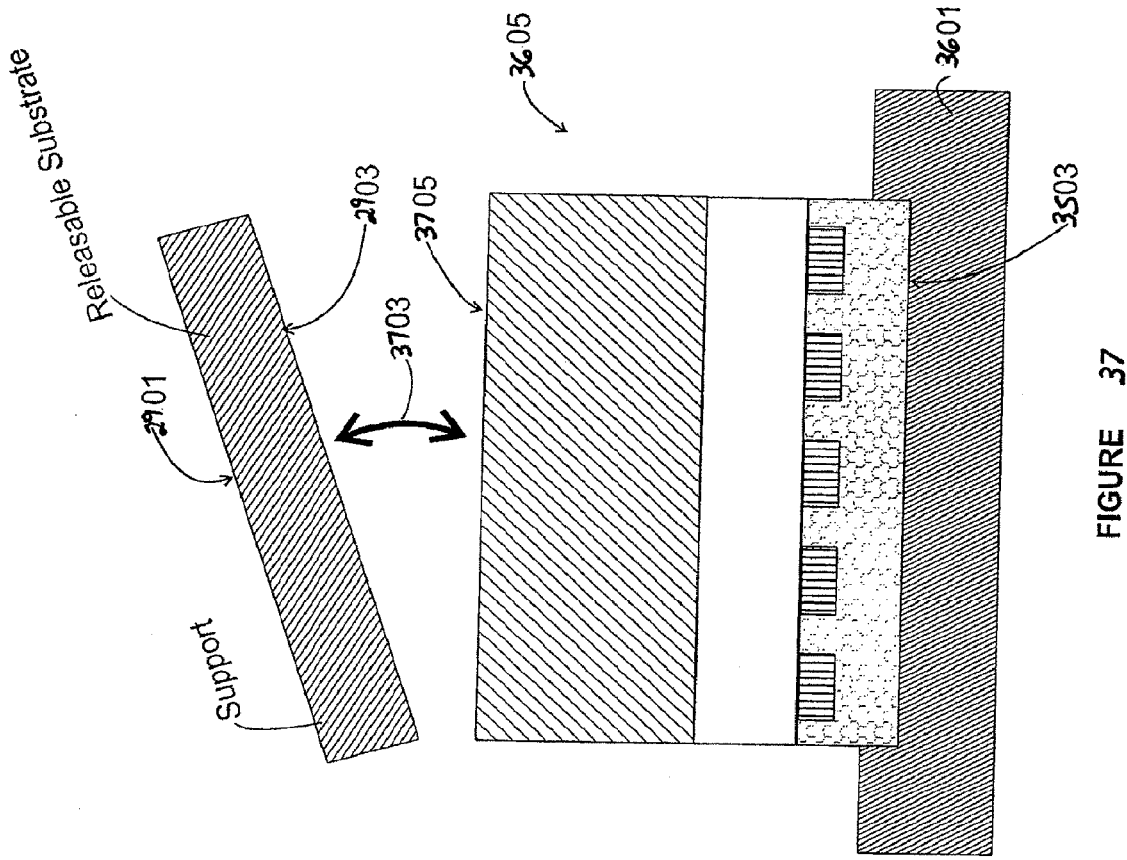

Referring to FIG. 37, the support member substrate is detached 3703 from the total thickness of material to expose a top region 3705 of the total thickness of material according to a specific embodiment. In a specific embodiment, the support member substrate may include an opening region extending from the bottom portion of the support member substrate, through the thickness of the support member substrate, to a portion of the surface region. The opening region can be coupled to a fluidic drive source, e.g., liquid, gas, inert gas. Of course, there can be other variations, modifications, and alternatives.

In a specific embodiment, the fluidic drive source is adapted to be capable of causing a pressure gradient within the opening region between the bottom portion and the portion of the surface region. That is, the pressure gradient facilitates the removal of the total thickness of material from the support member substrate. As merely an example, the pressure gradient can be provided by a fluid such as a liquid, a gas, a vapor, or a combination. In a preferred embodiment, the removal step includes the injection of an etchant fluid that causes the release of the total thickness of material. That is, the fluid can provide mechanical and/or chemical influences to remove the total thickness of material from the support member substrate. In combination with a cyclical pumping of the etchant fluid to replenish fresh etchant into the release layer with a concurrent mechanical separation force, the total thickness of material can be fully separated from the support member substrate. Depending upon the embodiment, the open region can be a single or a plurality of openings, which are mechanical in form and structure. In embodiments using the plurality of openings, the fluid can be provided through a plurality of spatially distributed openings formed in an array, circular, or other symmetric configuration, according to a specific embodiment. Such spatial distribution can facility uniform removal of the total thickness of material, which will be released according to a specific embodiment. In a preferred embodiment, the support member substrate, after being removed is re-usable as a support member substrate. Alternatively, the support member substrate can include a mechanical device, which facilitates removal of an overlying film of material in a specific embodiment. In such embodiment, the mechanical device can include one or more pins, ejectors, or the like. Of course there can be other variations, modifications, and alternatives.

In a specific embodiment, the method also forms at least a second processed photovoltaic cell surface in the total thickness of material. As shown, the exposed top region 3705 of the total thickness of material can be subjected to impurities to form at least the second photovoltaic cell surface. In a specific embodiment, the impurities can be in-situ doped during the thickening step, diffused, and/or implanted using ion beams, plasma immersion implantation, or conventional implantation techniques. Heterojunctions can also be formed to realize the photovoltaic effect. Single-crystal/amorphous silicon heterojunctions are one example. Silicon germanium/silicon heterostructure dual junction cells are another example of a more sophisticated photovoltaic cell that combines multiple bandgap sub-cells to enhance overall light to electricity energy conversion efficiency. The resultant photovoltaic cell can include impurity regions for P-type and N-type impurities according to a specific embodiment. Of course, there can be other variations, modifications, and alternatives.

Figure 38:
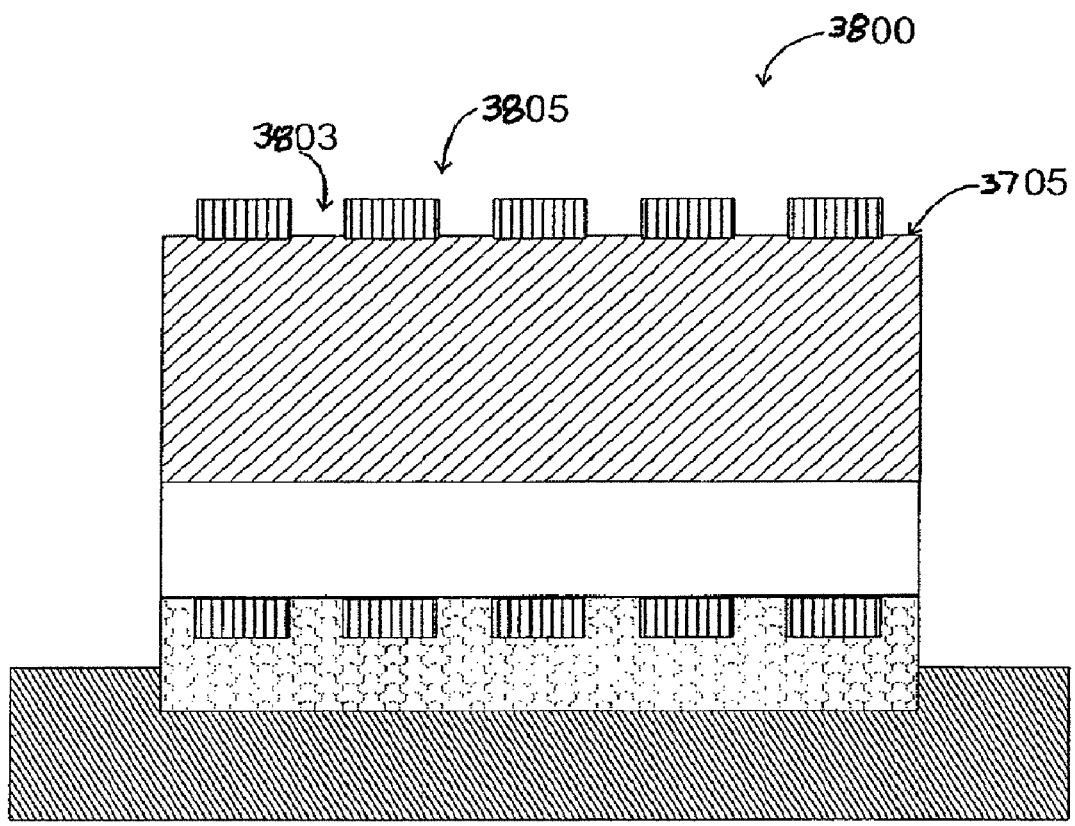

In a specific embodiment, the method includes depositing a second contact layer 3801 overlying the bottom surface of the thickened material layer, which has at least one second photovoltaic cell surface formed therein, as shown in FIG. 38. The second contact layer can be made of a suitable transparent conductive material such as ITO and the like. Other materials may also be used such as a highly reflective material depending on the cell geometry. In a preferred embodiment, the second contact layer is patterned to form a plurality of second electrodes which couple to each of the second photovoltaic cells. In a specific embodiment, the method also forms a second planarized dielectric layer 1203 having a surface region 3805 overlying the second contact layer including the second photovoltaic cells. The second dielectric layer may include material such as silicon dioxide deposited using a CVD process and the like. Of course there can be other variations, modifications, and alternatives.

Also shown in FIG. 38, a simplified diagram of an example of a photovoltaic device 3800 according to an embodiment of the present invention is illustrated. The diagram is merely an illustration and should unduly limit the scope of the claims therein. One of ordinary skill in the art would recognize many variations, modifications, and alternatives. As shown, the photovoltaic device includes at least a first photovoltaic cell surface formed in a first face region and at least a second photovoltaic cell surface formed in a second face region of a semiconductor layer. Preferably, the semiconductor layer is formed using a layer transferred process. Such layer transferred process is described in the present specification and elsewhere. A first contact layer overlies the first photovoltaic cell surface to provide for a plurality of first electrodes which coupled to each of the first photovoltaic cells. A second contact layer overlies the second photovoltaic cell surface in the second face region of the semiconductor layer to provide for a plurality of second electrodes which coupled to each of the second photovoltaic cells. As shown, the photovoltaic device is attached to at least a first carrier element made of suitable transparent materials such as glass, quartz, polymer, or plastic. Of course there can be other variations, modifications, and alternatives.

The above sequence of steps provides a method to fabricate photovoltaic cells in a semiconductor substrate according to an embodiment of the present invention. As shown, the method uses a combination of steps including a way of forming photovoltaic cells for further processing into solar modules. In a specific embodiment, a support member substrate provides a releasable substrate for a thickness of semiconductor material. Preferably, the support member is a thin substrate that remains on the total thickness of semiconductor material throughout the processing. The support member is re-usable in a specific embodiment. A donor substrate may be selectively removed and/or cleaved while the thickness of semiconductor material is transferred to another substrate structure, e.g., the support member, according to a specific embodiment. Other alternatives can also be provided where steps are added, one or more steps are removed, or one or more steps are provided in a different sequence without departing from the scope of the claims herein. Other embodiments of the present invention can be found throughout the present specification and more particularly below.

Figure 39:
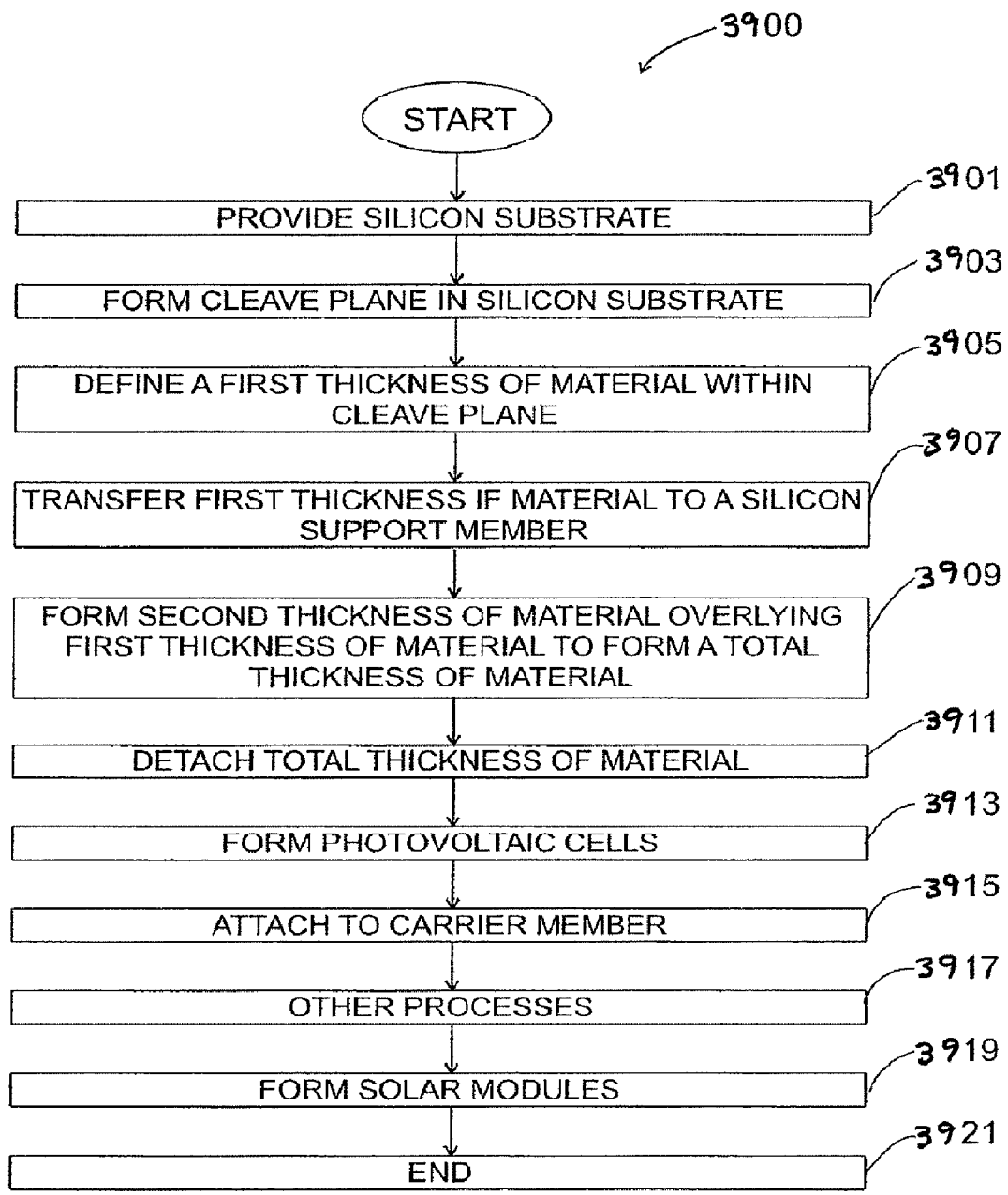
FIG. 39 is simplified process flow of an alternative method for fabricating solar cells for a solar module using a layer transfer process according to an embodiment of the present invention.

FIG. 39 is a simplified diagram exemplifying a method 3900 for fabricating solar cells for a solar module according to an alternative embodiment of the present invention. The method may be summarized as follows:

1. Provide (Step 3901) a semiconductor substrate having a surface region, a bottom region, and a determined thickness of material, the semiconductor substrate can be silicon, germanium, a silicon-germanium alloy, gallium arsenide, any Group III/V materials, and others;
2. Form a cleave plane (Step 3903) (including a plurality of particles, deposited material, or any combination of these, and the like) to define a first thickness of silicon material (Step 3905)
3. Transfer the first thickness of material to a releasable material overlying a silicon support member (Step 3907);
4. Form a second thickness of material overlying the first thickness of material to form a total thickness of material overlying the releasable of material (Step 3909);
5. Detach the total thickness of material (Step 3911);
6. Form photovoltaic cell surfaces in portions of the total thickness of material (Step 3913);
7. Attach the total thickness of material including photovoltaic cells to a carrier member (Step 3915);
8. Perform other processes (Step 3917);
9. Form solar modules (Step 3919), and
10. End.

The above sequence of steps provides a method to fabricate photovoltaic cells in a semiconductor substrate according to an embodiment of the present invention. As shown, the method uses a combination of steps including a way of forming photovoltaic cells for further processing into solar modules. In a specific embodiment, the semiconductor substrate provides a thickness of semiconductor material. Additionally, a support member substrate provides a thin substrate that remains on the total thickness of semiconductor material throughout the processing. The support member substrate is re-usable in a specific embodiment. A donor substrate may be selectively removed and/or cleaved while the thickness of semiconductor material is transferred to another substrate structure, e.g., the support member substrate, according to a specific embodiment. Other alternatives can also be provided where steps are added, one or more steps are removed, or one or more steps are provided in a different sequence without departing from the scope of the claims herein. Further details of the present method can be found throughout the present specification and more particularly below.

FIGS. 40 through 48 illustrate a simplified method for fabricating photovoltaic cells on a layer transferred substrate for solar modules according to an alternative embodiments of the present invention. These diagram are merely examples that should not unduly limit the scope of the claims herein. One of ordinary skill in the art would recognize other variations, modifications, and alternatives. As shown the method includes providing a semiconductor substrate 4000. Examples of the semiconductor substrate may include silicon, germanium, alloys such as silicon germanium, III-V materials such as gallium arsenide and the like. Depending on the embodiment, the semiconductor substrate may be made of single material, or a combination of various layers. Of course there can be other variations, modifications, and alternatives.

Figure 40:
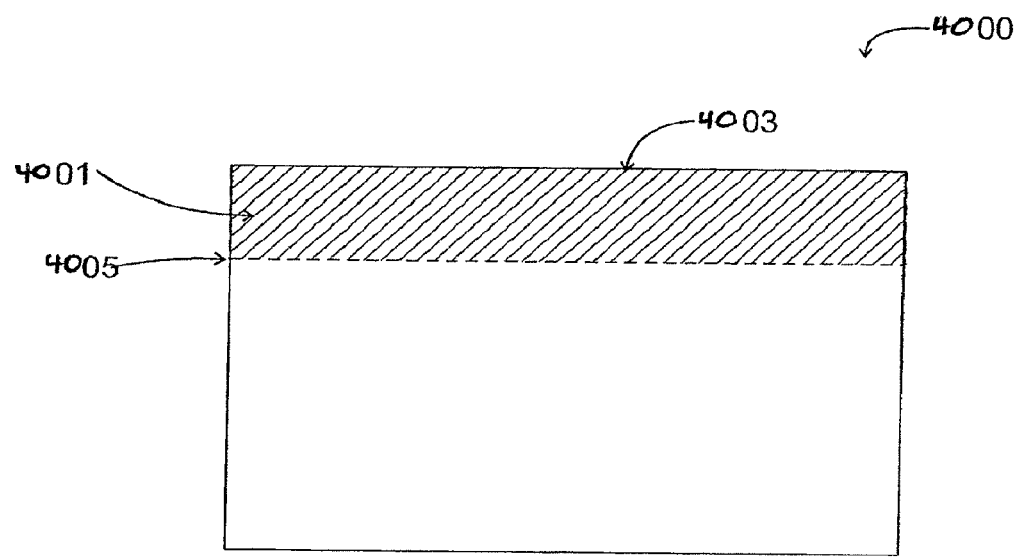
FIGS. 40-50 are simplified diagrams illustrating a method for fabricating solar cells for a solar module using a layer transfer process according to yet an alternative embodiment of the present invention.

In a specific embodiment, the semiconductor substrate includes a first thickness of semiconductor material 4001 and a surface region 4003 as shown in FIG. 40. In a preferred embodiment, the semiconductor substrate also includes a cleave plane 4005, which defines the thickness of semiconductor material. The first thickness of semiconductor material may include a plurality of particles, deposited material, or any combination of these, and the like. In a specific embodiment, the first thickness of semiconductor material is crystalline silicon (e.g., single crystal silicon), which can include an overlying epitaxial silicon layer. In a specific embodiment, the silicon surface region 4003 may have a thin layer of oxide such as silicon dioxide. Of course, there can be other variations, modifications, and alternatives.

Depending upon the embodiment, the cleave region can be formed using a variety of techniques. That is, the cleave region can be formed using any suitable combination of implanted particles, deposited layers, diffused materials, patterned regions, and other techniques. In a specific embodiment, the method introduces certain energetic particles using an implant process through a top surface of the semiconductor substrate, which can be termed a donor substrate, to a selected depth, which defines the thickness of the semiconductor material region, termed the "thin film" of material. A variety of techniques can be used to implant the energetic particles into a single crystal silicon wafer according to a specific embodiment. These techniques include ion implantation using, for example, beam line ion implantation equipment manufactured from companies such as Applied Materials, Inc. and others. Alternatively, implantation occurs using a plasma immersion ion implantation ("PIII") technique, ion shower, and other mass and non-mass specific techniques can be particularly effective for larger surface regions according to a specific embodiment. Combination of such techniques may also be used. Of course, techniques used depend upon the application.

Depending upon the application, smaller mass particles are generally selected to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $10^{15}$ to about $10^{18}$ atoms/cm$^2$, and preferably the dose is greater than about $10^{16}$ atoms/cm$^2$. Implantation energy ranges from about 1 KeV to about 1 MeV, and is generally about 50 KeV. Implantation temperature ranges from about −20 to about 600 Degrees Celsius, and is preferably less than about 400 Degrees Celsius to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about ±0.03 to ±0.05 microns. Of course, the type of ion used and process conditions depend upon the application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically at least partially be repaired by subsequent heat treatment, e.g., thermal annealing or rapid thermal annealing. Of course, there can be other variations, modifications, and alternatives.

Figure 41:
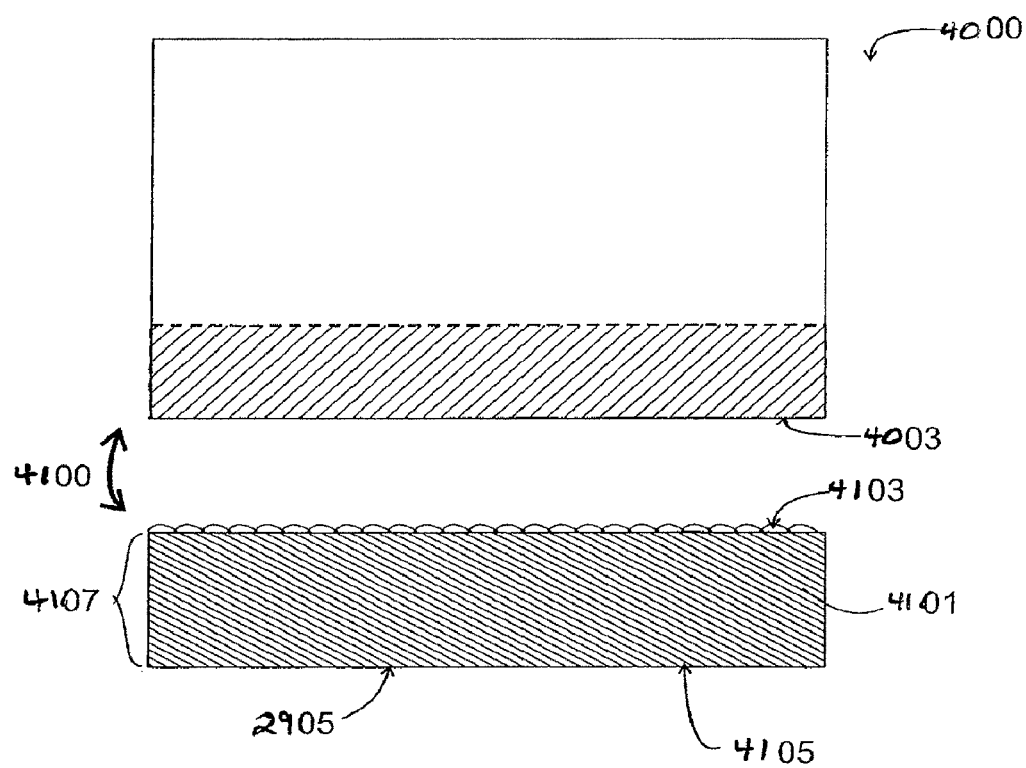

Referring to FIG. 41, the method joins (4100) the surface region of the semiconductor substrate to a support member substrate 4101. In a specific embodiment, the support member substrate can be made from a suitable material. In a preferred embodiment, the support member can be made of a similar material as the thickness of material, which is substantially crystalline to match thermal and crystalline characteristics. That is, the support member substrate can be made of a silicon wafer such as a single silicon wafer, an epitaxial wafer or a layer transferred silicon (e.g., a layer transferred silicon on insulator substrates) according to a specific embodiment. In alternative embodiments, the support member substrate can be formed of multi-layers, composites, or other materials. Additionally, the support member substrate can also be formed of a dielectric material (e.g., glass or quartz) or metal materials, including any combination of these, and others according to a specific embodiment. Of course there can be other modifications, variations, and alternatives.

As shown, the support member substrate has a surface region 4103, a bottom portion 4105, and a determined thickness 4107. In a preferred embodiment, the surface region of the support member is characterized by a bondable but releasable material. In a preferred embodiment, the surface region is characterized by a low surface roughness but a higher underlying surface material to surface material roughness, which facilities bonding but is also releasable under other conditions. In yet another preferred embodiment, the surface region is characterized by a surface roughness, which facilities bonding but is also releasable under other conditions. In this specific embodiment, the surface roughness is provided on an oxide material overlying a silicon support member. The oxide material has a surface roughness ranging from about 3 Angstroms RMS to about 100 Angstroms RMS These and other roughness points are to be understood as being measured using an Atomic Force Microscope (AFM) with a measurement area of about 10 microns by 10 microns. In yet another embodiment, the silicon surface roughness can be of the range mentioned above while the oxide surface has a smoother surface to allow for a more complete bond surface. Of course, there can be other variations, modifications, and alternatives.

In alternative embodiments, the surface roughness may be provided by a porous material. As an example, the porous material can be silicon that is porous and has an average pore size of about 10-1000 nm and less. Other types of porous materials can also be used. In still other embodiments, the releasable material can be a glue layer, which is releasable, or other types of materials having intrinsic and/or spatial characteristics that facilitate bonding but is releasable. Another releasable material can be a material in which a high temperature process such as during the epitaxial growth process step can reduce the bonding energy by a phase change or material change within the release layer, thereby allowing the low-temperature layer-transfer to occur, yet making a post-epitaxial release of the support member. In a specific embodiment the surface region of the support member substrate will be joined or bonded with the surface region 4003 provided on the donor substrate. Like reference numerals are used in this figure and others, but not intended to be limiting the scope of the claims herein. Further details of the joining or bonding process can be found throughout the present specific specification and more particularly below.

In a specific embodiment, the bonding process occurs by joining the surfaces of donor substrate and the support member substrate after an optional plasma activation process. The optional plasma activation process depends on the substrates used. Such plasma activation process may clean or activate the surface regions of the substrates. In silicon substrate as an example, the plasma activation process may be provided, for example, using a nitrogen bearing plasma at temperatures ranging from 20° C. to 40° C. Preferably the plasma activation process is carried in a dual frequency plasma activation system manufactured by Silicon Genesis Corporation of San Jose, Calif. Of course there can be other variations, modifications and alternatives, which have been described herein, as well as outside of the present specification.

Figure 42:
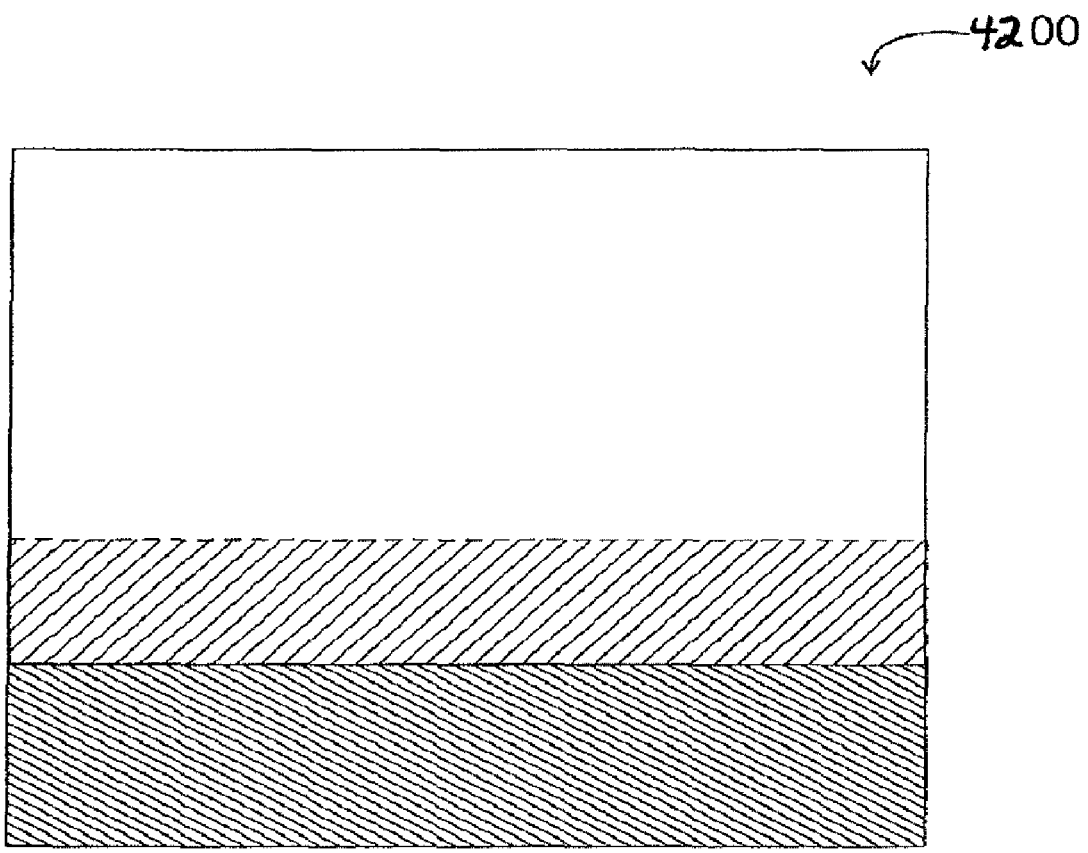

Each of these substrates are bonded together to form a bonded substrate structure 4200 as shown in FIG. 42 according to a preferred embodiment. As shown, the donor substrate has been bonded to the support member substrate. Preferably, the substrate are bonded using an EVG 850 bonding tool manufactured by Electronic Vision Group or other like processes for smaller substrate sizes such as 200 mm or 300 mm diameter wafers. Other types of tools such as those manufactured by Karl Suss may also be used. Of course, there can be other variations, modifications, and alternatives. Preferably, bonding between the support member substrate and the donor substrate is temporary but reliable enough for performing one or more high temperature processing steps, but can be released during a subsequent step, which will be described further below. That is the bonding is temporary and can be released. Of course, there can be other variations, modifications, and alternatives.

Accordingly after bonding, the bonded substrate structures are subjected to a first thermal treatment according to a specific embodiment. The first thermal treatment may be a bake treatment using heating elements such as a thermal plate coupled to the handle substrate in a specific embodiment. In an alternative embodiment, the first thermal treatment may be a bake treatment using heating elements such as a thermal plate coupled to the donor substrate. The first thermal treatment provides a temperature gradient through a portion of a thickness of the donor substrate and a portion of the support member substrate. Additionally, the first thermal treatment maintains the bonded substrate structures at a predetermined temperature and for a predetermined time. Preferably, the temperature ranges from about 200 or 250 Degrees Celsius to about 400 Degrees Celsius and is preferably about 350 Degrees Celsius for about one hour or so for a silicon donor substrate and the support member substrate to attach to each other permanently according to the preferred embodiment. Depending upon the specific application, there can be other variations, modifications, and alternatives.

In a specific embodiment, the substrates are joined or fused together using a low temperature thermal step. The low temperature thermal process generally ensures that the implanted particles do not place excessive stress on the material region, which can produce an uncontrolled cleave action. In a specific embodiment, the low temperature bonding process occurs by a self-bonding process.

Alternatively, a variety of other low temperature techniques can be used to join the donor substrate surface regions to the support member substrate. For instance, an electrostatic bonding technique can be used to join the two substrates together. In particular, one or both substrate surface(s) is charged to attract to the other substrate surface. Additionally, the donor substrate surface can be fused to the support member substrate using a variety of other commonly known techniques. Of course, the technique used depends upon the application.

Figure 43:
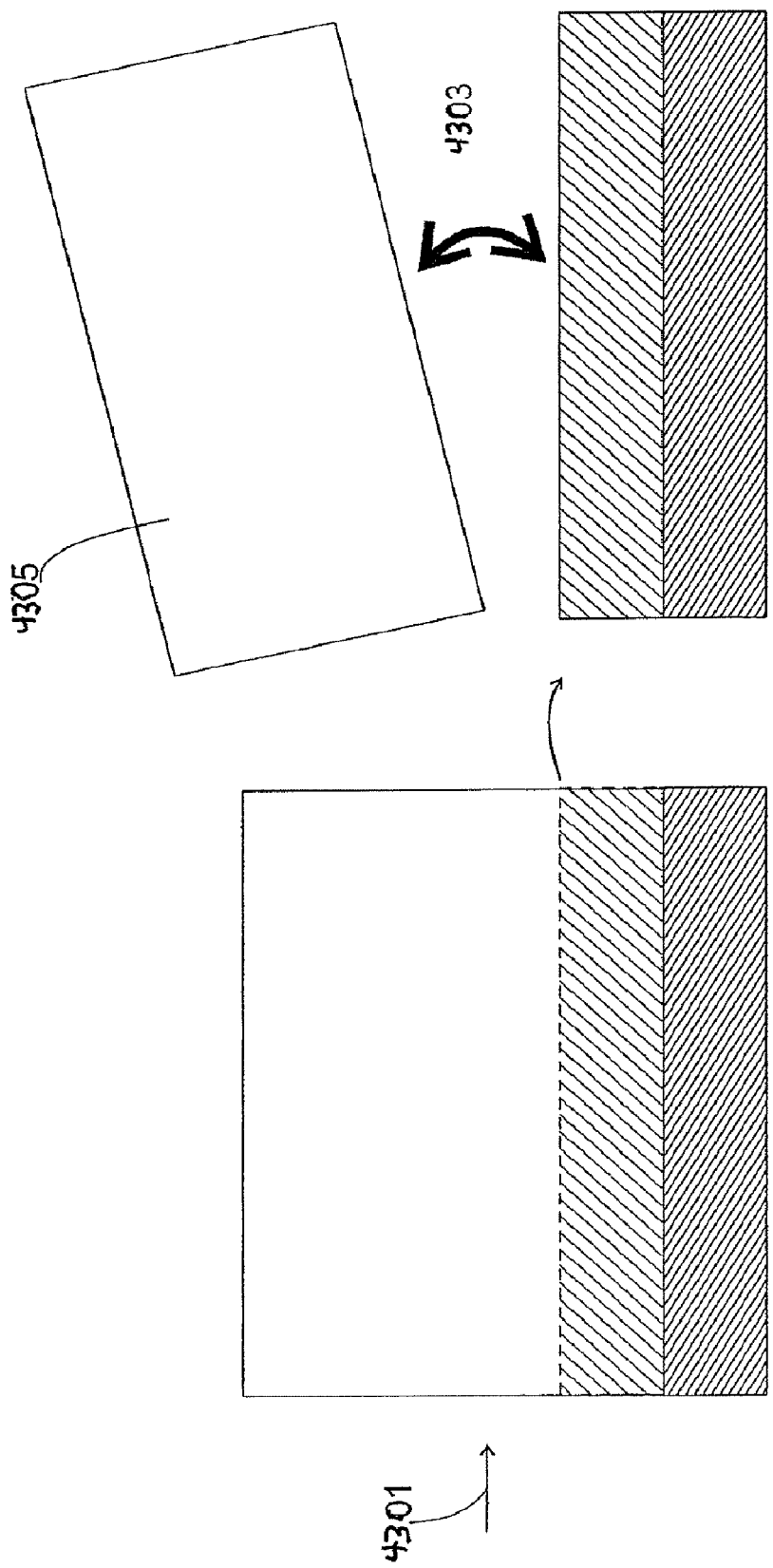

Referring to FIG. 43, the method includes initiating a cleaving process using energy 4301 provided in a selected portion of the cleave plane to detach the first thickness of semiconductor material from the donor substrate, while the first thickness of material remains joined to the support member substrate. Depending on the specific embodiment, there can be certain other variations. For example, the cleaving process can be a controlled cleaving process using a propagating cleave front to selectively free the thickness of material from the donor while the thickness of material remained joined to the support member substrate. Alternative cleaving techniques can also be used. Such techniques include but not limited to those called a Nanocleave™ process of Silicon Genesis Corporation of San Jose, Calif., a thermal release such as used by the SmartCut™ process of Soitec SA of France, and a porous silicon cleaving layer such as used by the Eltran™ process of Canon Inc. of Tokyo, Japan, any like processes, and others. The method then removes 4303 remaining portion 4305 of the donor substrate, which has provided the first thickness of material to the support member substrate according to a specific embodiment. The remaining portion of the donor substrate may also be used as another donor substrate according to a preferred embodiment.

Figure 44:
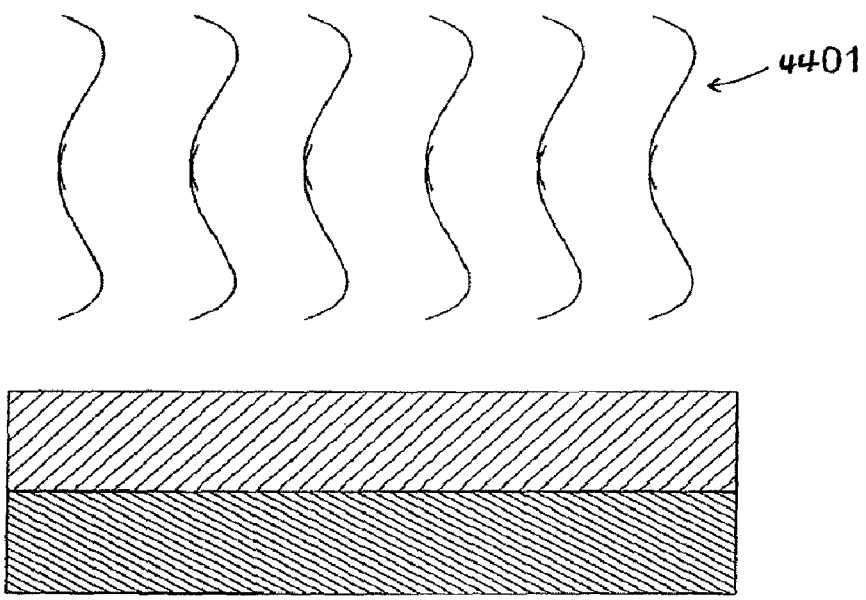

As shown in FIG. 44, the method also subjects the resulting bonding structure to a surface preparation process 4401. Such surface preparation process may include plasma activation, plasma cleaning or a combination for further processing. Of course there can be other variations, modifications, and alternatives.

Figure 45:
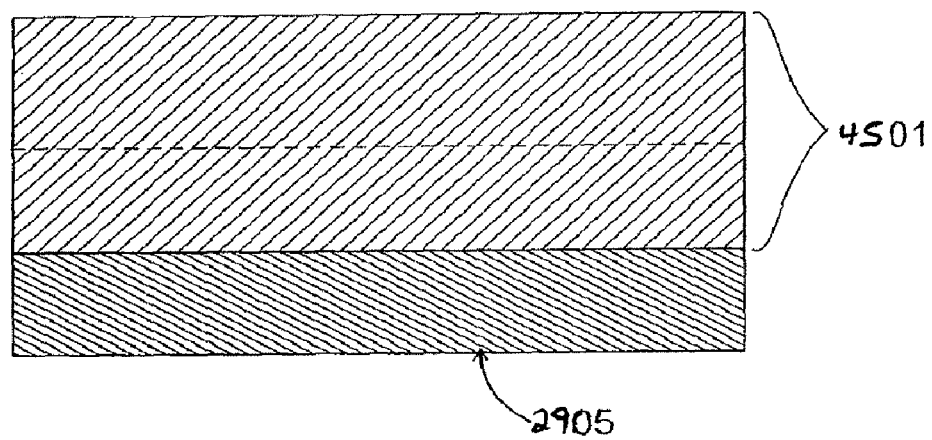

Referring to FIG. 45, the method includes forming a thickened surface layer overlying the first thickness of semiconductor material to form a total thickness of material 3300. In a specific embodiment, the thickened surface layer may be formed using an epitaxial process and/or other deposition processes. These processes can include plasma-enhanced CVD (PECVD), thermal CVD, photo-catalyzed CVD, glow discharge CVD, Hot-wire/catalytic CVD, and others. These processes can form a suitable single crystal silicon or like material either directly or in combination with other steps such as anneals according to specific embodiments. As merely an example, the material can be single-crystal silicon, amorphous silicon, polycrystalline silicon, germanium and silicon germanium alloy. For example, amorphous silicon could advantageously allow for solid-phase epitaxial growth of single-crystal silicon using the underlying transferred thickness of silicon material as a template. Another method that can increase the effective rate of silicon material deposition is to spray or coat the surface with silicon nanoparticles (advantageously amorphous silicon) which can be thermally treated to produce single-crystal silicon using the underlying transferred thickness of silicon material as a template. This can be applied dry or using a liquid that would be eliminated during subsequent processing. Polycrystalline silicon and other materials may also allow single-crystal regrowth through a rapid-thermal anneal liquid phase step using appropriate treatments such as laser anneals, flash thermal treatments and the like. Other epitaxial processes such as PECVD or thermal CVD could be used to grow single-crystal silicon directly onto the layer-transferred silicon film. In a specific embodiment, the thickened surface layer, including the transferred thickness of silicon material may range from about 50 µm to about 200 µm. In other embodiments, the thickened material can be provided using a tri-silane species, such as those described in U.S. Provisional No. 60/822,473, commonly assigned, and hereby incorporated by reference for all purposes. Of course, there can be other variations, modifications, and alternatives.

In a specific embodiment, the transferred material is thickened using an amorphous silicon layer. In a specific embodiment, the amorphous silicon layer is deposited using application of nanoparticles (e.g., amorphous silicon, crystalline silicon, polysilicon, or combinations of these), which are later subjected to a thermal treatment to cause formation of a sheet of thickened material. Alternatively, the amorphous silicon layer can be formed using physical vapor deposition or chemical vapor deposition (e.g., plasma enhanced) at low temperature according to a specific embodiment. In a specific embodiment, the amorphous silicon layer, which has been deposited is maintained at a temperature greater than 800 Degrees Celsius to form crystalline silicon. In another specific embodiment, the transferred material is thickened by a high-temperature CVD using silane or a chlorosilane species such as SiCl4, dichlorosilane, or trichlorosilane. Preferably the total thickness of material has a desired coefficient of thermal expansion match with the support member substrate material.

Figure 46:
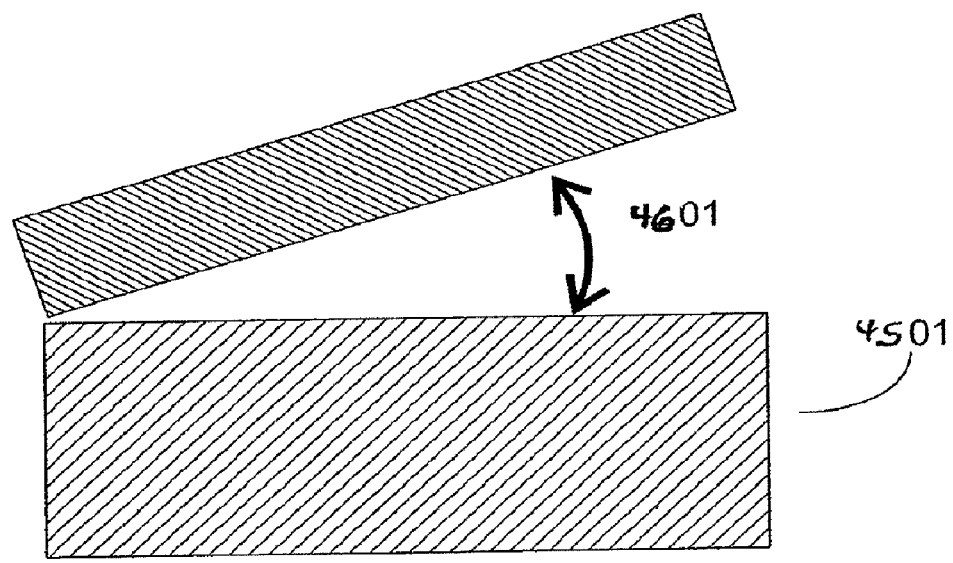

Referring to FIG. 46, the method includes detaching 4601 the total thickness of material from the support member substrate. In a specific embodiment, the support member substrate may include an opening region extending from the bottom portion of the support member substrate, through the thickness of the support member substrate, to a portion of the surface region. The opening region can be coupled to a fluidic drive source. The fluidic drive source is adapted to be capable of causing a pressure gradient within the opening region between the bottom portion and the portion of the surface region. That is, the pressure gradient facilitates the removal of the total thickness of material from the support member substrate. As merely an example, the pressure gradient can be provided by a fluid such as a liquid, a gas, a vapor, or a combination. In a preferred embodiment, the removal step includes the injection of an etchant fluid that causes the release of the total thickness of material. In combination with a cyclical pumping of the etchant fluid to replenish fresh etchant into the release layer with a concurrent mechanical separation force, the total thickness of material can be fully separated from the support member substrate. In a preferred embodiment, the support member substrate, after being can be re-usable as a support member substrate. Alternatively, the support member substrate can include a mechanical device, which facilitates removal of an overlying film of material in a specific embodiment. In such embodiment, the mechanical device can include one or more pins, ejectors, or the like. Of course there can be other variations, modifications, and alternatives.

Figure 47:
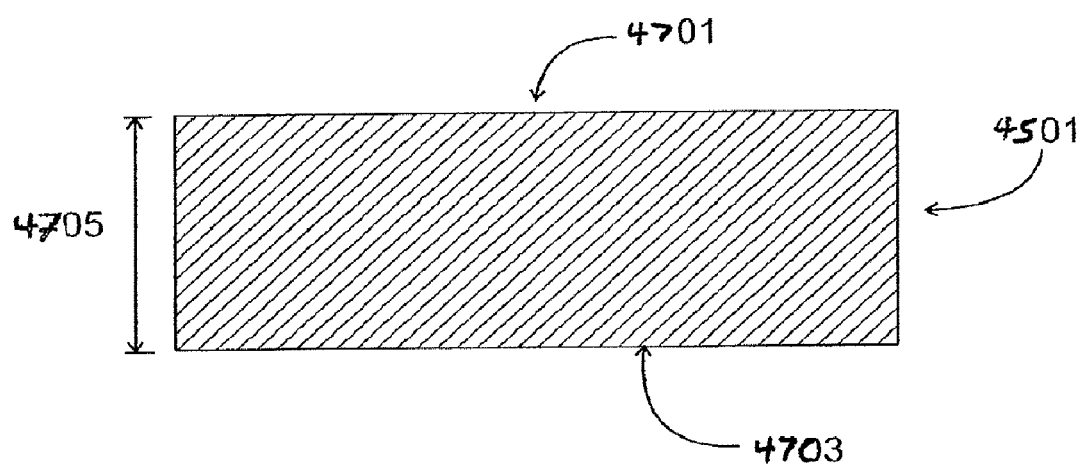

In a specific embodiment, the total thickness of material after being released from the support member substrate can be used as a thin substrate for device fabrication, e.g., photovoltaic cells. As shown in FIG. 47, the total thickness of material has a first surface region 4701, a second surface region 4703 and a determined thickness 4705. In a specific embodiment, at least a vicinity of the first surface region in the total thickness of material is subjected to impurities to formed at least one first photovoltaic cell within the determined thickness. In a specific embodiment, the impurities can be in-situ doped during the thickening step, diffused, and/or implanted using ion beams, plasma immersion implantation, or conventional implantation techniques. Heterojunctions can also be formed to realize the photovoltaic effect. Single-crystal/amorphous silicon heterojunctions are one example. Silicon germanium/silicon heterostructure dual junction cells are another example of a more sophisticated photovoltaic cell that combines multiple bandgap sub-cells to enhance overall light to electricity energy conversion efficiency. The resultant photovoltaic cell comprise impurity regions such as P-type and N-type impurities to provide for a p-n junction or multiple p-n junctions according to a specific embodiment.

Figure 48:
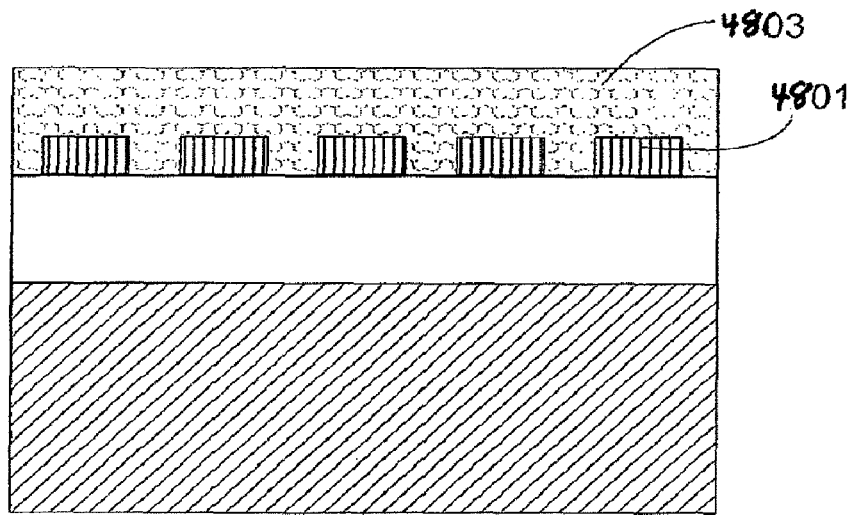

Referring to FIG. 48, the method includes forming a first contact layer 4801 overlying the first surface region of the thickened material layer which has at least one first photovoltaic cell surface formed in the vicinity of first surface within the determined thickness. The contact layer can be made of a suitable transparent conductive material such as ITO, a highly reflective conductor or other suitable material depending on the photovoltaic cell geometry. Other materials may also be used. In a preferred embodiment, the first contact layer is patterned to form a plurality of electrodes which couples to each of the first photovoltaic cells. The method also includes forming a first planarized dielectric layer 4803 overlying the first contact layer and the at least one photovoltaic cells. Of course there can be other variations, modifications, and alternatives.

In a preferred embodiment, the second surface region is subjected to impurities to formed at least one second photovoltaic cell within the determined thickness. In a specific embodiment, the impurities can be in-situ doped during the thickening step, diffused, and/or implanted using ion beams, plasma immersion implantation, or conventional implantation techniques. The second photovoltaic cell surface comprise impurity regions such as P-type and N-type impurities to provide for a p-n junction or multiple p-n junctions according to a specific embodiment.

Figure 49:
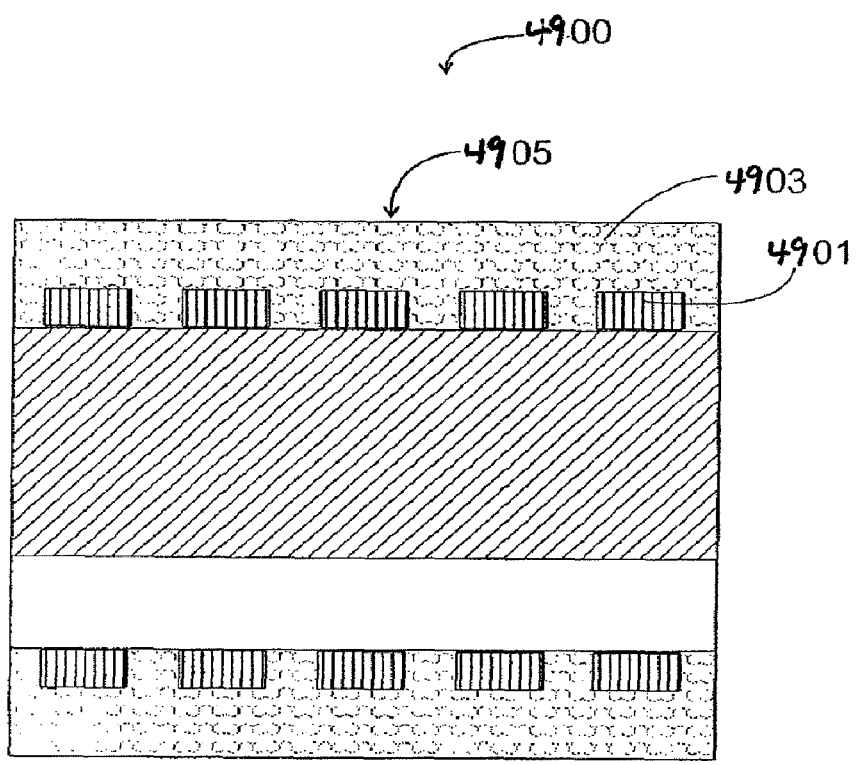

Referring to FIG. 49, the method includes forming a second contact layer 4901 overlying the second surface region. The second contact layer can be made of a suitable transparent conductive material such as ITO, a highly reflective conductor or other suitable material depending on the photovoltaic cell geometry. Other materials may also be used. In a preferred embodiment, the second contact layer is patterned to form a plurality of electrodes which couples to each of the second photovoltaic cells. The method also includes forming a second planarized dielectric layer 4903 having a surface region 4905 overlying the second contact layer and the at least one second photovoltaic cells. The second dielectric layer may include material such as silicon dioxide deposited using a CVD process and the like. In a specific embodiment, the second dielectric layer is substantially optically transparent to allow electromagnetic radiation to traverse through the dielectric layer or layers. An example of a photovoltaic cell structure 4900 is shown. Of course there can be other variations, modifications, and alternatives.

Figure 50:
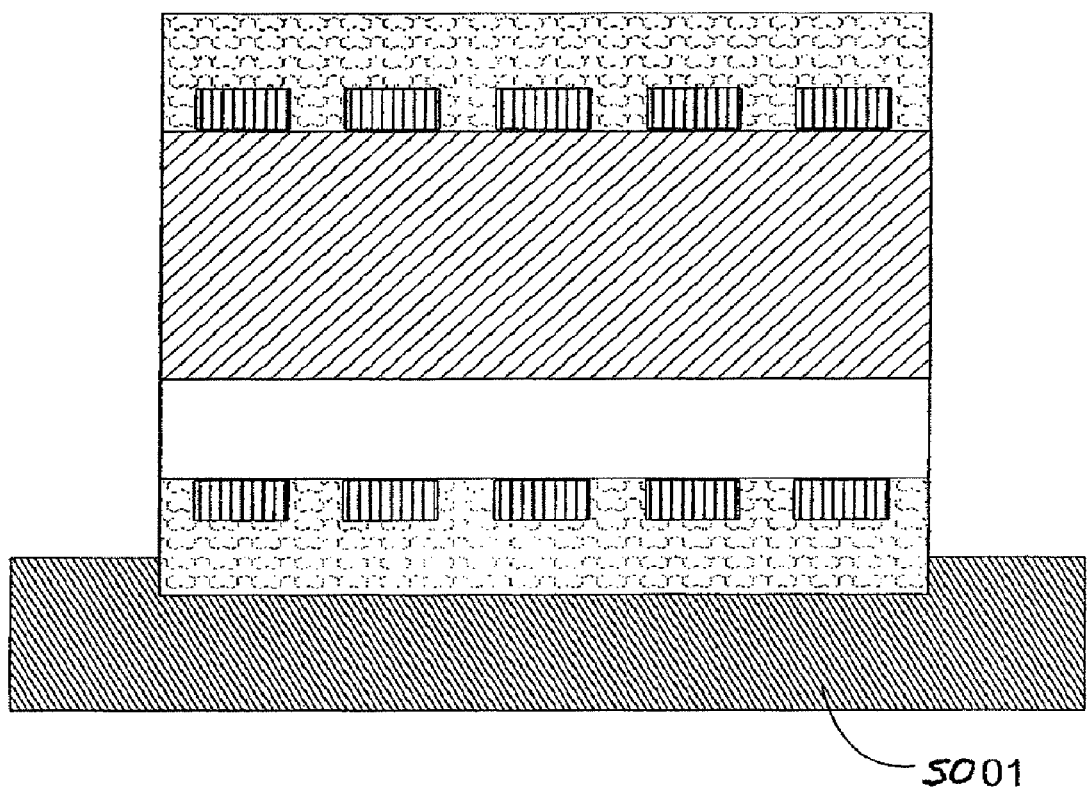
Figure 5I:
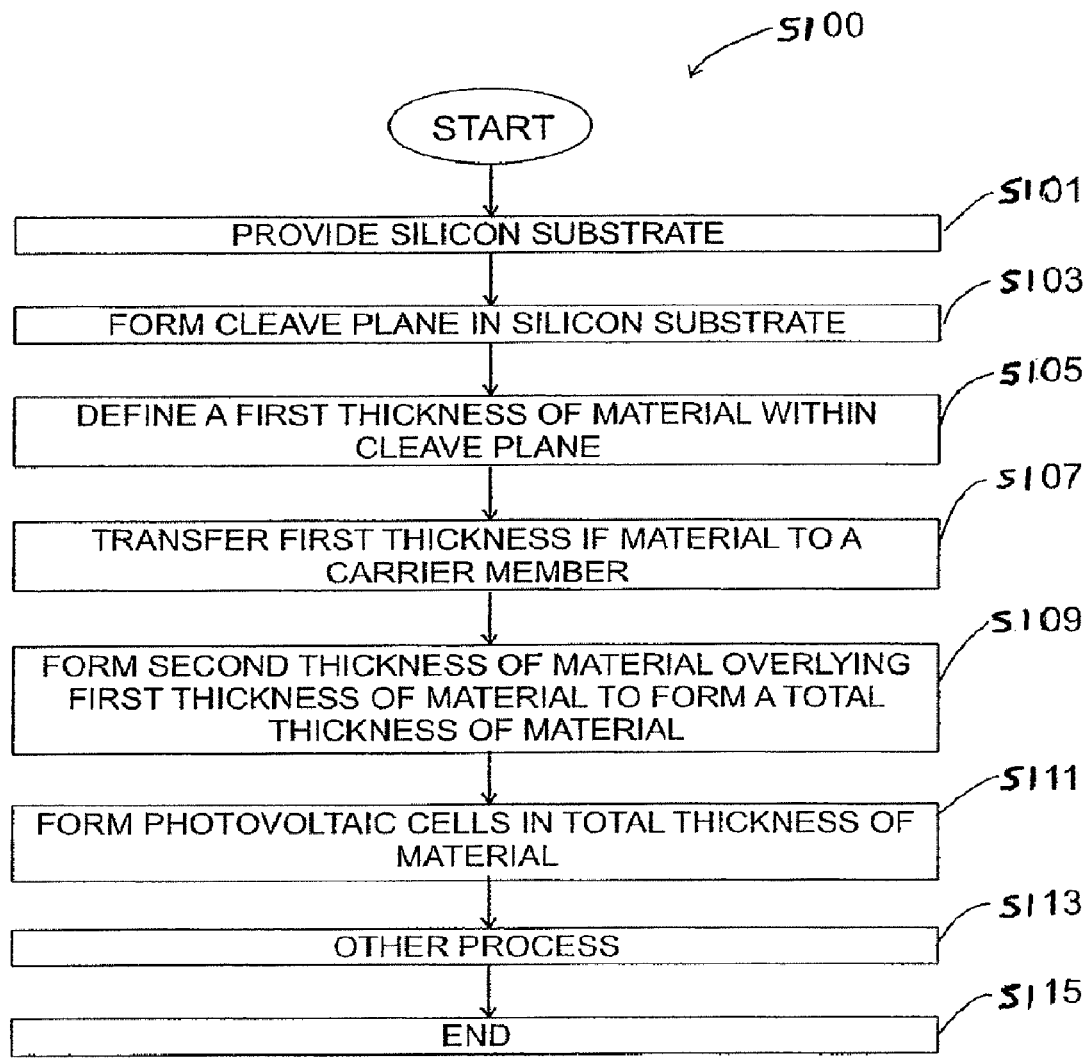
Figure 52:
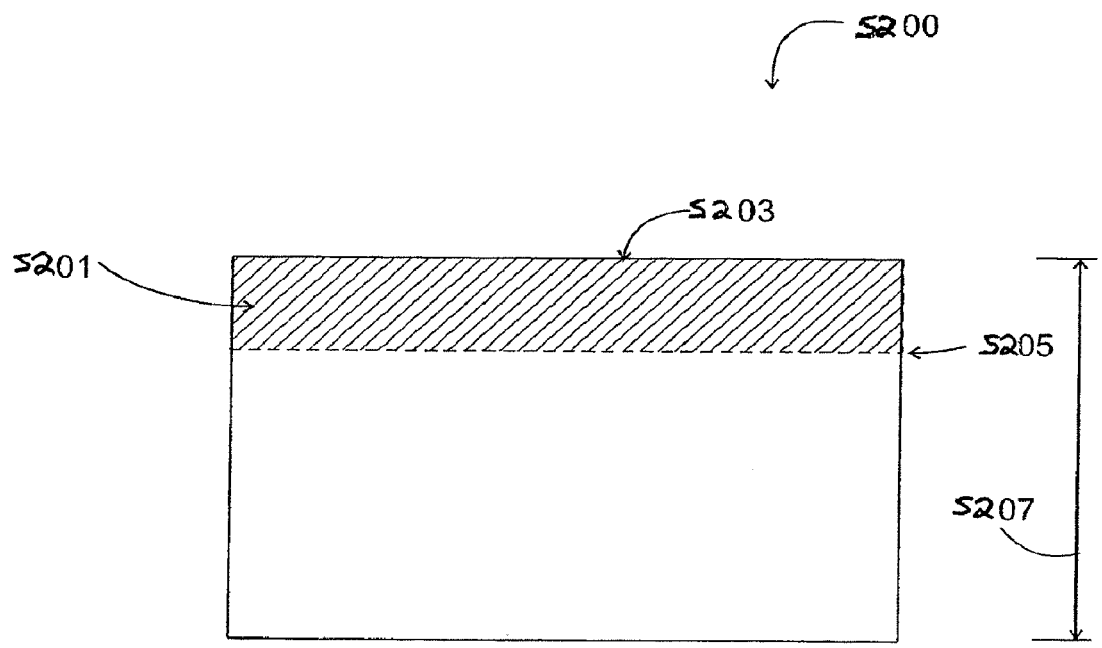
FIGS. 52-58 are simplified diagrams illustrating a method for fabricating solar cells for a solar module using a layer transfer process according to yet an alternative embodiment of the present invention.

Referring to FIG. 50, the method includes attaching the photovoltaic cell structure to a carrier member 5001 according to an embodiment of the present invention. The carrier member can be made of a suitable material such as plastic, glass (e.g., float glass), quartz, or a polymer material depending on the application. In a specific embodiment, the carrier member can be permanently attacked and served as a portion of packaging for the photovoltaic cells. The carrier member may also be temporary and can be detached according to an alternative embodiment. Of course, there can be other variations, modifications, and alternatives.

The above sequence of steps provides a method to fabricate photovoltaic cells in a semiconductor substrate according to an embodiment of the present invention. As shown, the method uses a combination of steps including a way of forming photovoltaic cells for further processing into solar modules. In a specific embodiment, a support member substrate provides a releasable substrate for a thickness of semiconductor material. Preferably, the support member is a thin substrate that remains on the total thickness of semiconductor material throughout the processing. The support member is re-usable in a specific embodiment. A donor substrate may be selectively removed and/or cleaved while the thickness of semiconductor material is transferred to another substrate structure, e.g., the support member, according to a specific embodiment. Other alternatives can also be provided where steps are added, one or more steps are removed, or one or more steps are provided in a different sequence without departing from the scope of the claims herein. Other embodiments of the present invention can be found throughout the present specification and more particularly below.

FIG. 51 illustrates a method 5100 for fabricating solar cells for a solar module according to yet an alternative embodiment of the present invention. The method may be summarized as follow:

1 Provide a semiconductor substrate (Step 5101), e.g., silicon, germanium, a silicon-germanium alloy, gallium arsenide, any Group III/V materials, and others;

2. Form a cleave plane (Step 5103) to define a first thickness of silicon material (Step 5105);

3. Transfer the first thickness of material to a carrier member substrate (Step 5107)

4. Forming a second thickness of material overlying the first thickness of semiconductor material to form a total thickness of material (Step 5109);

5. Form at least one first photovoltaic cell surface on one side of the total thickness of material (Step 5111);

6. Perform other process as desired (Step 5113);

11. End (Step 5115).

The above sequence of steps provides a method to fabricate photovoltaic cells on a semiconductor substrate according to an embodiment of the present invention. As shown, the method uses a combination of steps including a way of forming photovoltaic cells for further processing into solar modules. In a specific embodiment, the semiconductor substrate provides a thickness of semiconductor material to be transferred. Preferably, the semiconductor substrate a thin substrate that remains on the total thickness of semiconductor material throughout the processing. The semiconductor substrate is re-usable in a specific embodiment. A donor substrate may be selectively removed and/or cleaved while the thickness of semiconductor material is transferred to another substrate structure, e.g., the carrier member, according to a specific embodiment. Other alternatives can also be provided where steps are added, one or more steps are removed, or one or more steps are provided in a different sequence without departing from the scope of the claims herein. Further details of the present method can be found throughout the present specification and more particularly below.

FIG. 52 through 58 illustrate a simplified method for fabricating photovoltaic cells on a layer transferred substrate according to an embodiment of the present invention. These diagram are merely examples that should not unduly limit the scope of the claims herein. One of ordinary skill in the art would recognize other variations, modifications, and alternatives. As shown the method includes providing a semiconductor substrate or a donor substrate 5200. Examples of the semiconductor substrate may include silicon, germanium, alloys such as silicon germanium, III-V materials such as gallium arsenide and the like. Depending on the embodiment, the semiconductor substrate may be made of single material, or a combination of various layers. Of course there can be other variations, modifications, and alternatives.

In a specific embodiment, the semiconductor substrate includes a first thickness of material 5201, a surface region 5203, and a thickness 5207. In a preferred embodiment, the semiconductor substrate also includes a cleave plane 5205, which defines the first thickness of semiconductor material. The first thickness of material may include a plurality of particles, deposited material, or any combination of these, and the like. In a specific embodiment, the first thickness of semiconductor material is crystalline silicon (e.g., single crystal silicon), which can include an overlying epitaxial silicon layer. In a specific embodiment, the silicon surface region 5203 may have a thin layer of oxide such as silicon dioxide. Of course, there can be other variations, modifications, and alternatives.

Depending upon the embodiment, the cleave region can be formed using a variety of techniques. That is, the cleave region can be formed using any suitable combination of implanted particles, deposited layers, diffused materials, patterned regions, and other techniques. In a specific embodiment, the method introduces certain energetic particles using an implant process through the surface region of the semiconductor substrate, which can be termed a donor substrate, to a selected depth, which defines the first thickness of the semiconductor material region, termed the "thin film" of material. A variety of techniques can be used to implant the energetic particles into a single crystal silicon wafer according to a specific embodiment. These techniques include ion implantation using, for example, beam line ion implantation equipment manufactured from companies such as Applied Materials, Inc. and others. Alternatively, implantation occurs using a plasma immersion ion implantation ("PIII") technique, ion shower, and other mass and non-mass specific techniques can be particularly effective for larger surface regions according to a specific embodiment. Combination of such techniques may also be used. Of course, techniques used depend upon the application.

Depending upon the application, smaller mass particles are generally selected to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $10^{15}$ to about $10^{18}$ atoms/cm$^2$, and preferably the dose is greater than about $10^{16}$ atoms/cm$^2$. Implantation energy ranges from about 1 KeV to about 1 MeV, and is generally about 50 KeV. Implantation temperature ranges from about −20 to about 600 Degrees Celsius, and is preferably less than about 400 Degrees Celsius to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about ±0.03 to ±0.05 microns. Of course, the type of ion used and process conditions depend upon the application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically at least partially be repaired by subsequent heat treatment, e.g., thermal annealing or rapid thermal annealing. Of course, there can be other variations, modifications, and alternatives.

Figure 53:
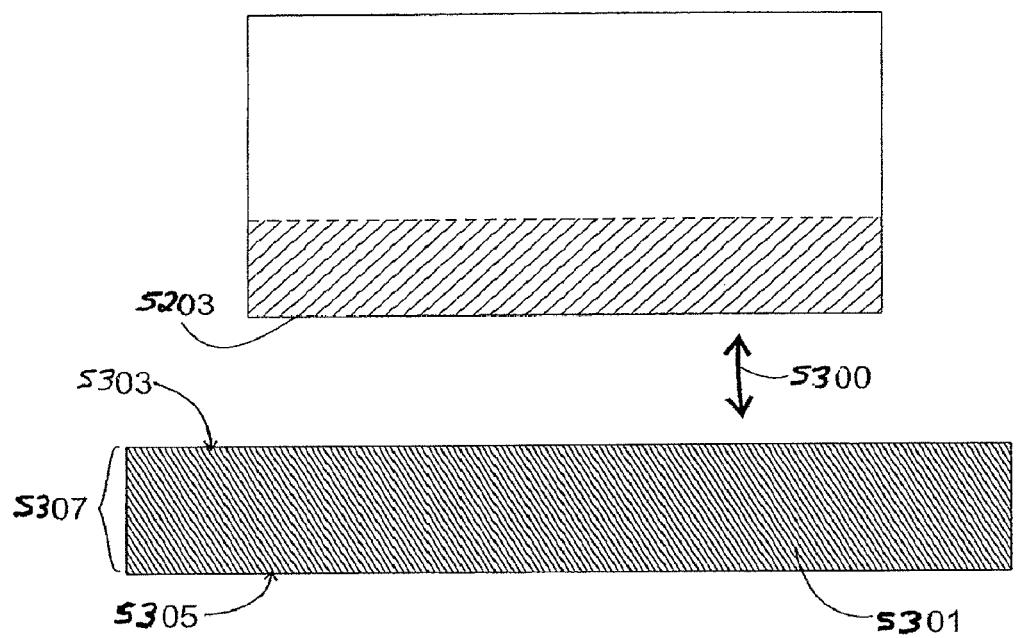

Referring to FIG. 53, the method joins (5300) the surface region of the semiconductor substrate to a carrier member 5301. In a specific embodiment, the carrier member can be made from a suitable material such as glass, quartz or float glass. In alternative embodiments, the carrier member can be made of polymeric materials or plastic materials depending on the application. In a preferred embodiment, the carrier member is made of glass characterized by a stable structure at temperatures ranging from 600-700 Degree Celsius. The carrier member can be a large area substrate according to a specific embodiment. Of course there can be other modifications, variations, and alternatives.

As shown, the carrier member has a surface region 5303, a bottom portion 5305, and a determined thickness 5307. In a preferred embodiment, the surface region is characterized by a low surface roughness but a higher underlying surface material to surface material roughness, which facilities bonding but is also releasable under other conditions. In yet another preferred embodiment, the surface region is characterized by a surface roughness, which facilities bonding but is also releasable under other conditions. In this specific embodiment, the surface roughness is provided on an oxide material overlying a silicon support member. The oxide material has a surface roughness ranging from about 3 Angstroms RMS to about 100 Angstroms RMS These and other roughness points are to be understood as being measured using an Atomic Force Microscope (AFM) with a measurement area of about 10 microns by 10 microns. In yet another embodiment, the silicon surface roughness can be of the range mentioned above while the oxide surface has a smoother surface to allow for a more complete bond surface. In alternative embodiments, the surface roughness may be provided by a porous material. As an example, the porous material can be silicon that is porous and has an average pore size of about 10-1000 nm and less. Other types of porous materials can also be used.

In still other embodiments, the releasable material can be a glue layer, which is releasable, or other types of materials having intrinsic and/or spatial characteristics that facilitate bonding but is releasable. Another releasable material can be a material in which a high temperature process such as during the epitaxial growth process step can reduce the bonding energy by a phase change or material change within the release layer, thereby allowing the low-temperature layer-transfer to occur, yet making a post-epitaxial release of the support member. In a specific embodiment the surface region of the carrier member will be joined or bonded with the surface region 2603 provided on donor substrate 2600. Like reference numerals are used in this figure and others, but not intended to be limiting the scope of the claims herein. Further details of the joining or bonding process can be found throughout the present specific specification and more particularly below.

In a specific embodiment, the bonding process occurs by joining the surfaces of donor substrate and the carrier member after an optional plasma activation process. The optional plasma activation process depends on the substrates used. Such plasma activation process may clean or activate the surface regions of the substrates. In silicon substrate as an example, the plasma activation process may be provided, for example, using a nitrogen bearing plasma at temperatures ranging from 20° C. to 40° C. Preferably the plasma activation process is carried in a dual frequency plasma activation system manufactured by Silicon Genesis Corporation of San Jose, Calif. Of course there can be other variations, modification and alternatives, which have been described herein, as well as outside of the present specification.

Figure 54:
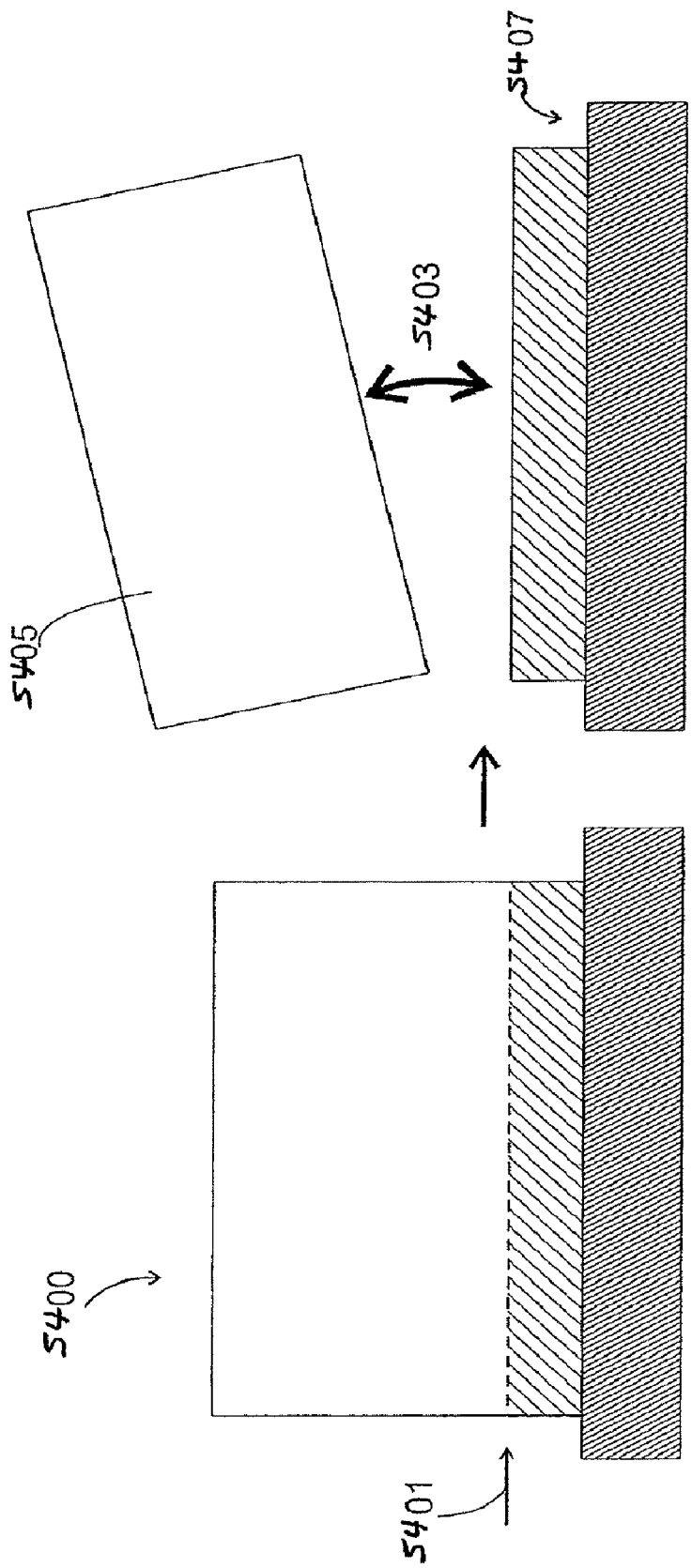

As shown in FIG. 54, the donor substrate and the carrier member are bonded together to form a bonded substrate structure 5400 according to a preferred embodiment. As shown, the donor substrate has been bonded to the carrier member. Preferably, the donor substrate and the carrier member are bonded using an EVG 850 bonding tool manufactured by Electronic Vision Group or other like processes for smaller substrate sizes such as 200 mm or 300 mm diameter wafers. Other types of tools such as those manufactured by Karl Suss may also be used. Preferably, the carrier member is permanently attached to the donor substrate and can be used as a portion of packaging for photovoltaic devices. Alternately, the carrier member may be temporarily attached to the donor substrate and may be detached according to an alternative embodiment. Of course, there can be other variations, modifications, and alternatives Accordingly after bonding, the bonded substrate structures are subjected to a first thermal treatment according to a specific embodiment. The first thermal treatment may be a bake treatment using heating elements such as a thermal plate coupled to the carrier member in a specific embodiment. In an alternative embodiment, the first thermal treatment may be a bake treatment using heating elements such as a thermal plate coupled to the donor substrate. The first thermal treatment provides a temperature gradient through a portion of a thickness of the donor substrate and a portion of the carrier member. Additionally, the first thermal treatment maintains the bonded substrate structures at a predetermined temperature and for a predetermined time. Preferably, the temperature ranges from about 200 or 250 Degrees Celsius to about 400 Degrees Celsius and is preferably about 350 Degrees Celsius for about one hour or so for a silicon donor substrate and the carrier member to attach to each other permanently according to the preferred embodiment. Depending upon the specific application, there can be other variations, modifications, and alternatives.

In a specific embodiment, the donor substrate and the carrier member are joined or fused together using a low temperature thermal step. The low temperature thermal process generally ensures that the implanted particles do not place excessive stress on the material region, which can produce an uncontrolled cleave action. In a specific embodiment, the low temperature bonding process occurs by a self-bonding process.

Alternatively, a variety of other low temperature techniques can be used to join the donor substrate surface regions to the carrier member. For instance, an electro-static bonding technique can be used. In particular, one or both substrate surface(s) is charged to attract to the other substrate surface. Additionally, the donor substrate surface can be fused to the carrier member using a variety of other commonly known techniques. Of course, the technique used depends upon the application.

Referring again to FIG. 54, the method includes initiating a cleaving process using energy 5401 provided in a selected portion of the cleave plane to detach the first thickness of semiconductor material from the donor substrate, while the first thickness of material remains joined to the carrier member. Depending on the specific embodiment, there can be certain other variations. For example, the cleaving process can be a controlled cleaving process using a propagating cleave front to selectively free the first thickness of semiconductor material from the donor substrate while the first thickness of semiconductor material remained joined to the carrier member. Alternative cleaving techniques can also be used. Such techniques include but not limited to those called a Nanocleave™ process of Silicon Genesis Corporation of San Jose, Calif., a thermal release such as used by the SmartCut™ process of Soitec SA of France, and a porous silicon cleaving layer such as used by the Eltran™ process of Canon Inc. of Tokyo, Japan, any like processes, and others. The method then removes remaining portion of the donor substrate, which has provided the first thickness of semiconductor material to the carrier member according to a specific embodiment. The remaining portion of the donor substrate 2805 may be used as another donor substrate according to a preferred embodiment.

Figure 55:
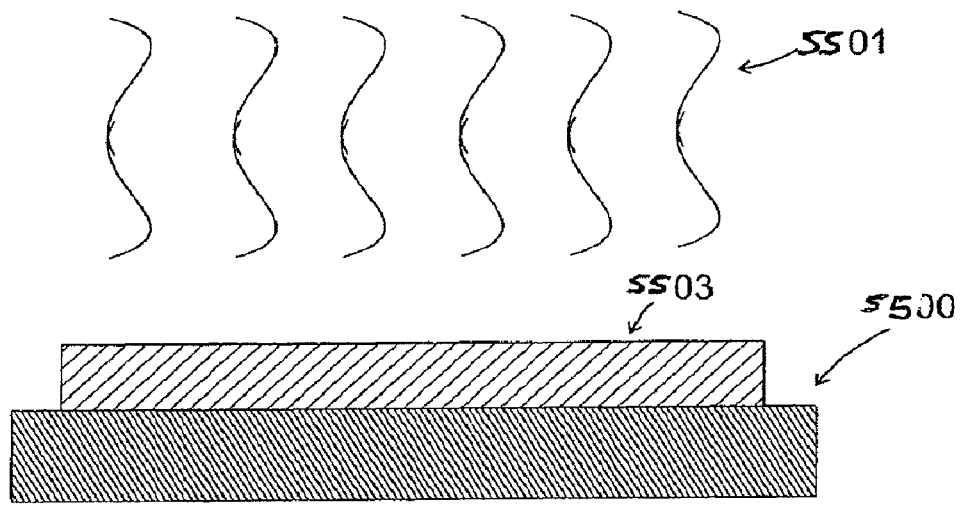

As shown in FIG. 55, the method provides a resulting bonding structure 5500. The resulting bonding structure includes an overlying thickness of semiconductor material having a surface region 5503. In a specific embodiment, the method may further subject the resulting bonding structure to a bonding process 5501 to form a substantially permanent bond between the thickness of semiconductor material and the carrier member. In a preferred embodiment, the bonding process includes a thermal treatment. The thermal treatment can be a suitable rapid thermal process, rapid thermal process using laser irradiation, or the like. In a specific embodiment, the thermal treatment includes irradiating the resulting bonding structure using a light source (e.g., monochromatic, flash lamp, or other suitable source). The carrier member may also be detached from the donor substrate in certain other embodiments. Of course, there can be other variations, modifications, and alternatives.

As shown in FIG. 55, the method also subjects the resulting bonding structure to a surface preparation process 5501. Such surface preparation process may include a plasma cleaning process, a plasma activation process, an etch step, a polishing step or a combination depending on the embodiment. In a specific embodiment, the surface preparation process provides for a desired surface characteristics to thicken the transferred material using a deposition and/or forming process. For example, the post-cleave surface may have a layer of limited roughness with some defective material that should be removed to optimize the epitaxial film quality. Of course there can be other variations, modifications, and alternatives.

Figure 56:
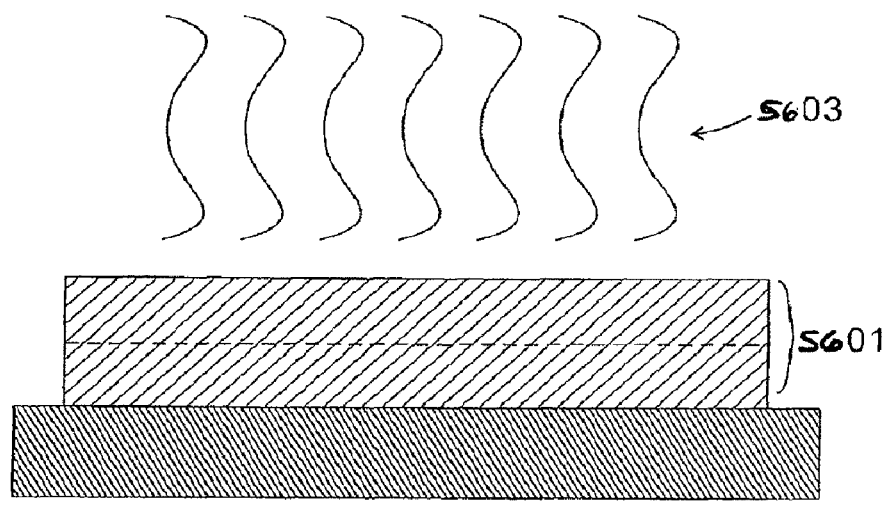

Referring to FIG. 56, the method includes depositing a thickened surface layer to form a total thickness of material 5601 overlying the carrier member. In a specific embodiment, the thickened surface layer may be formed using an epitaxial process and/or other deposition processes. These processes can include plasma-enhanced CVD (PECVD), thermal CVD, photocatalyzed CVD, glow discharge CVD, Hot-wire/catalytic CVD, and others. These processes can form a suitable single crystal silicon or like material either directly or in combination with other steps such as anneals according to specific embodiments. As merely an example, the material can be single-crystal silicon, amorphous silicon, polycrystalline silicon, germanium and silicon germanium alloy. For example, amorphous silicon could advantageously allow for solid-phase epitaxial growth of single-crystal silicon using the underlying transferred thickness of silicon material as a template. Another method that can increase the effective rate of silicon material deposition is to spray or coat the surface with silicon nanoparticles (advantageously amorphous silicon) which can be thermally treated to produce single-crystal silicon using the underlying transferred thickness of silicon material as a template. This can be applied dry or using a liquid that would be eliminated during subsequent processing. Polycrystalline silicon and other materials may also allow single-crystal regrowth through a rapid-thermal anneal liquid phase step using appropriate treatments such as laser anneals, flash thermal treatments and the like. Other epitaxial processes such as PECVD or thermal CVD could be used to grow single-crystal silicon directly onto the layer-transferred silicon film. In a specific embodiment, the total thickness of material may range from about 50 µm to about 200 µm. In other embodiments, the thickened material can be provided using a tri-silane species, such as those described in U.S. Provisional No. 60/822,473, commonly assigned, and hereby incorporated by reference for all purposes. Of course, there can be other variations, modifications, and alternatives.

In a specific embodiment, the transferred material is thickened using an amorphous silicon layer. In a specific embodiment, the amorphous silicon layer is deposited using application of nanoparticles (e.g., amorphous silicon, crystalline silicon, polysilicon, or combinations of these), which are later subjected to a thermal treatment to cause formation of a sheet of thickened material. Alternatively, the amorphous silicon layer can be formed using physical vapor deposition or chemical vapor deposition (e.g., plasma enhanced) at low temperature according to a specific embodiment. In a specific embodiment, the amorphous silicon layer, which has been deposited is maintained at a temperature greater than 800 Degrees Celsius to form crystalline silicon. Preferably the total thickness of material has a desired coefficient of thermal expansion match with the carrier member. In another specific embodiment, the transferred material is thickened by a high-temperature CVD using silane or a chlorosilane species such as SiCl4, dichlorosilane, or trichlorosilane, including combinations, and the like.

Depending upon the embodiment, the total thickness of material can be subjected to impurities to form at least one photovoltaic cell within the thickness. In a specific embodiment, the impurities can be in-situ doped during the thickening step, diffused, and/or implanted using ion beams, plasma immersion implantation, or conventional implantation techniques. The photovoltaic cell structures comprise impurity regions such as P-type and N-type impurities to provide for a p-n junction or multiple p-n junctions according to a specific embodiment. Of course, there can be other variations, modifications, and alternatives.

Figure 57:
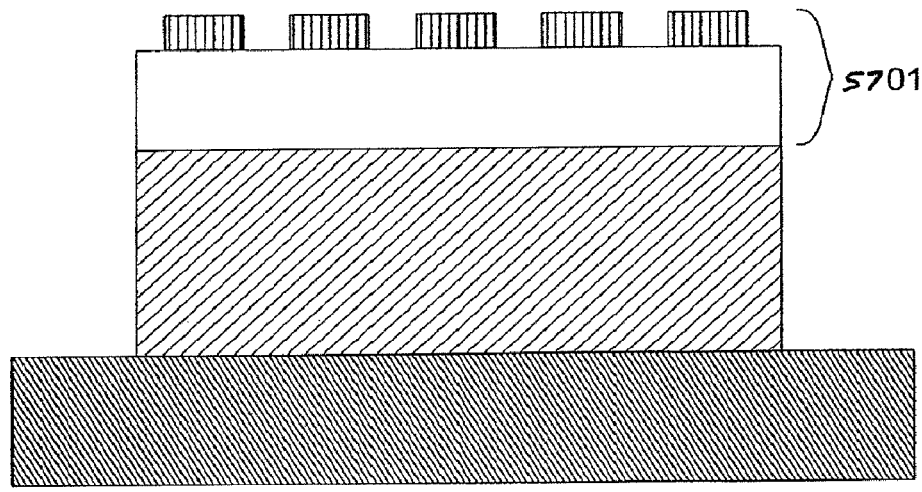

As shown in FIG. 57 the method forms a contact layer 5701 overlying the total thickness of material which has at least one photovoltaic cell structure formed therein. The contact layer can be made of a suitable transparent conductive material such as ITO and the like. Other materials may also be used. In a preferred embodiment, the contact layer is patterned to form a plurality of electrodes which couples to each of the photovoltaic cells. If the photovoltaic cell is to be illuminated from the opposite side, the contact can be opaque to transmission and preferably highly reflective to help maximize light collection efficiency by allowing a return path through the cell. Texturing the surface to further optimize efficiency is also well known by converting the light from specular to Lambertian within the cell to cause multiple internal reflections with better overall light absorption and conversion. Of course there can be other variations, modifications, and alternatives.

Figure 58:
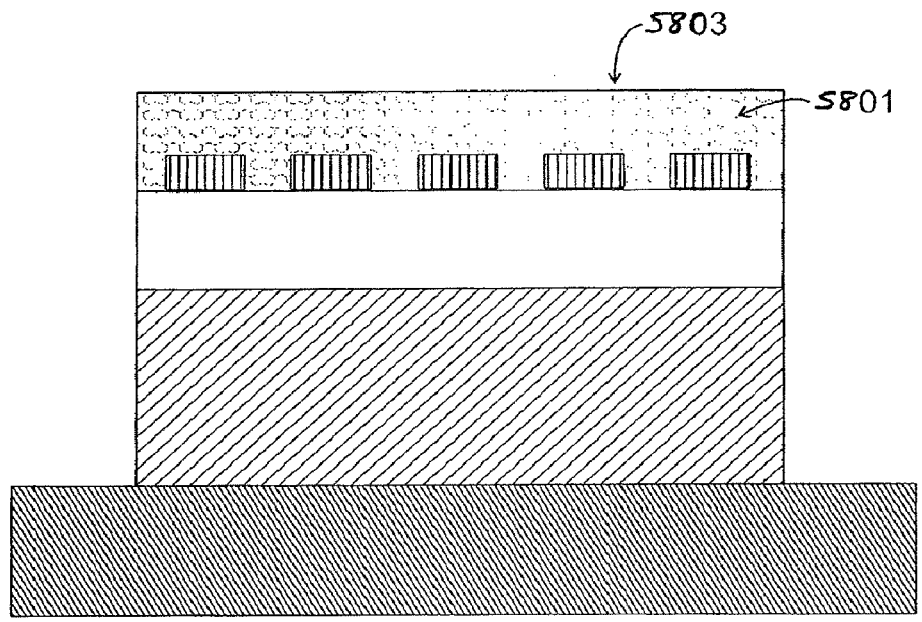

In a specific embodiment, the method also forms a planarized dielectric layer 5801 having a surface region 5803 overlying the patterned contact layer including the at least one photovoltaic cells as shown in FIG. 58. The dielectric layer may include material such as silicon dioxide deposited using a CVD process and the like. In a specific embodiment, the dielectric material is substantially optically transparent to allow electromagnetic radiation to traverse through the dielectric layer or layers. A simplified photovoltaic cell structure 5800 is shown in FIG. 58. Of course there can be other variations, modifications, and alternatives.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment. Furthermore, the particles of hydrogen can be replaced using co-implantation of helium and hydrogen ions to allow for formation of the cleave plane with a modified dose and/or cleaving properties according to alternative embodiments. In certain embodiments, the backing substrate can be applied to each of the substrates, including handle and donor. In alternative embodiments, coatings may also be provided on surfaces or other regions of the transparent material.

Additionally, a pair of handle substrates can be coupled together where the backsides are touching each other during process to keep the backsides free from any deposition and/or etching processes according to a specific embodiment. Alternatively, each handle substrate can expose the backside and front side (with or without layer transferred seed material) to allow for deposition and/or etching of the backside and front side surfaces according to a specific embodiment. In a preferred embodiment, the deposition method occurs at a temperature of 900 Degrees Celsius and less or more preferably 750 Degrees Celsius and less to prevent damage to a glass handle substrate. Therefore, the above description and illustrations should not be taken as limiting the scope of the present invention which is defined by the appended claims.

What is claimed is:

1. A method for fabricating a solar cell, the method comprising:

providing a support member having a surface region, a bottom portion, and a determined thickness between the surface region and the bottom portion;

forming a releasable material overlying the surface region of the support member;

transferring a first thickness of semiconductor material from a donor substrate overlying the releasable material to form the first thickness of transferred material overlying the releasable material, the releasable material overlying the support member;

separating the first thickness of material from the releasable material to detach the first thickness of material from the releasable material; and forming photovoltaic cells in one or more portions in the first thickness of material;

wherein the silicon support member comprises an opening region extending from the bottom portion of the support member, through the thickness of the support member, to a portion of the surface region, the opening region being coupled to a fluidic drive source, the fluidic drive source being capable of causing a pressure gradient within the opening region between the bottom portion and the portion of the surface region.

2. The method of claim 1 wherein the support member is characterized by a first coefficient of thermal expansion, the first coefficient of thermal expansion being substantially matched with a second coefficient of thermal expansion characterizing the first donor substrate.

3. The method of claim 1 wherein the pressure gradient is provided by a fluid and facilitates removal of the total thickness from the releasable material.

4. The method of claim 1 wherein the fluid is an etchant to the releasable material.

5. The method of fabricating a solar cell according to claim 1 further comprising attaching a carrier member to the first thickness of material.

6. The method of fabricating a solar cell according to claim 5 wherein the carrier member is permanently attached to the first thickness of material and serves as a portion for a package of the photovoltaic material.

7. The method of fabricating a solar cell according to claim 5 wherein the carrier member is temporarily attached to the first thickness of material and is detached prior to forming a package of the photovoltaic material.

* * * * *